US012278280B2

(12) United States Patent
Nakamura

(10) Patent No.: US 12,278,280 B2
(45) Date of Patent: Apr. 15, 2025

(54) METHOD OF MANUFACTURING SEMICONDUCTOR DEVICE

(71) Applicant: Mitsubishi Electric Corporation, Tokyo (JP)

(72) Inventor: Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 18/432,923

(22) Filed: Feb. 5, 2024

(65) Prior Publication Data

US 2024/0178306 A1 May 30, 2024

Related U.S. Application Data

(62) Division of application No. 17/405,451, filed on Aug. 18, 2021, now Pat. No. 11,949,007.

(30) Foreign Application Priority Data

Nov. 2, 2020 (JP) ................. 2020-183522

(51) Int. Cl.
*H01L 29/739* (2006.01)
*H01L 29/06* (2006.01)
(Continued)

(52) U.S. Cl.
CPC ...... *H01L 29/7397* (2013.01); *H01L 29/0696* (2013.01); *H01L 29/66333* (2013.01); *H01L 29/868* (2013.01)

(58) Field of Classification Search
CPC ............. H01L 29/7397; H01L 29/0696; H01L 29/66333; H01L 29/868; H01L 23/3192;
(Continued)

(56) References Cited

U.S. PATENT DOCUMENTS

| 5,783,491 A | 7/1998 | Nakamura et al. |
| 6,482,681 B1 | 11/2002 | Francis et al. |
| 6,953,968 B2 | 10/2005 | Nakamura et al. |

(Continued)

FOREIGN PATENT DOCUMENTS

| JP | H07-263692 A | 10/1995 |
| JP | 2001-085686 A | 3/2001 |

(Continued)

OTHER PUBLICATIONS

R. Jones, et al., "Self-interstitial clusters in silicon," Nuclear Instruments and Methods in Physics Research B, Beam Interactions with Materials & Atoms, vol. 186, pp. 10.18, Jan. 2002, doi: 10.1016/S0168-583X (01) 00872-2.

(Continued)

*Primary Examiner* — Shahed Ahmed
(74) *Attorney, Agent, or Firm* — Studebaker & Brackett PC

(57) ABSTRACT

A semiconductor device includes: an N⁻ drift layer of a first conductivity type formed in the semiconductor substrate; a P base layer formed on the N⁻ drift layer; and an N buffer layer of the first conductivity type formed under the N⁻ drift layer and higher in peak impurity concentration than the N⁻ drift layer. The N buffer layer includes: a first buffer layer in which a trap level derived from lattice defect is not detected by a photoluminescence method; and a second buffer layer provided between the first buffer layer and the N⁻ drift layer and in which two types of trap levels derived from lattice defect are detected by the photoluminescence method.

3 Claims, 84 Drawing Sheets

(51) Int. Cl.
*H01L 29/66* (2006.01)
*H01L 29/868* (2006.01)

(58) Field of Classification Search
CPC .......... H01L 29/66325–66348; H01L 29/7393–7398; H01L 29/083–0834; H01L 21/322–3228
See application file for complete search history.

(56) References Cited

U.S. PATENT DOCUMENTS

| | | | |
|---|---|---|---|
| 7,514,750 | B2 | 4/2009 | Mauder et al. |
| 7,538,412 | B2 | 5/2009 | Schulze et al. |
| 8,686,469 | B2 | 4/2014 | Nakamura |
| 8,698,195 | B2 | 4/2014 | Oya et al. |
| 10,026,832 | B2 | 7/2018 | Nakamura |
| 2001/0006836 | A1 | 7/2001 | Nakamura et al. |
| 2002/0121661 | A1 | 9/2002 | Nakamura |
| 2003/0042537 | A1 | 3/2003 | Nakamura et al. |
| 2003/0047778 | A1 | 3/2003 | Nakamura et al. |
| 2009/0184340 | A1* | 7/2009 | Nemoto ............... H01L 21/263 257/E21.328 |
| 2010/0327313 | A1 | 12/2010 | Nakamura |
| 2014/0246755 | A1 | 9/2014 | Yoshimura et al. |
| 2015/0235866 | A1 | 8/2015 | Nakamura |
| 2016/0163786 | A1 | 6/2016 | Yoshimura et al. |
| 2016/0197143 | A1 | 7/2016 | Naito |
| 2017/0317163 | A1 | 11/2017 | Yoshimura et al. |
| 2018/0182844 | A1* | 6/2018 | Nakamura ........... H01L 29/7397 |
| 2018/0350901 | A1 | 12/2018 | Yoshimura et al. |
| 2019/0319090 | A1 | 10/2019 | Yoshimura et al. |
| 2020/0058506 | A1* | 2/2020 | Nakamura ............ H01L 29/407 |
| 2021/0143252 | A1 | 5/2021 | Yoshimura et al. |
| 2021/0167173 | A1* | 6/2021 | Fujimoto ............. H01L 21/046 |

FOREIGN PATENT DOCUMENTS

| | | | |
|---|---|---|---|
| JP | 3396553 | B2 | 4/2003 |
| JP | 4205128 | B2 | 1/2009 |
| JP | 4785334 | B2 | 10/2011 |
| JP | 5256357 | B2 | 8/2013 |
| JP | 5622814 | B2 | 11/2014 |
| JP | 5634318 | B2 | 12/2014 |
| JP | 6065067 | B2 | 1/2017 |
| JP | 6165271 | B2 | 7/2017 |
| JP | 6301776 | B2 | 3/2018 |
| JP | 2018-107303 | A | 7/2018 |
| JP | 6558462 | B2 | 8/2019 |
| JP | 2020-027921 | A | 2/2020 |
| WO | 02/058160 | A1 | 7/2002 |
| WO | 02/061845 | A1 | 8/2002 |
| WO | WO-2009122486 | A1 * | 10/2009 ......... H01L 29/0821 |
| WO | 2013/100155 | A1 | 7/2013 |
| WO | 2014/054121 | A1 | 4/2014 |
| WO | 2015/093190 | A1 | 6/2015 |

OTHER PUBLICATIONS

An Office Action; "Notice of Reasons for Refusal," mailed by the Japanese Patent Office on Nov. 28, 2023, which corresponds to Japanese Patent Application No. 2020-183522 and is related to U.S. Appl. No. 17/405,451; with English language translation.

An Office Action; mailed by the China National Intellectual Property Administration of the People's Republic of China on Nov. 30, 2024, which corresponds to Chinese Patent Application No. 202111260903.X and is related to U.S. Appl. No. 18/432,923.

* cited by examiner

F I G. 1 1
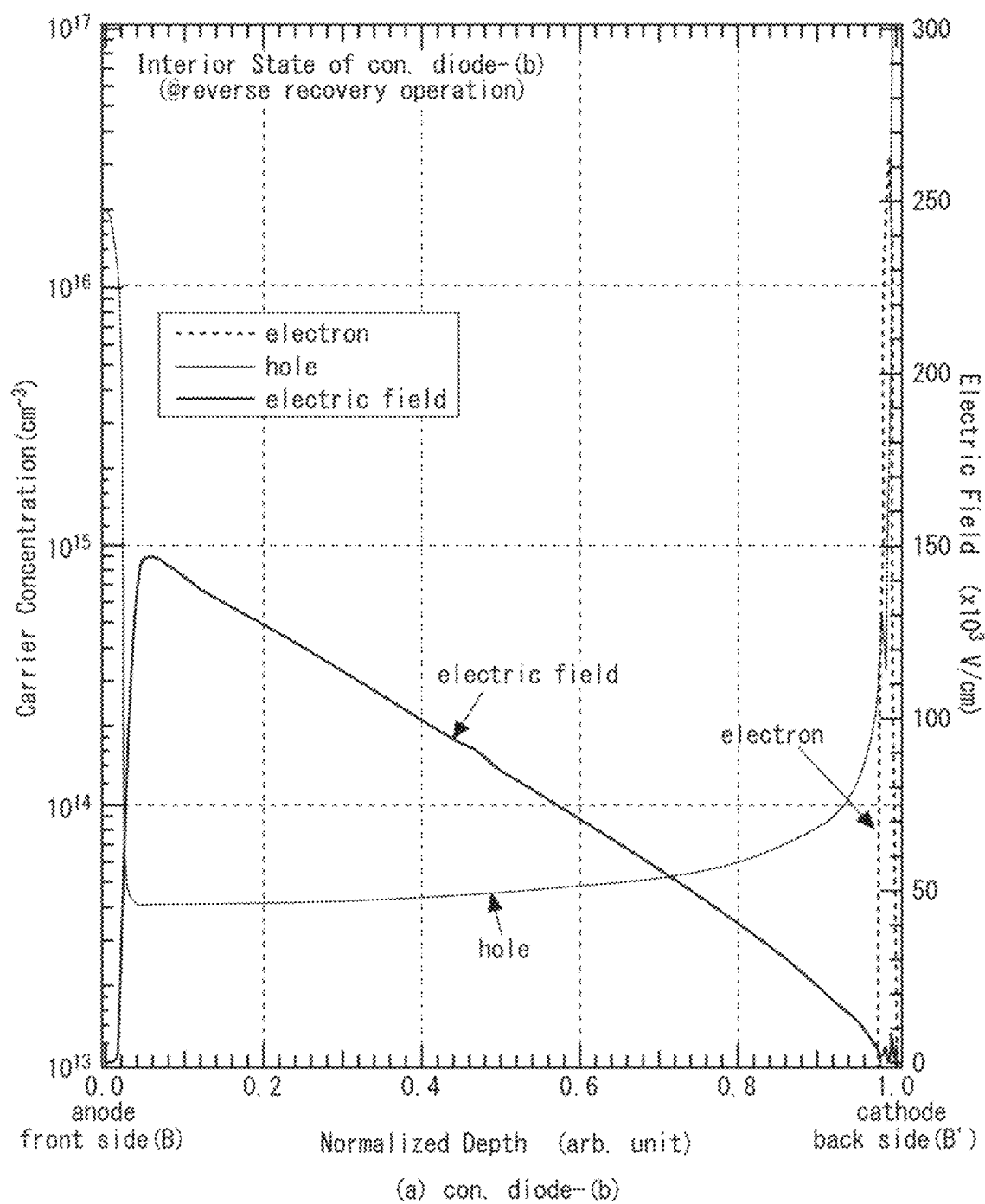

(b) new diode-(b)

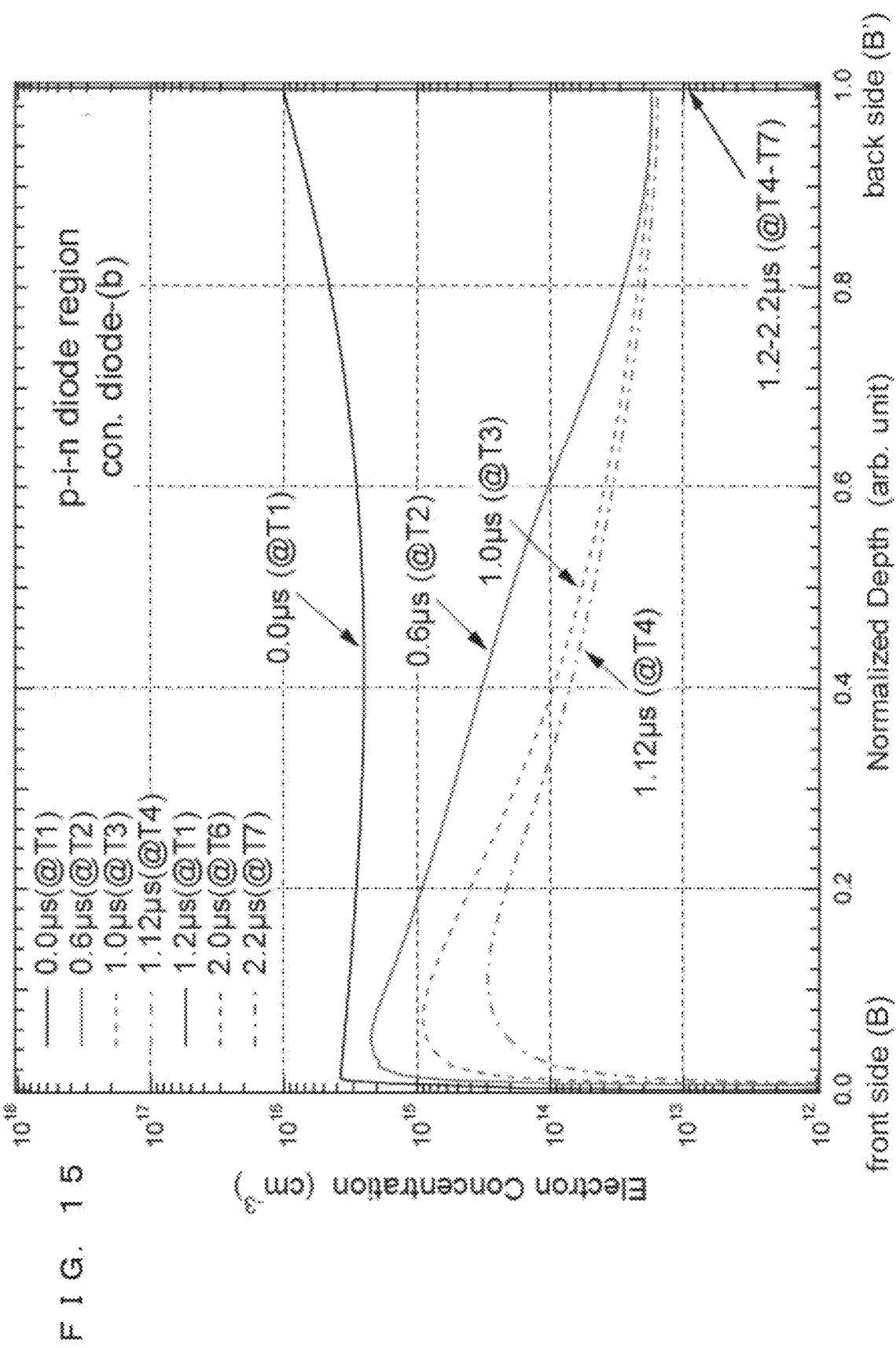
F I G. 15

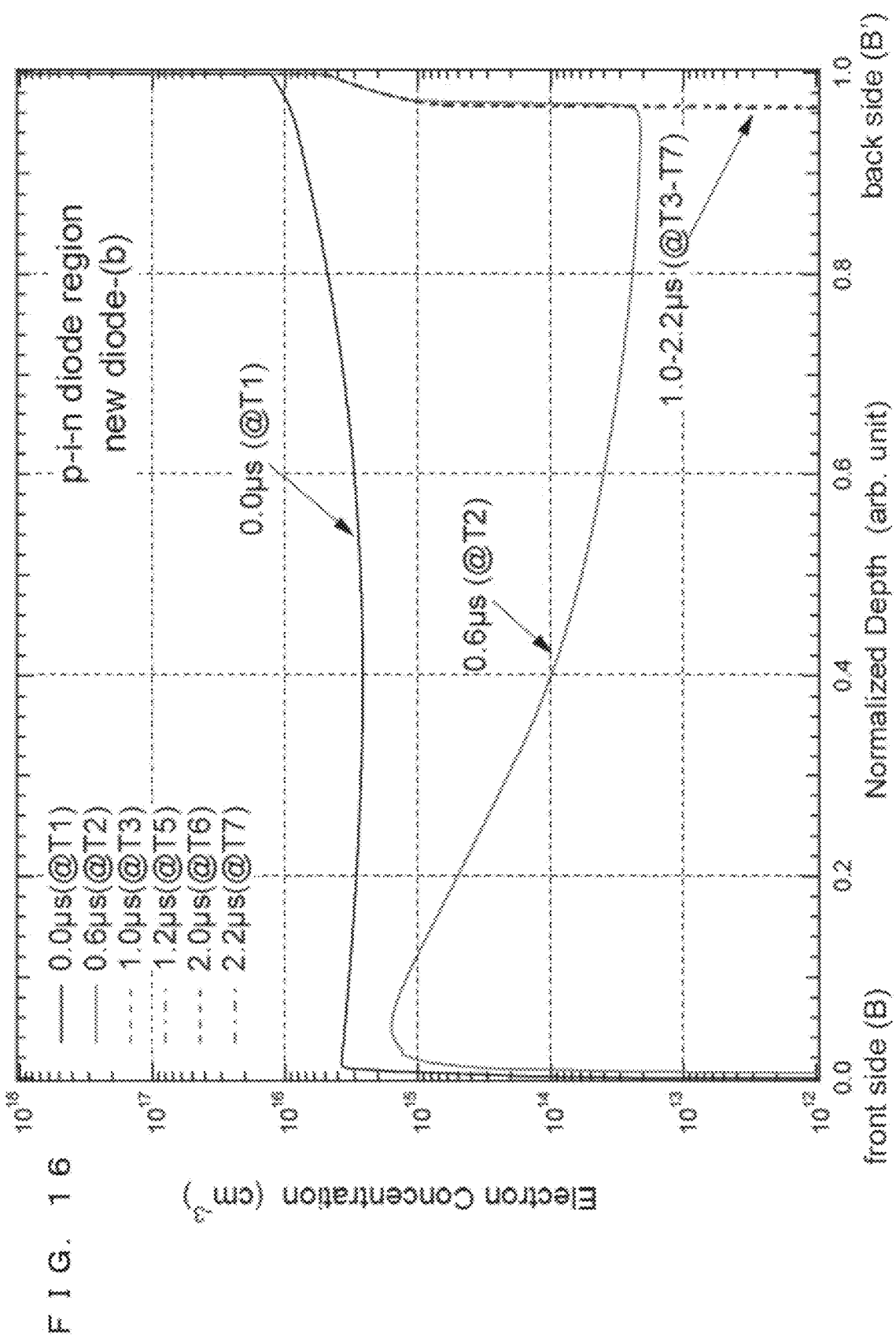
F I G. 16

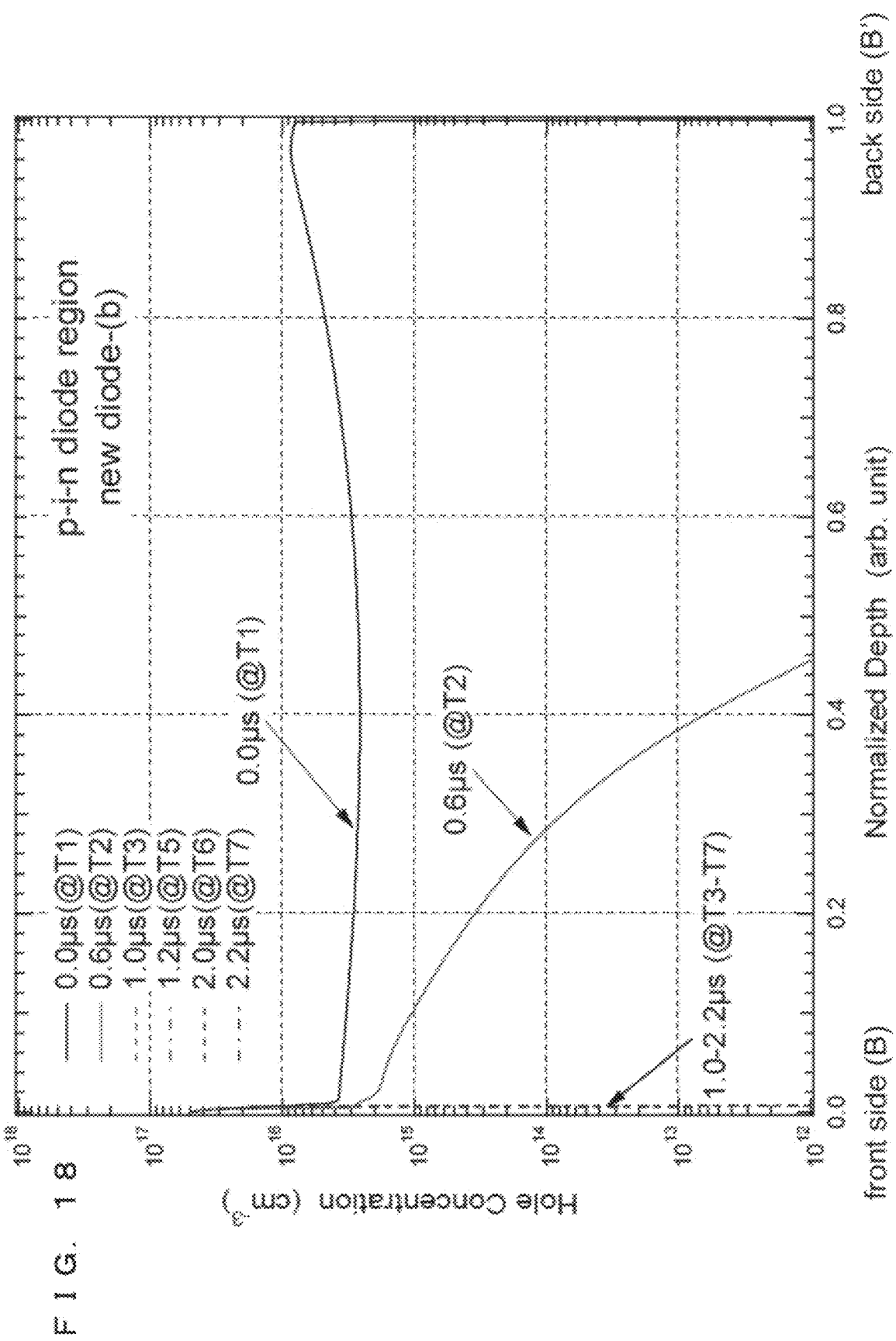
F I G. 1 8

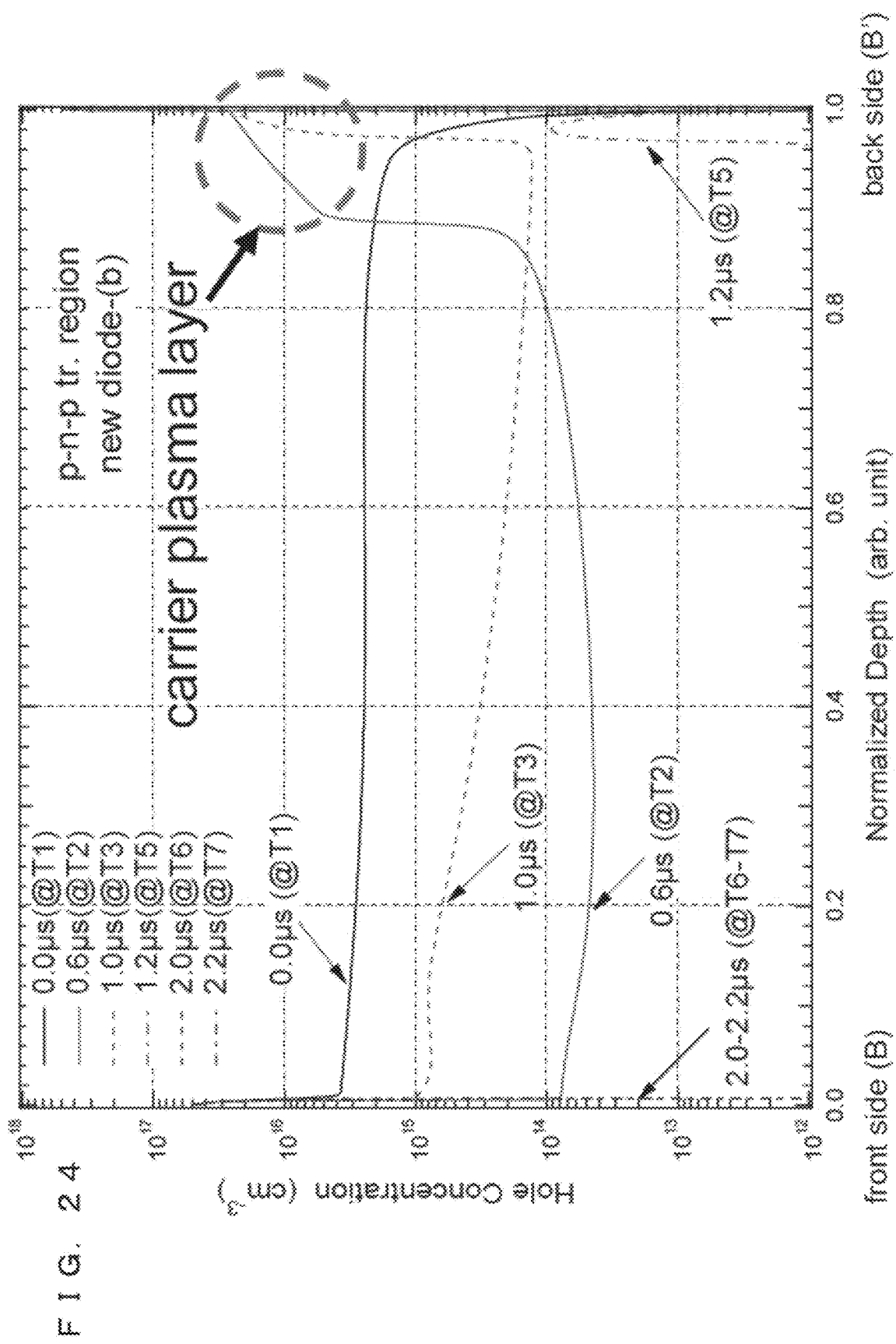
F I G. 2 4

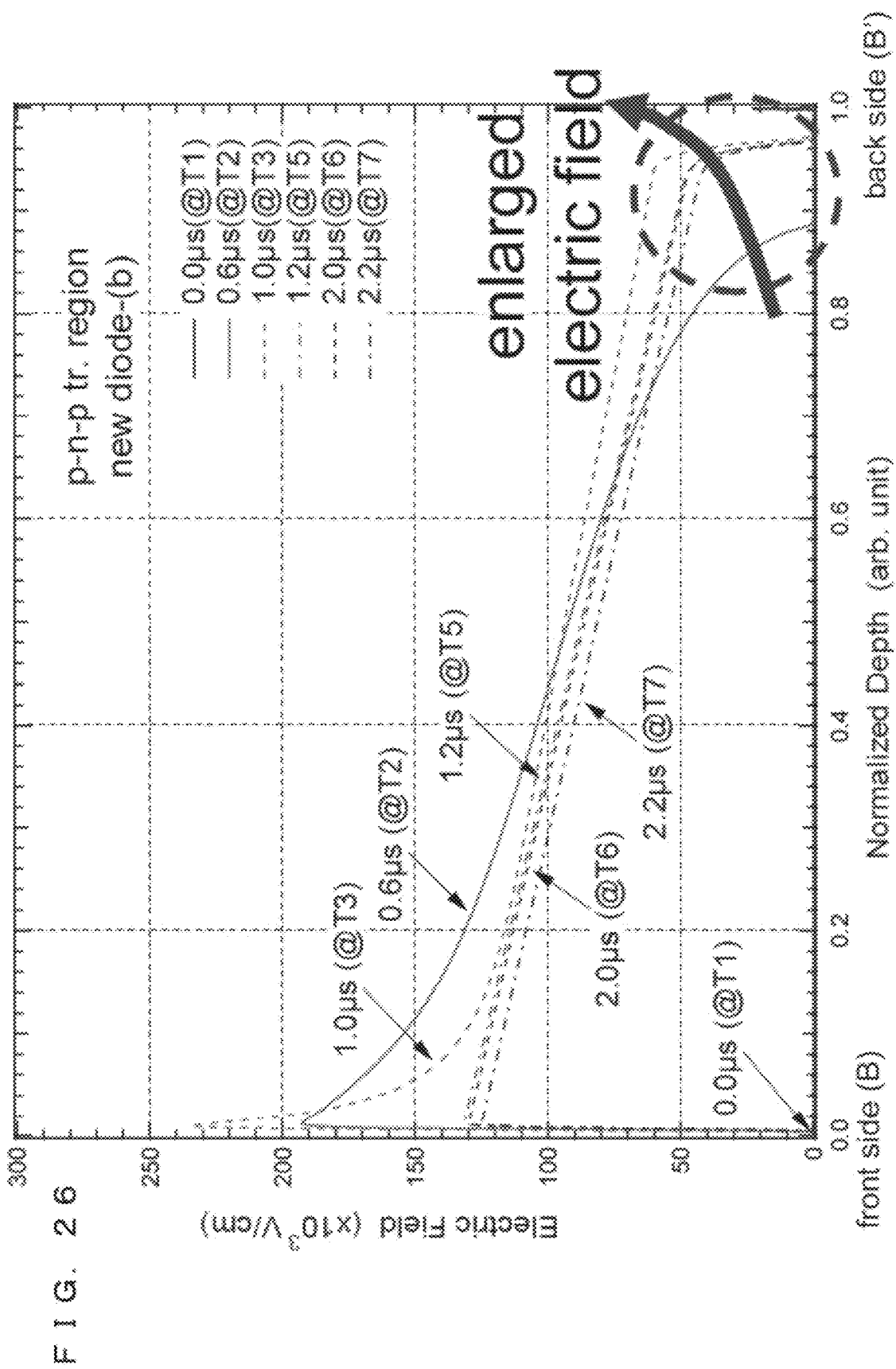
F I G. 26

FIG. 29

| S/N | Ratio of Trap B | STRUCTURE (15) | annealing con. 120min | $V_F$ (V) @$I_A$=51.4A (526 A/cm²) 298 K | $V_F$ (V) 398 K | $I_R$ (A/cm²) @$V_R$=1200 V 398 K | $I_R$ 423 K | $I_R$ 448 K | snappy recovery SOA 1000 V, 0.1A, dj/dt=1000 A/cm²·µs, dv/dt=15000 V/µs, $L_S$=2.0µH | recovery SOA 800 V, 9.0Ω, dj/dt=21000 A/cm²·µs, dv/dt=18000 V/µs, $L_S$=200nH, 423 K/448 K |
|---|---|---|---|---|---|---|---|---|---|---|
| (a) | 9.9 |  | 345 °C | 1.88 | 1.93 | $3.91 \times 10^{-4}$ | $1.73 \times 10^{-3}$ | $1.09 \times 10^{-2}$ | 253 K | ≥8.0 $J_A$ (2600 A/cm²) |
| (b) | 40.0 | (15-1) + (15-2) | 400 °C | 1.70 | 1.72 | $1.54 \times 10^{-4}$ | $8.62 \times 10^{-4}$ | $5.90 \times 10^{-3}$ | 213 K | |
| (c) | 61.3 |  | 430 °C | 1.75 | 1.78 | $1.57 \times 10^{-4}$ | $9.24 \times 10^{-4}$ | $6.13 \times 10^{-3}$ | 273 K | |

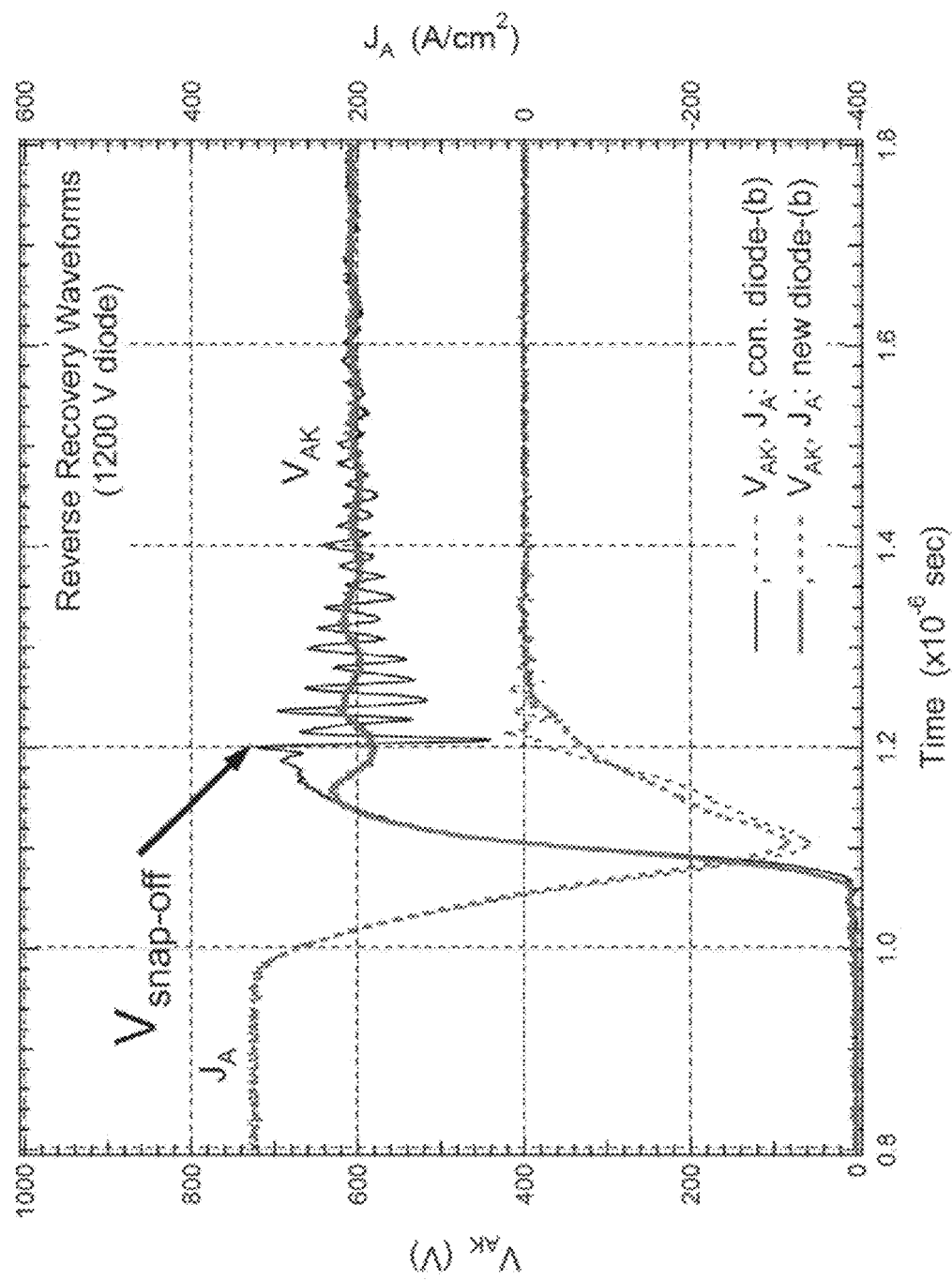
F I G. 33

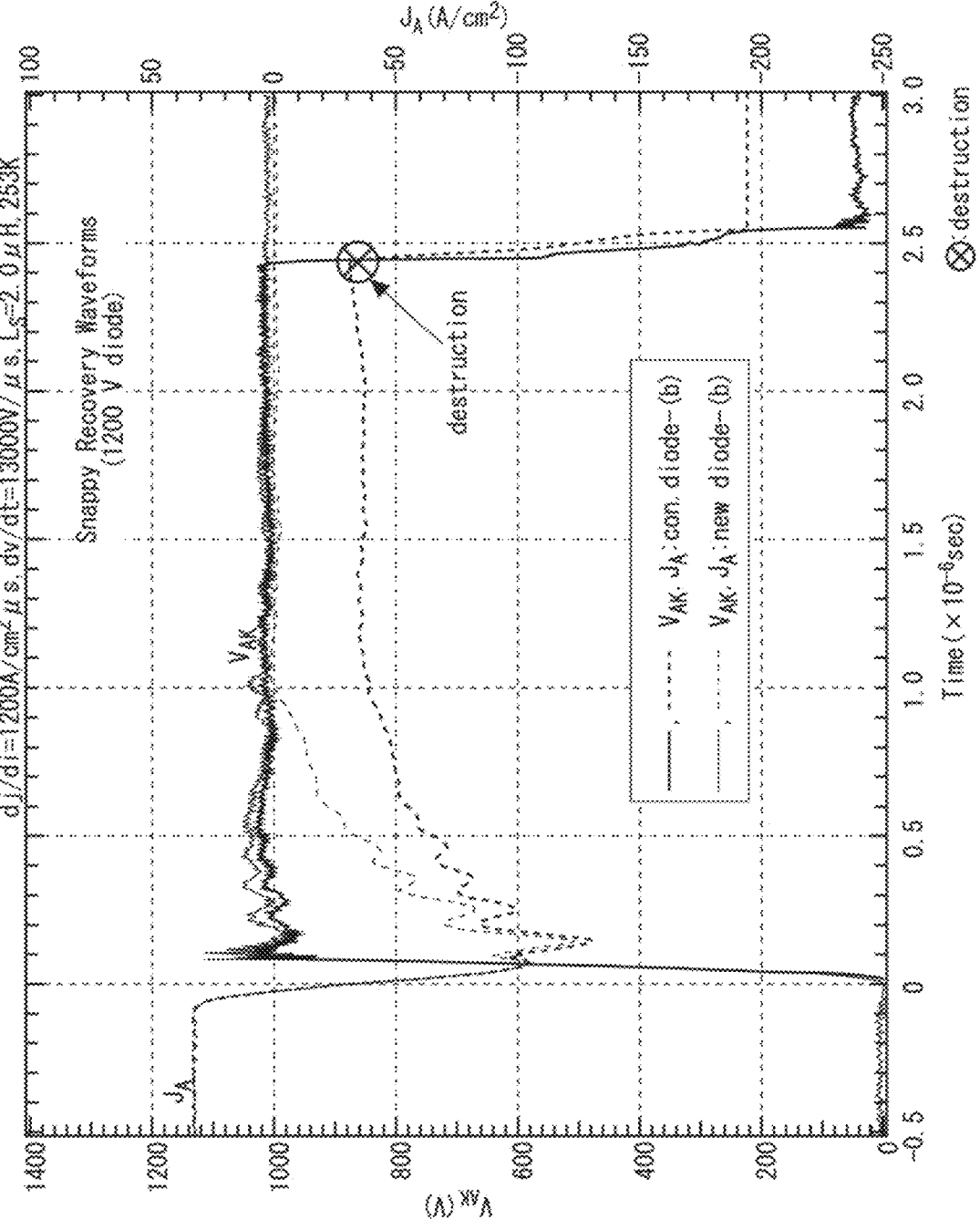

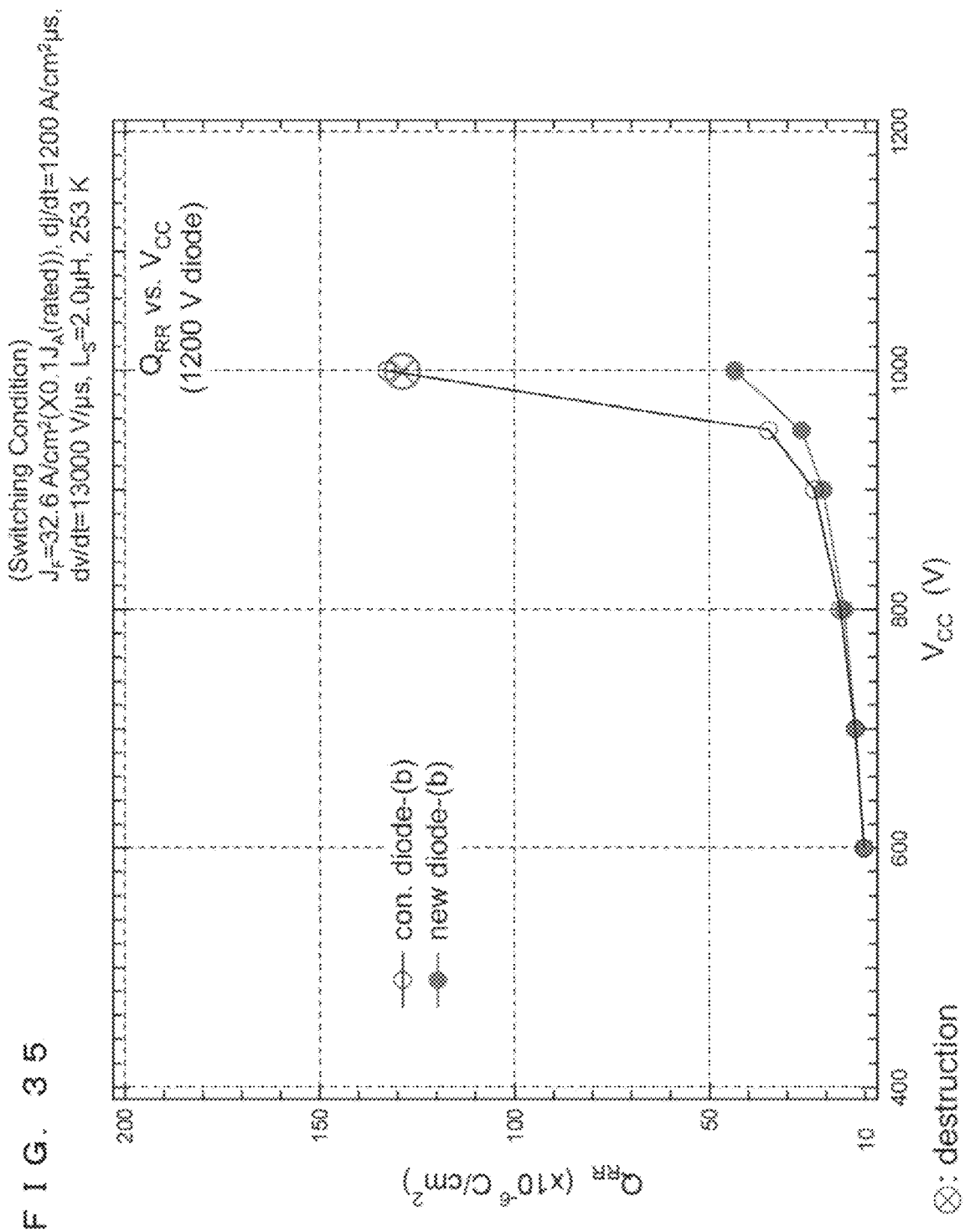
F I G. 3 5

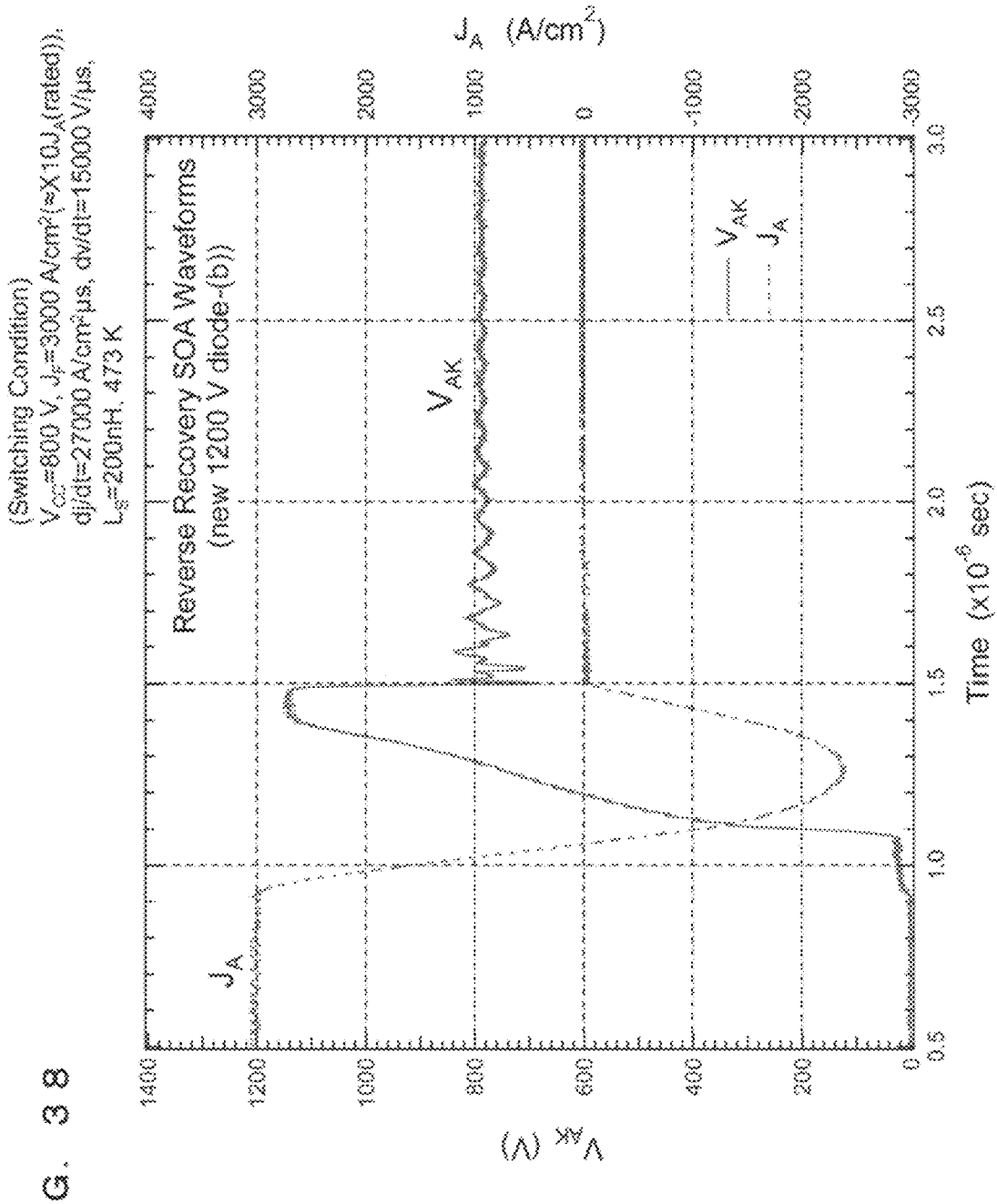
F I G. 38

F I G. 4 1
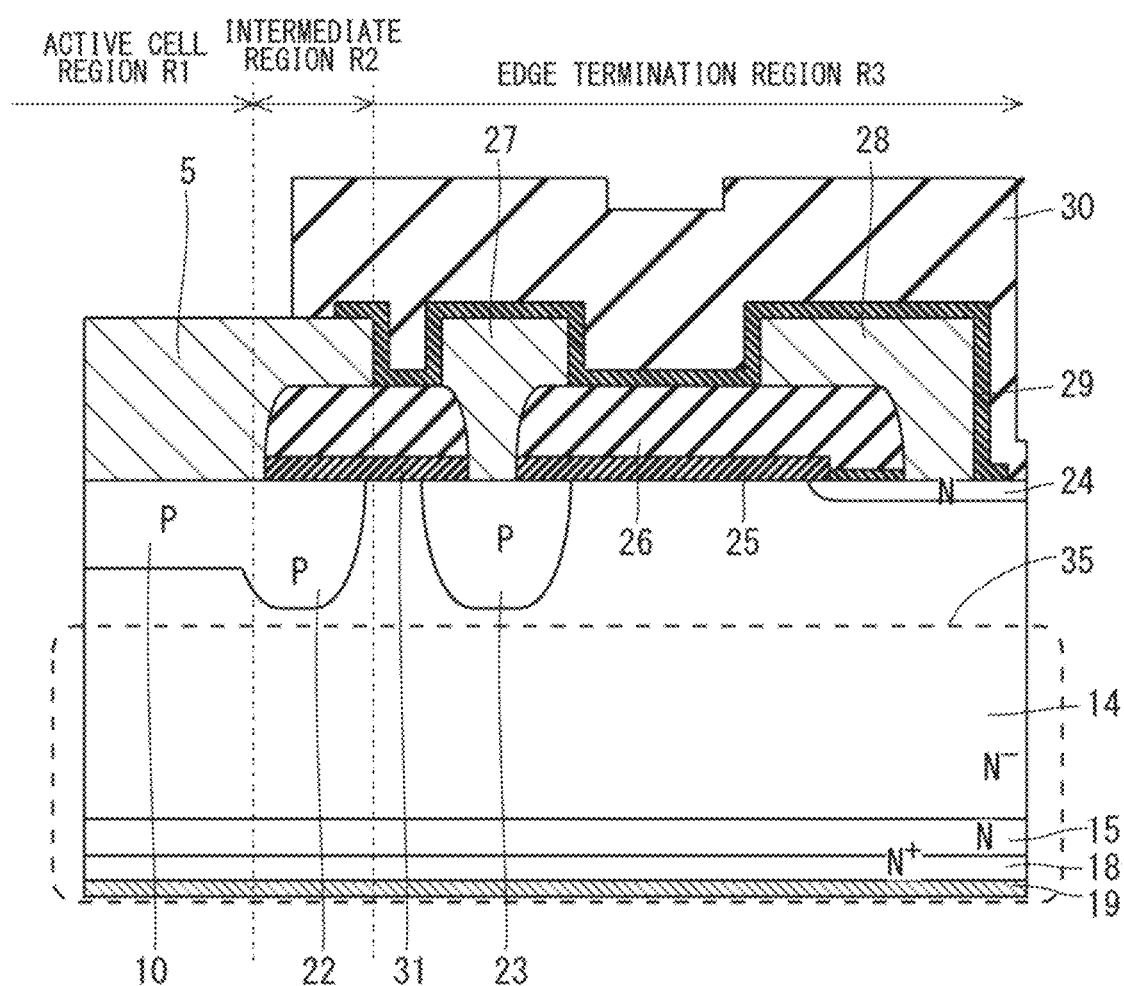

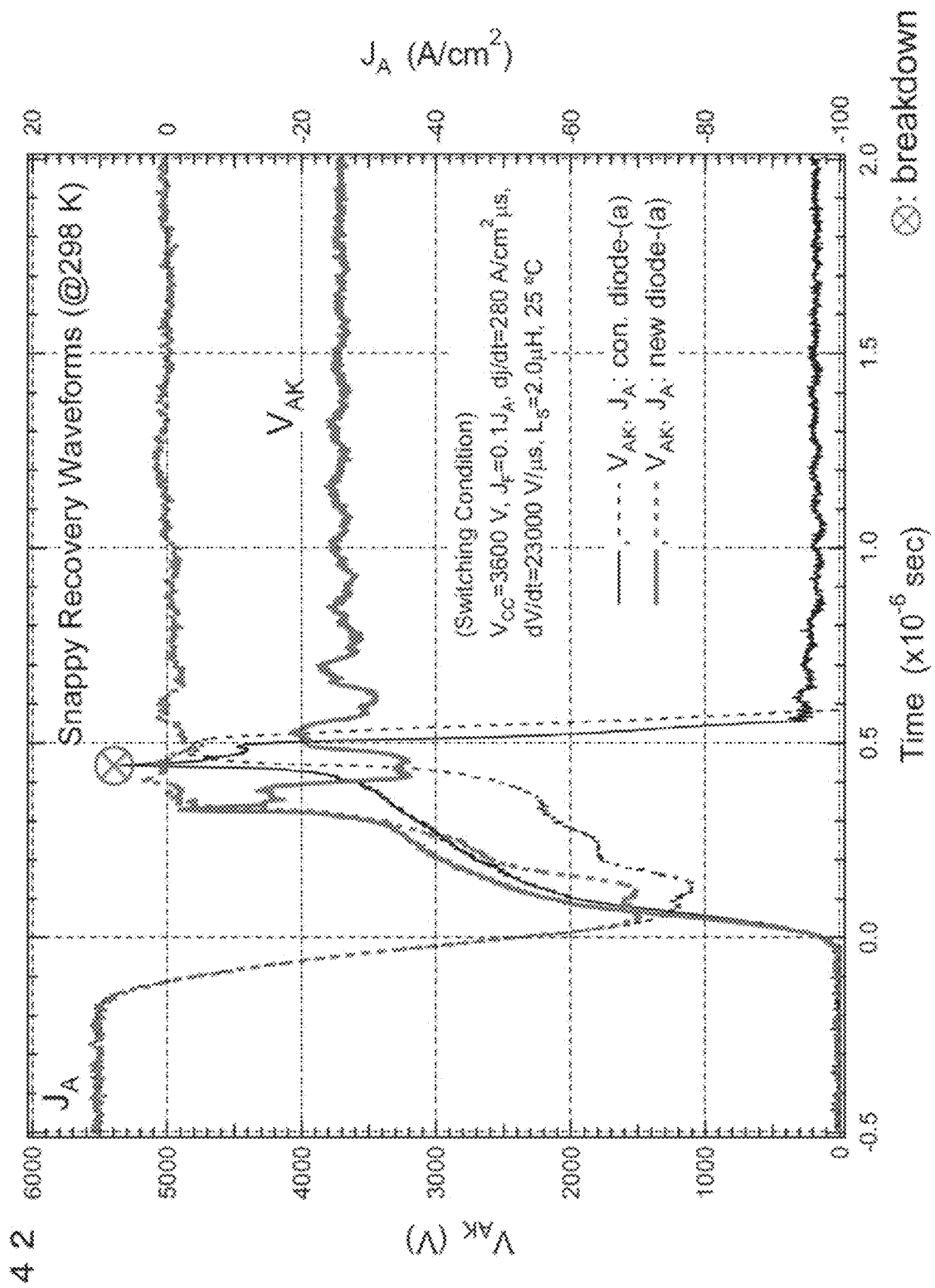
F I G. 4 2

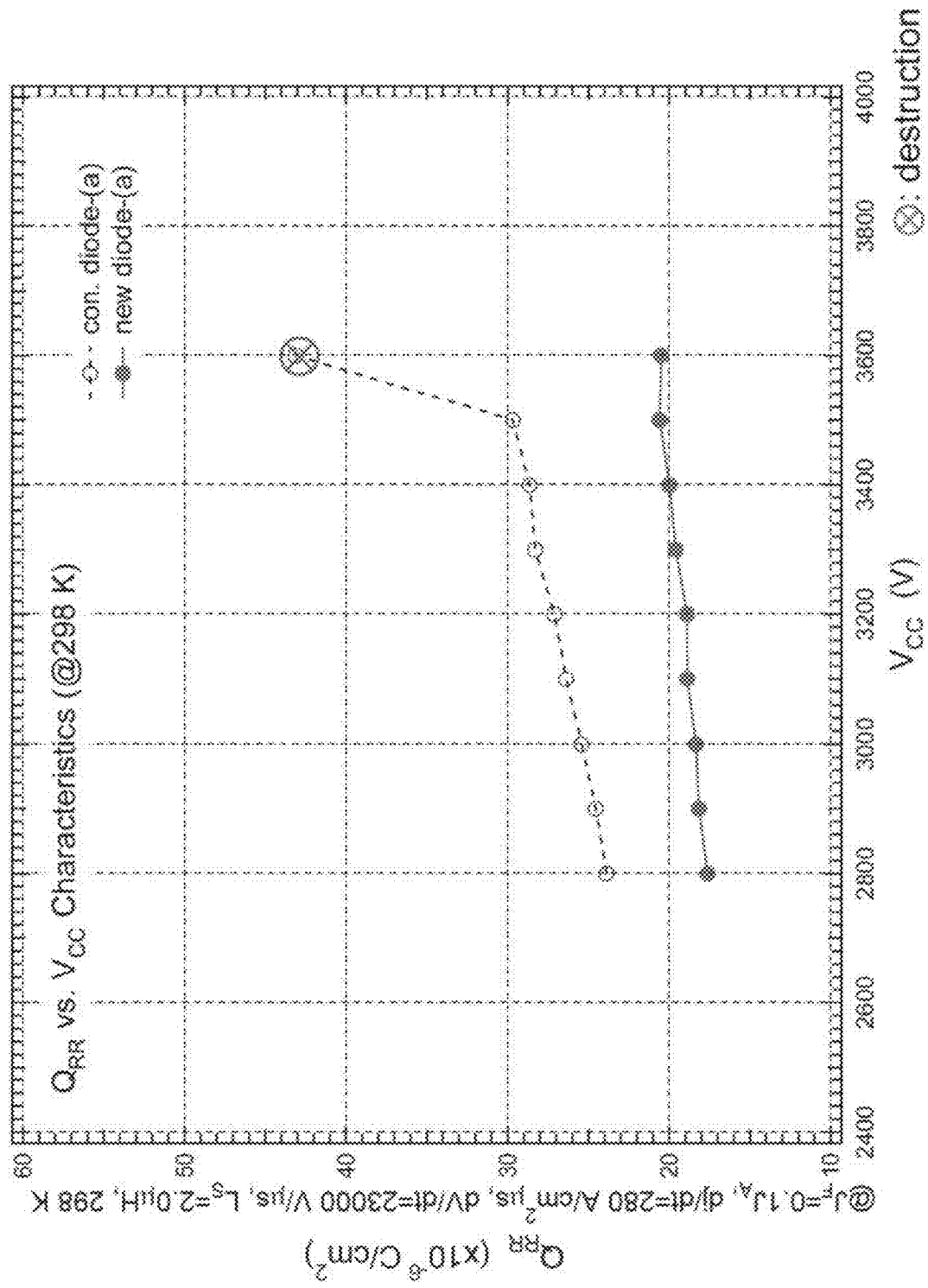
F I G. 4 4

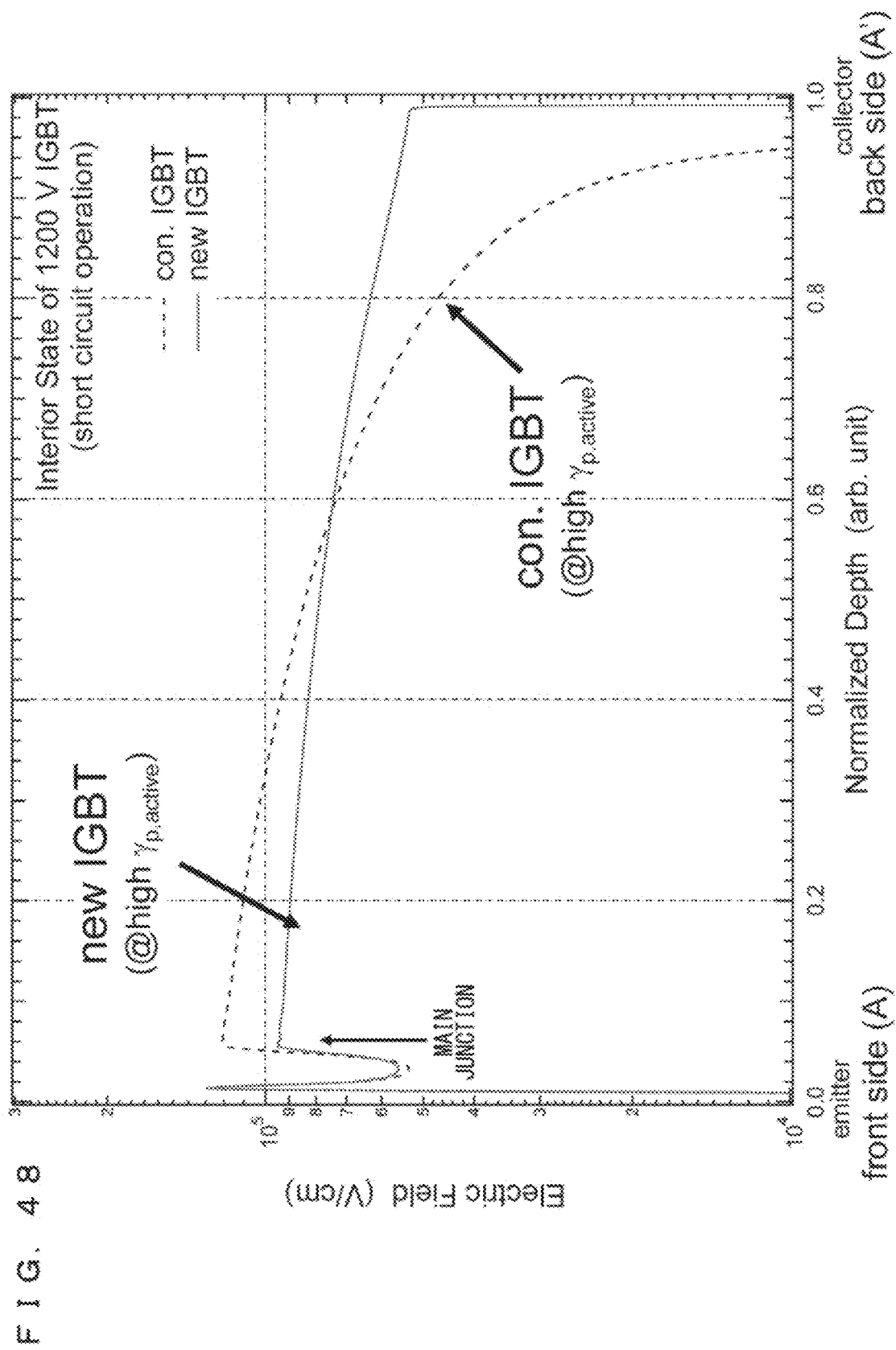
F I G. 48

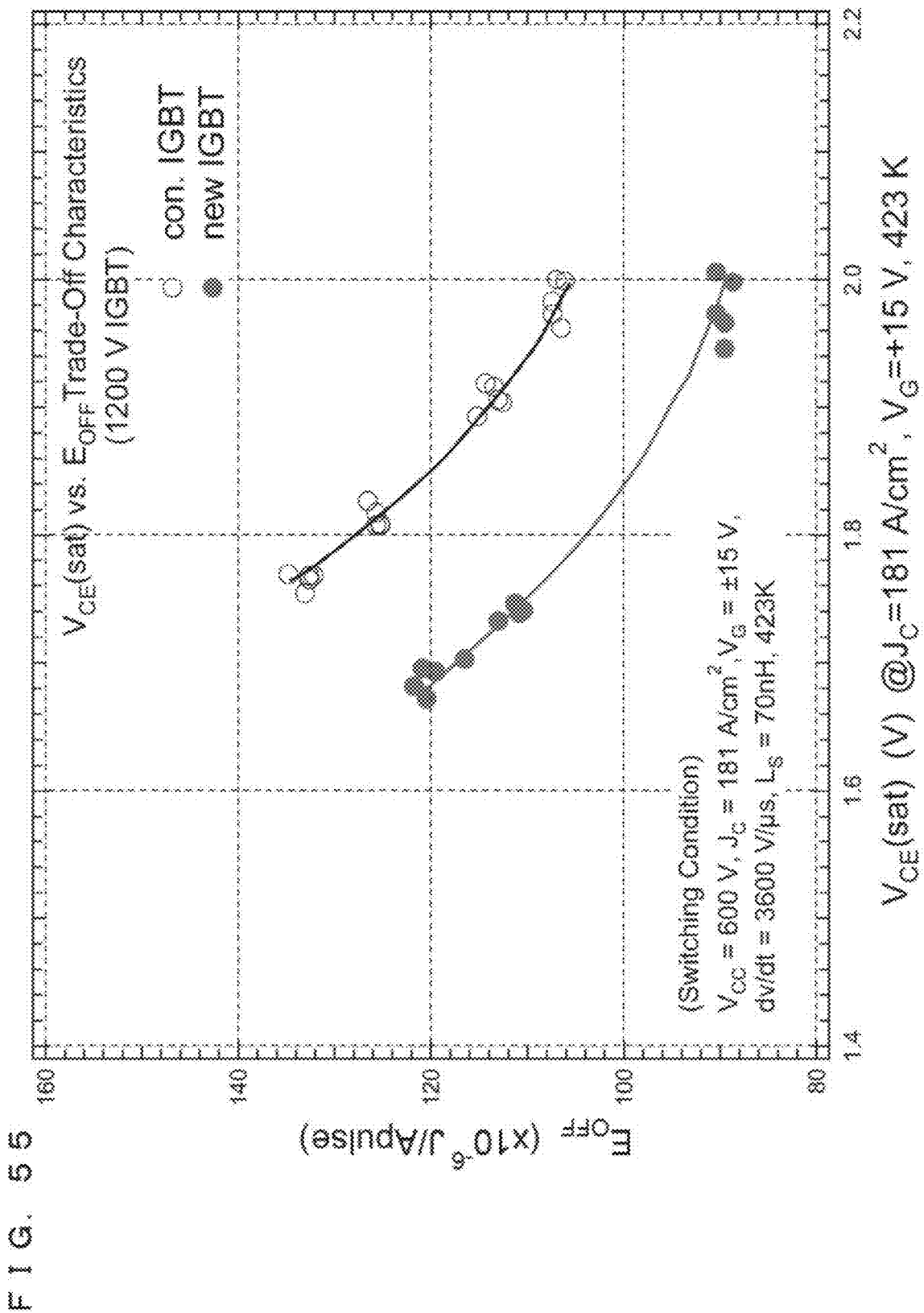
F I G. 5 5

F I G. 6 9
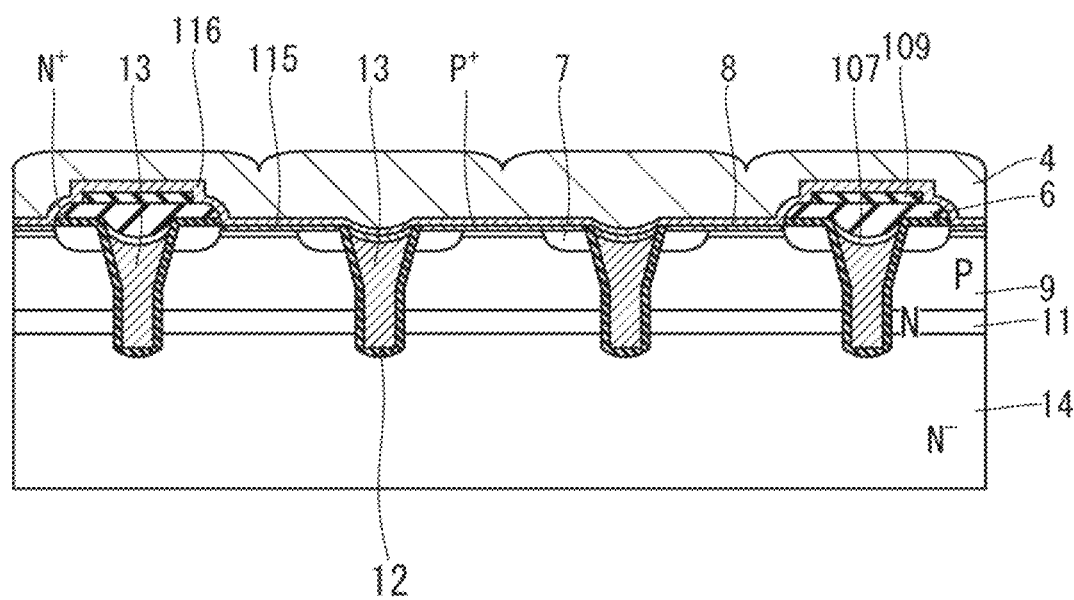

F I G. 7 0
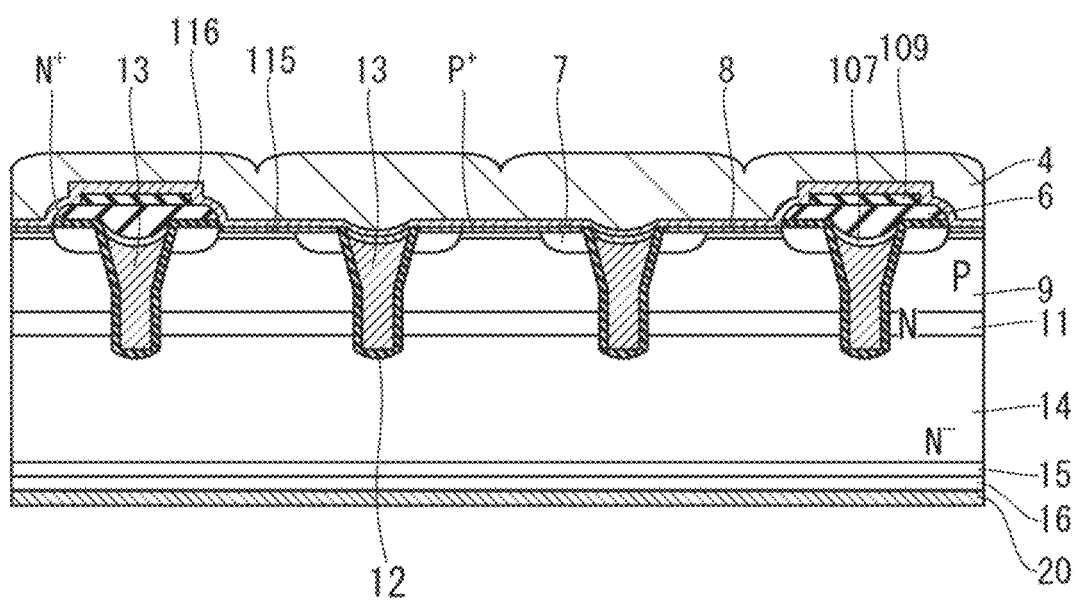

F I G. 7 2
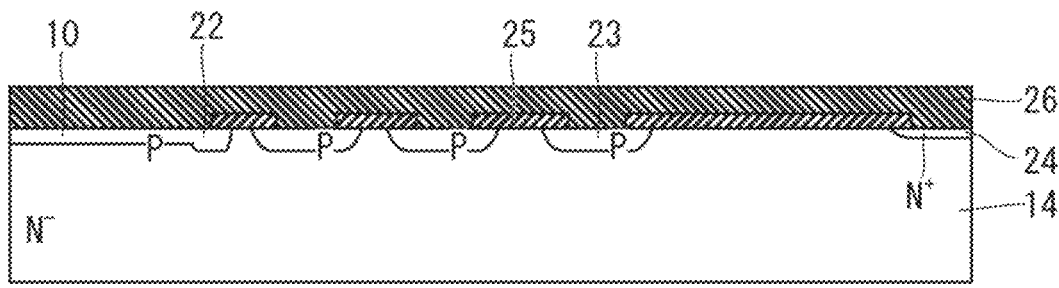

FIG. 80

| STEP | Process A | Process B |
|---|---|---|
| LIGHT ETCHING STEP | O | O |
| ION IMPLANTATION STEP FOR LAYER (15-2) | - | O |
| LIGHT ETCHING STEP | - | - |
| ION IMPLANTATION STEP FOR LAYER (15-1) | O | O |
| LIGHT ETCHING STEP | O | O |
| FIRST ANNEALING STEP | O | O |
| ION IMPLANTATION STEP FOR LAYER (15-2) | O | |
| LIGHT ETCHING STEP | O | O |
| SECOND ANNEALING STEP | O | O |
| LOW-TEMPERATURE ANNEALING STEP | O | O |

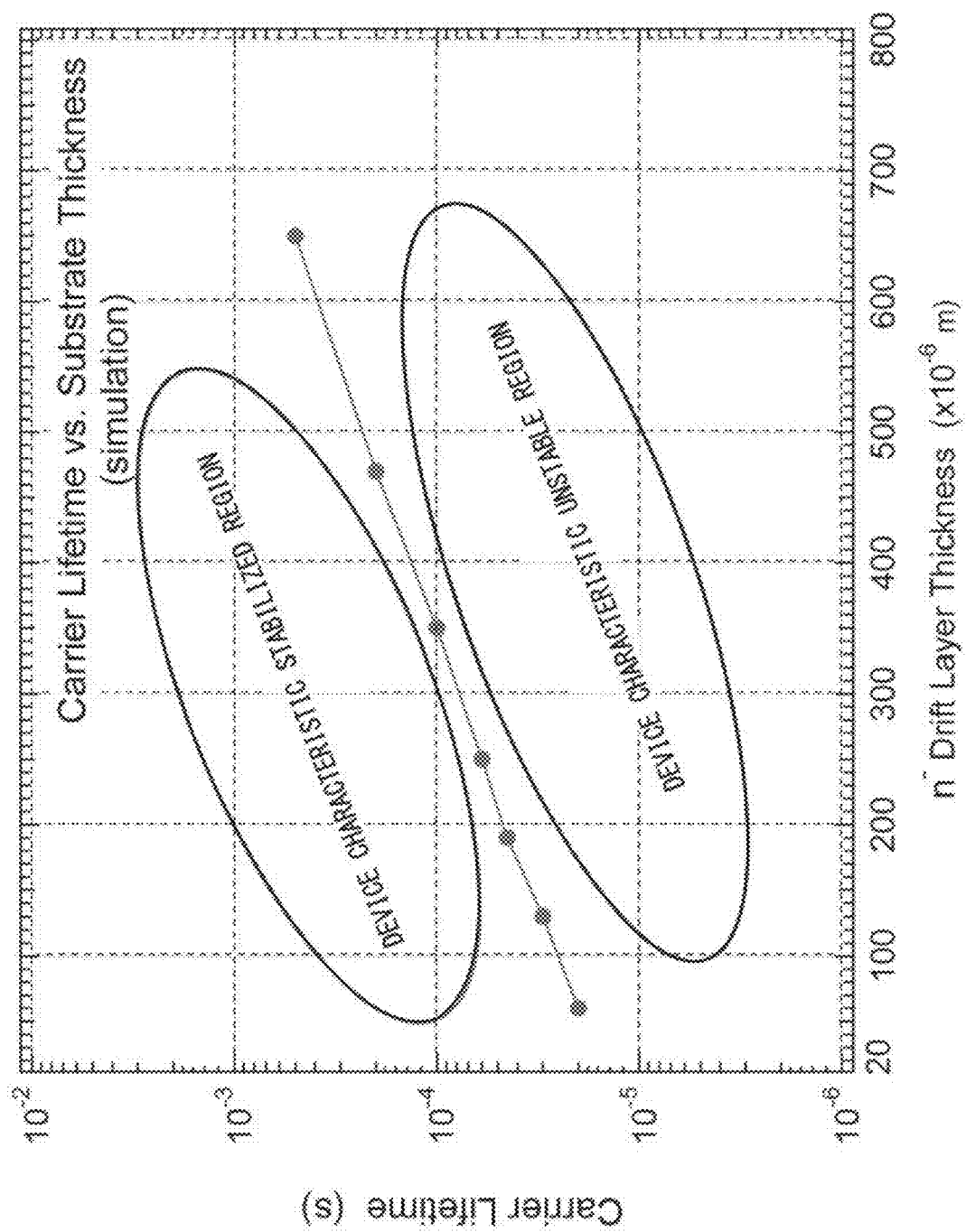
F I G. 81

FIG. 82

| process type | Ratio Of Trap B | STRUCTURE (15) | annealing con. | V_F (V) @I_A=51.4A (326 A/cm²) | | I_R (A/cm²) @V_R=1200 V | | | snappy recovery SOA | recovery SOA |
|---|---|---|---|---|---|---|---|---|---|---|
| | | | 120min | 298 K | 398 K | 398 K | 423 K | 448 K | 1000 V, 0.1A, dj/dt=1000 A/cm²μs, dv/dt=15000 V/μs, L_s=2.0μH | 800 V, 9.0Ω, dj/dt=21000 A/cm²μs, dv/dt=18000 V/μs, L_s=200nH, 423 K/448 K |
| A | 40.0 | (15-1)+(15-2) | 400 °C | 1.70 | 1.72 | 1.54×10⁻⁴ | 8.62×10⁻⁴ | 5.90×10⁻³ | 213 K | |
| B | 61.3 | | | 1.74 | 1.76 | 1.60×10⁻⁴ | 9.73×10⁻⁴ | 6.90×10⁻³ | 273 K | ≥8.0 μA (2600 A/cm²) |

METHOD OF MANUFACTURING SEMICONDUCTOR DEVICE

CROSS-REFERENCE TO RELATED APPLICATIONS

This application is a Divisional of U.S. patent application Ser. No. 17/405,451 filed Aug. 18, 2021, which claims benefit of priority to Japanese Patent Application No. 2020-183522 filed Nov. 2, 2020, the entire contents of which are incorporated herein by reference.

BACKGROUND OF THE INVENTION

Field of the Invention

The present disclosure relates to a semiconductor device and a method of manufacturing a semiconductor device.

Description of the Background Art

A conventional vertical semiconductor device such as a trench gate insulated gate bipolar transistor (IGBT) or a P-intrinsic-N (PiN) diode has a vertical structure. In the IGBT, a region including an N-type drift layer, an N-type buffer layer, and a P-type collector layer is a region of the vertical structure. In the diode, a region including an N-type drift layer, an N-type buffer layer, and an N-type cathode layer is a region of the vertical structure. International Publication No. 2014/054121 discloses an IGBT with the vertical structure. Japanese Patent Application Laid-Open No. 2020-027921 discloses a configuration in which an N-type buffer layer has a stacked structure with a plurality of layers.

In the conventional semiconductor device with the IGBT or the diode having the vertical structure, a wafer manufactured by the FZ method is used as an Si wafer in some cases for forming the semiconductor device instead of a wafer manufactured by epitaxial growth. In such cases, in a vertical structure region in the wafer that may be the N-type buffer layer of the IGBT, for example, a high impurity concentration is provided and an impurity profile in this region has a steep gradient toward a junction with the N-type drift layer.

An impurity profile such as that described above observed in the buffer layer in the semiconductor device having the vertical structure encounters various problems in terms of bad controllability over turn-off operation and reduction in cutoff capability during turn-off.

The technique disclosed in Japanese Patent Application Laid-Open No. 2020-027921 is intended to solve the foregoing problems. While Japanese Patent Application Laid-Open No. 2020-027921 has mentions of the depth of the N-type buffer layer, and an impurity concentration and an impurity profile in the N-type buffer layer, it does not have mention of a relationship between crystal defect introduced into an Si wafer during formation of the N-type buffer layer and device characteristics, leading to poor feasibility of a power semiconductor element. As will be described later, crystal defect introduced into the Si wafer is a significant factor to exert influence on controllability over a carrier plasma layer and electric field intensity that are important issues during dynamic operation of a power semiconductor element.

SUMMARY

In a semiconductor device having a vertical structure, the present disclosure is intended to encourage stable breakdown voltage characteristics, reduction in off-loss resulting from reduction in a leakage current during off, improvement of controllability over turn-off operation, and improvement of cutoff capability during turn-off while solving the problem caused by the influence by crystal defect introduced into a wafer during formation of a buffer layer.

A semiconductor device according to the present disclosure includes: a semiconductor substrate with a first main surface and a second main surface; a drift layer of a first conductivity type formed in the semiconductor substrate; an impurity diffusion layer of a second conductivity type formed on the drift layer to be closer to the first main surface; and a buffer layer of the first conductivity type formed on the drift layer to be closer to the second main surface and higher in peak impurity concentration than the drift layer. The buffer layer includes: a first buffer layer in which a trap level derived from lattice defect is not detected by a photoluminescence method; and a second buffer layer provided between the first buffer layer and the drift layer and in which two types of trap levels derived from lattice defect are detected by the photoluminescence method.

The present disclosure achieves stable breakdown voltage characteristics, reduction in off-loss resulting from reduction in a leakage current during off, improvement of controllability over turn-off operation, and improvement of cutoff capability during turn-off while solving the problem caused by the influence by crystal defect introduced into a wafer during formation of an N-type buffer layer.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 11 shows simulation result about a carrier concentration distribution and an electric field intensity distribution between a first main surface and a second main surface at analysis points of FIG. 10 observed in a PNP transistor region of the conventional structure RFC diode;

FIG. 15 shows an electron concentration distribution observed at the analysis points T1 to T7 of FIG. 13 in a PiN diode region of the conventional structure RFC diode;

FIG. 16 shows an electron concentration distribution observed at the analysis points T1 to T7 of FIG. 13 in a PiN diode region of the new structure RFC diode;

FIG. 18 shows a hole concentration distribution observed at the analysis points T1 to T7 of FIG. 13 in the PiN diode region of the new structure RFC diode;

FIG. 24 shows a hole concentration distribution observed at the analysis points T1 to T7 of FIG. 13 in the PNP transistor region of the new structure RFC diode;

FIG. 26 shows an electric field intensity distribution observed at the analysis points T1 to T7 of FIG. 13 in the PNP transistor region of the new structure RFC diode;

FIG. 29 shows a summarized relationship between the device performance of the 1200 V class new structure RFC diode and a Trap B ratio;

FIG. 33 shows recovery waveforms in the prototyped 1200 V class conventional structure RFC diode and the prototyped 1200 V class new structure RFC diode;

FIG. 34 shows recovery waveforms in a snappy mode observed at low temperature in the prototyped 1200 V class conventional structure RFC diode and new structure RFC diode;

FIG. 35 shows relationships between a power source voltage and a reverse recovery charge amount observed at 253 K in the prototyped 1200 V class conventional structure RFC diode and new structure RFC diode;

FIG. 38 shows recovery waveforms observed at a high temperature (473 K) in the prototyped 1200 V class new structure RFC diode;

FIG. 41 is a sectional view showing an example of the structure of an outer peripheral part of a semiconductor device including the PiN diode according to the second preferred embodiment;

FIG. 42 shows waveforms observed during snappy recovery operations in a prototyped 4.5 kV class conventional structure PiN diode and a prototyped 4.5 kV class new structure PiN diode;

FIG. 44 shows a relationship between a power source voltage and a reverse recovery charge amount observed at 298 K in the prototyped 4.5 kV class conventional structure PiN diode and new structure PiN diode;

FIG. 48 shows simulation result about a device interior electric field intensity distribution observed in a short-circuit state in a conventional structure IGBT and a new structure IGBT;

FIG. 55 shows trade-off characteristics between an on voltage and loss during turn-off observed in the prototyped 1200 V class conventional structure IGBT and new structure IGBT;

FIGS. 58 to 70 are process flow diagrams about an IGBT;

FIGS. 71 to 79 are process flow diagrams about an RFC diode;

FIG. 80 shows comparison between process flows;

FIG. 81 shows a relationship between carrier lifetime and the thickness of an N⁻ drift layer ($t_{N-}$) obtained by simulation;

FIG. 82 shows summarized performances of 1200 V class RFC diodes prototyped using the process flows compared in FIG. 80;

DESCRIPTION OF THE PREFERRED EMBODIMENTS

In preferred embodiments described below, an IGBT and a free wheeling diode (FWD) are shown as representative examples of a power semiconductor element, and a "diode" described below means an FWD. However, a technique according to the present disclosure achieves comparable effect in a power semiconductor element such as conducting (RC)-IGBT, a reverse blocking (RB)-IGBT, or a reverse metal-oxide-semiconductor field effect transistor (MOSFET), for example.

In each of the preferred embodiments, Si is used as a semiconductor material. However, a semiconductor device using not only Si but also a wide bandgap material such as SiC or GaN achieves comparable effect. In each of the preferred embodiments, an Si wafer manufactured by the floating zone (FZ) method (FZ wafer) is shown as a representative of an Si material. Alternatively, an Si wafer manufactured by the magnetic field applied Czochralski (MCZ) method resulting in higher residual oxygen concentration in an Si material than the FZ wafer and providing an oxygen content on the order of $10^{17}$ cm$^{-3}$ is also applicable. A semiconductor device described as an example in each of the preferred embodiments belongs to a breakdown voltage class of 1200 V or 4.5 kV. However, comparable effect is achieved at any breakdown voltage class.

First Preferred Embodiment

A semiconductor element provided in a power semiconductor device described in a first preferred embodiment is a relaxed field of cathode (RFC) diode having a structure in which a cathode layer is partially replaced with a P-type region.

Figure 1:
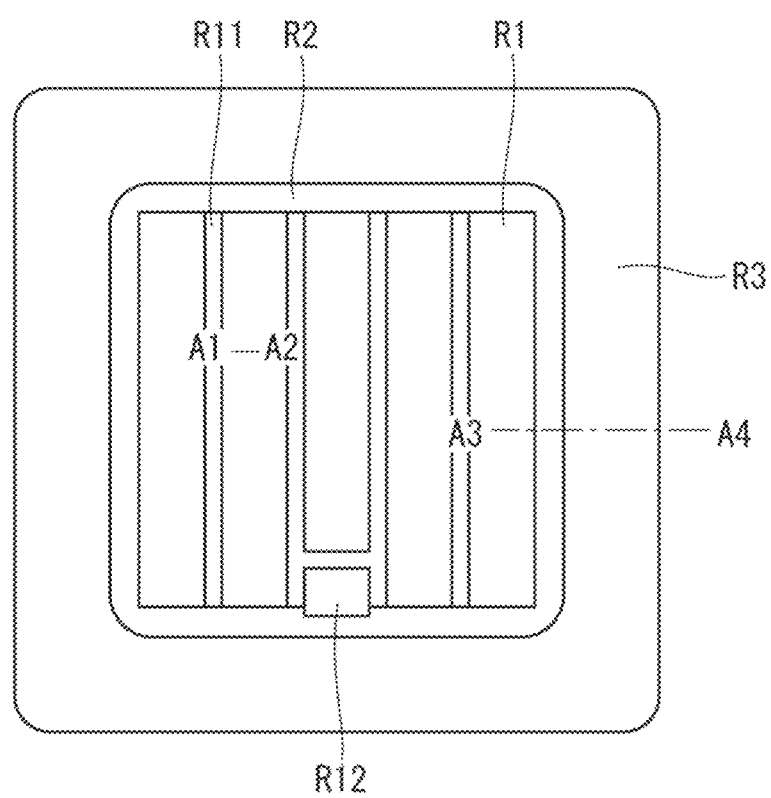
FIG. 1 is a plan view of a semiconductor device according to first to third preferred embodiments.

FIG. 1 is a plan view of a semiconductor device according to the first preferred embodiment. As shown in FIG. 1, the semiconductor device includes a plurality of active cell regions R1 provided at a central area of the device, a surface gate wiring part R11 provided between two of the active cell regions R1 adjacent to each other, and a gate pad part R12 provided in a partial region of the central area. An intermediate region R2 is provided in such a manner as to surround the active cell regions R1, the gate pad part R12, and the surface gate wiring part R11. An edge termination region R3 is provided in such a manner as to surround the intermediate region R2. The gate pad part R12 and the surface gate wiring part R11 may be absent in a diode.

The active cell region R1 is an element forming region for guaranteeing the fundamental performance of a power semiconductor chip. The intermediate region R2 and the edge termination region R3 are regions for breakdown voltage retention. The intermediate region R2 is a region in which the active cell region R1 and the edge termination region R3 are joined to each other, and is a region for guaranteeing destruction tolerance during dynamic operation of the semiconductor device and supporting the primary performance of a semiconductor element formed in the active cell region R1. The edge termination region R3 is responsible for breakdown voltage retention in a static state of the semiconductor device, guarantee of stability and reliability of breakdown voltage characteristics, and suppression of failure in destruction tolerance during dynamic operation of the semiconductor device, thereby supporting the primary performance of the semiconductor element formed in the active cell region R1.

Figure 2:
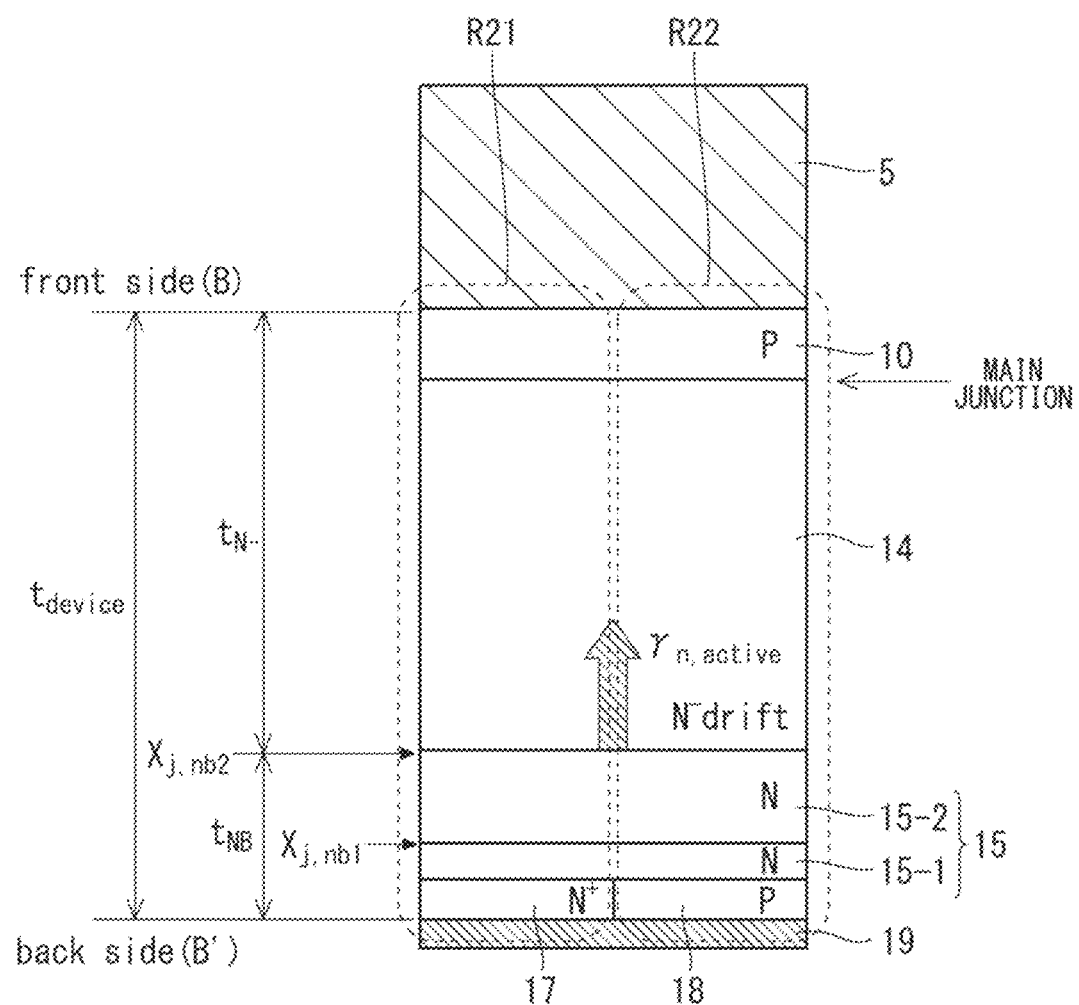
FIG. 2 is a sectional view of an RFC diode according to the first preferred embodiment.
Figure 3:
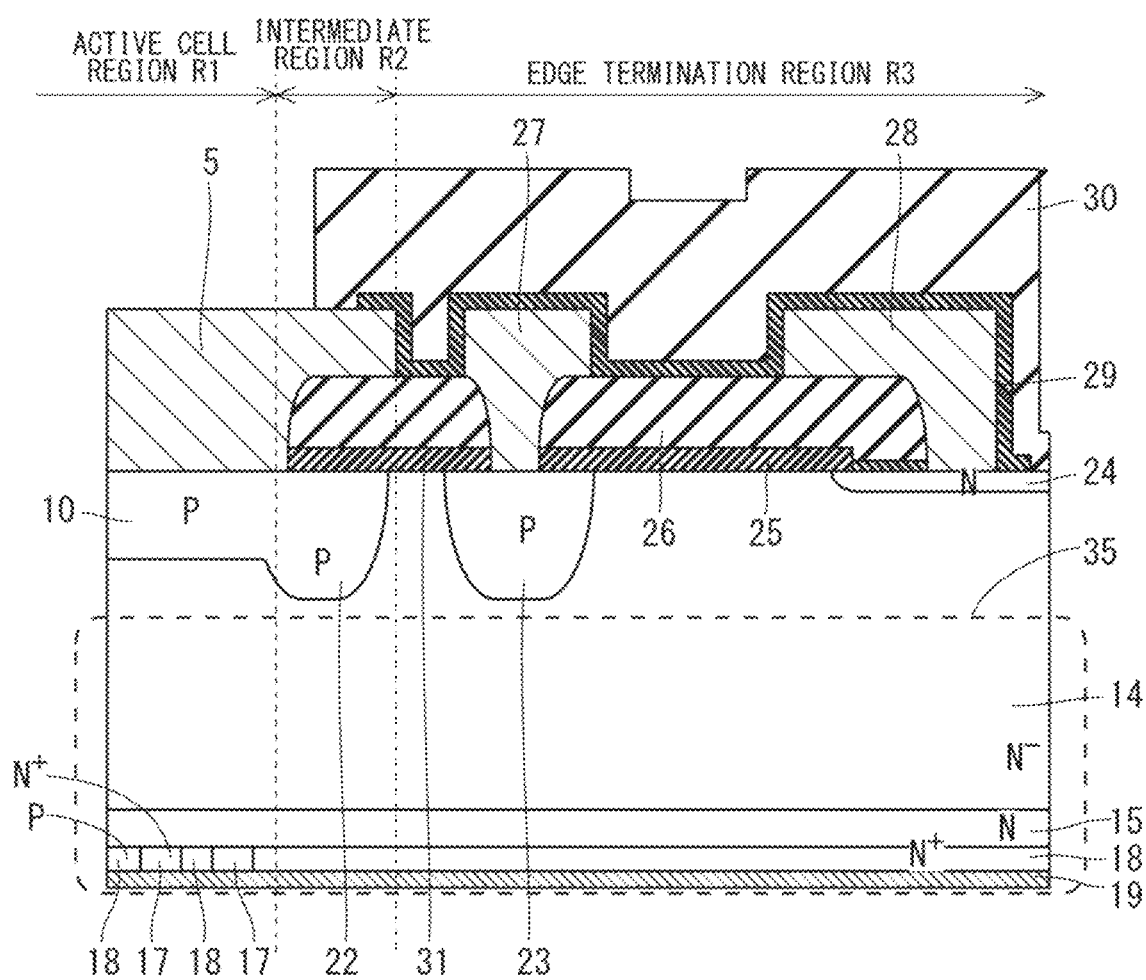
FIG. 3 is a sectional view showing an example of the structure of an outer peripheral part of a semiconductor device including the RFC diode according to the first preferred embodiment.

FIG. 2 is a sectional view of the RFC diode showing the semiconductor element according to the first preferred embodiment and corresponding to a section taken along a line A1-A2 of FIG. 1. FIG. 3 is a sectional view showing an example of the structure of an outer peripheral part of a semiconductor device including the RFC diode according to the first preferred embodiment and corresponding to a section taken along a line A3-A4 of FIG. 1. A surface on the upper side and a surface on the lower side of a semiconductor substrate in the sectional views are defined as a "first main surface" and a "second main surface" respectively. The first main surface may also be expressed an "upper surface," and the second main surface may also be expressed as a "lower surface" or "back side."

The structure of the RFC diode formed in the active cell region R1 will be described first by referring to FIG. 2. The semiconductor substrate forming the RFC diode includes an N⁻ drift layer 14 of an N type (first conductivity type). The semiconductor substrate includes an N-type N buffer layer 15 higher in peak impurity concentration than the N⁻ drift layer 14 formed under the N⁻ drift layer 14. In the first preferred embodiment, the N buffer layer 15 has a two-layer structure including a first buffer layer 15-1 on the lower side and a second buffer layer 15-2 on the upper side. Namely, the second buffer layer 15-2 is provided between the first buffer layer 15-1 and the N⁻ drift layer 14. While not shown in the drawings, the N buffer layer 15 of FIG. 3 also includes the first buffer layer 15-1 and the second buffer layer 15-2. The N buffer layer 15 will be described later in detail.

The semiconductor substrate includes an N⁺ cathode layer 17 of the N type higher in peak impurity concentration than the N buffer layer 15 and a P cathode layer 18 of a P type (second conductivity type) formed under the N buffer layer 15 and adjacent to each other. The N⁺ cathode layer 17 and the P cathode layer 18 are formed in a surface portion of the semiconductor substrate on the back side (second main surface side). A cathode electrode 19 is formed on the back side of the semiconductor device in such a manner as to contact the N⁺ cathode layer 17 and the P cathode layer 18.

The semiconductor substrate includes a P anode layer 10 of the P type formed on the N⁻ drift layer 14. In the RFC diode, a junction between the P anode layer 10 and the N⁻ drift layer 14 functions a main junction. The P anode layer 10 is formed in a surface portion of the semiconductor substrate on the upper surface side (first main surface side). An anode electrode 5 is formed on the upper surface of the semiconductor substrate in such a manner as to contact the P anode layer 10.

As shown in FIG. 2, the P anode layer 10, the N⁻ drift layer 14, the N buffer layer 15, and the N⁺ cathode layer 17 form a PiN diode region R21. Furthermore, the P anode layer 10, the N⁻ drift layer 14, the N buffer layer 15, and the P cathode layer 18 form a PNP transistor region R22. Namely, the RFC diode expressed in an equivalent circuit has a structure with a parallel connection between a PiN diode and a PNP transistor. As the RFC diode is brought into an on state, conductivity modulation occurs to change a carrier concentration, thereby causing the N⁻ drift layer 14 to function as a variable resistance region.

As compared with the PiN diode, the RFC diode achieves distinctive effect in terms of diode performance such as a phenomenon of electric field relaxation of relaxing electric field intensity on the cathode side. In particular, in response to facilitated injection of holes from the P cathode layer 18 in the latter half of recovery operation, electric field intensity on the cathode side is relaxed to suppress a snap-off phenomenon (a phenomenon of voltage jump) and a subsequent oscillation phenomenon at the end of the recovery operation, thereby improving destruction tolerance during the recovery operation. These effects are mentioned in Japanese Patent No. 5256357 and Japanese Patent No. 6301776, for example. In terms of guaranteeing the foregoing effects, the N⁺ cathode layer 17 and the P cathode layer 18 are arranged in such a manner as to fulfill a relationship mentioned in Japanese Patent No. 5256357 or Japanese Patent No. 6301776 (U.S. Pat. No. 8,686,469).

The structures of the intermediate region R2 and the edge termination region R3 of the RFC diode will be described next by referring to FIG. 3.

The N⁻ drift layer 14 extends over the active cell region R1, the intermediate region R2, and the edge termination region R3. A P-type guard ring 22 is formed in a surface portion of the N⁻ drift layer 14 in the intermediate region R2 to a greater depth than the P anode layer 10. The guard ring 22 extends toward the active cell region R1 to be coupled to the P anode layer 10. A P-type field limiting ring 23 is formed selectively in a surface portion of the N⁻ drift layer 14 in the edge termination region R3.

An N⁺ channel stopper layer 24 is further formed selectively in the surface portion of the N⁻ drift layer 14 and external to the field limiting ring 23. The channel stopper layer 24 is provided for the purpose of stopping extension of a depletion layer extending from a junction of the guard ring 22 and the field limiting ring 23 with the N⁻ drift layer 14. A larger number of the field limiting rings 23 results in higher breakdown voltage class of the RFC diode.

An insulating film 25 is formed on the upper surface of the semiconductor substrate in the intermediate region R2 and the edge termination region R3, and an interlayer insulating film 26 is formed on the insulating film 25. An FLR electrode 27 connected to the field limiting ring 23 through a contact hole and a channel stopper electrode 28 connected to the channel stopper layer 24 through a contact hole are formed on the interlayer insulating film 26. The FLR electrode 27 and the channel stopper electrode 28 can be formed simultaneously with the anode electrode 5 in the active cell region R1.

A passivation film 29 is formed as a protective film covering the FLR electrode 27 and the channel stopper electrode 28 in such a manner as to extend over the intermediate region R2 and the edge termination region R3. A passivation film 30 is formed on the passivation film 29.

As shown in FIG. 3, a structure composed of a stack of the N⁻ drift layer 14, the N buffer layer 15, the N⁺ cathode layer 17, and the P cathode layer 18 is defined in such a manner as to extend over the active cell region R1, the intermediate region R2, and the edge termination region R3. This structure corresponds to a vertical structure 35 of the RFC diode. A region with the vertical structure 35 is called a "vertical structure region."

The vertical structure 35 is a region for guaranteeing total loss performance (a total of loss in an on state, loss in a turn-on state, and loss in a turn-off state), breakdown voltage retention in a static state, stability of breakdown voltage characteristics, leakage characteristics during voltage retention at high temperature (off-loss), reliability, controllability during dynamic operation, destruction tolerance, etc., thereby supporting the fundamental performance of the semiconductor device.

The following describes the idea of the vertical structure region according to the present disclosure. In manufacturing a semiconductor device with the vertical structure such as a vertical IGBT or diode, a step of forming the vertical structure 35 on the back side of the semiconductor substrate (on the bottom of the N⁻ drift layer 14) (a step shown in FIGS. 69 and 70 or in FIGS. 78 and 79 described later) is performed after a step of forming an aluminum wiring such as the anode electrode 5 and a step of forming the passivation films 29 and 30. For this reason, annealing for forming a diffusion layer (N buffer layer 15, N⁺ cathode layer 17, and P cathode layer 18) as a part of the vertical structure 35 is performed by employing a technique of performing annealing at a low temperature of equal to or less than the melting point of aluminum (660° C.) or an annealing technique using laser of a wavelength to generate a temperature gradient in the depth direction of the device and to prevent a temperature on the upper surface side of the semiconductor substrate from exceeding the melting point of aluminum (laser annealing).

Figure 58:
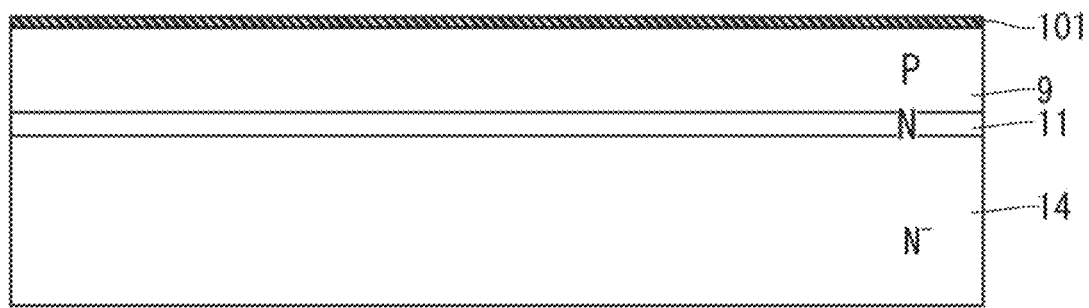
Figure 59:
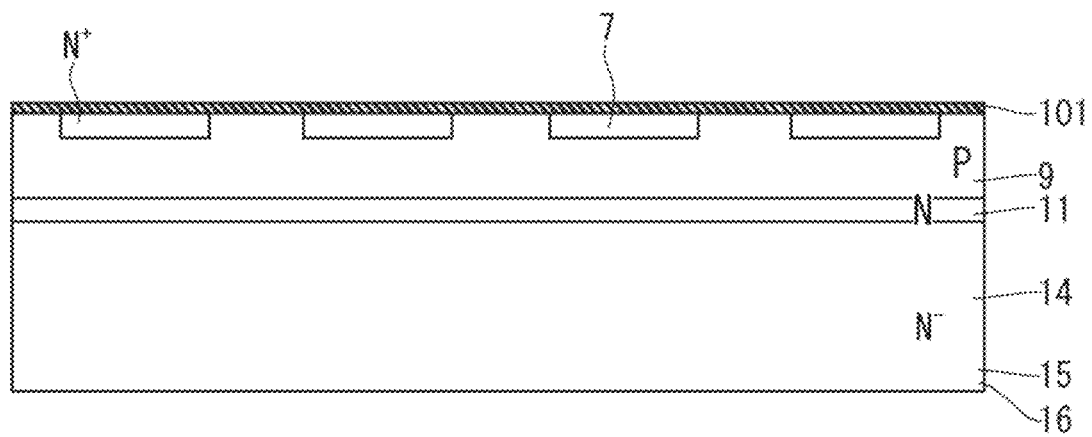

The N buffer layer 15 is formed using the foregoing annealing technique while an N layer profile reproduces a profile in a depth direction defined at the time of ion implantation of introducing impurity. This produces process characteristics during formation of the N layer of causing difficulty in diffusion in the depth direction and in a lateral direction. Regarding formation of an N-type diffusion layer, a technique of performing annealing for a long time at high temperature (≥1100° C.) may be employed as a technique to achieve an N-type diffusion layer with a deep and gentle concentration gradient. However, this technique is not applicable to a step using low melting point metal such as aluminum to become an electrode but is applicable to an initial step of manufacturing process (a step shown in FIG. 58 or 71, for example). In this case, the thickness of a wafer is required to be controlled at an intended thickness (from 40 to 700 μm) either before or after the high-temperature annealing to make this technique unrealistic as each processing device is required to be modified in order to allow processing of the wafer of this thickness in subsequent process to entail enormous cost. Additionally, high-temperature and long-term annealing is a process technique unmatched with dimension increase of an Si wafer.

An IGBT or a diode including the N buffer layer 15 has the following three problems in terms of performance. A first problem is that, regarding voltage retaining capability as significant performance of power semiconductor (hereinafter may also be called breakdown voltage characteristics), increase in off-loss due to increase in leakage current during breakdown voltage retention in a high-temperature state or thermal runway due to heat generation by the device itself at high temperature makes the device uncontrollable, resulting in failure to guarantee operation at high temperature.

A second problem is that, during dynamic operation such as turn-off operation of each of an IGBT and a diode, a carrier plasma layer around a junction between the N⁻ drift layer 14 and the N buffer layer 15 is exhausted according to a relationship between a carrier plasma state and an electric field intensity distribution inside the device. This causes increase in electric field intensity at the junction between the N⁻ drift layer 14 and the N buffer layer 15 or causes a snap-off phenomenon that is a phenomenon of voltage jump occurring on a turn-off waveform at the end of the turn-off operation. As a result, an oscillation phenomenon due to the snap-off phenomenon is caused or a voltage is increased to a high level of equal to or greater than a retainable breakdown voltage under the snap-off phenomenon to cause destruction of the device. The carrier plasma layer is a neutral layer of a high carrier concentration in which an electron concentration and a hole concentration are substantially equal to each other, N≈P, carrier density is higher than $10^{16}$ cm$^{-3}$, and a carrier concentration is two to three orders of magnitude higher than a doping carrier concentration in the N⁻ drift layer 14.

As a result, the conventional IGBT and diode cause bad controllability over turn-off operation and reduction in cutoff capability during turn-off. An inverter system including a power module equipped with an IGBT or a diode prone to the snap-off phenomenon and the subsequent oscillation phenomenon is to be subjected to the occurrence of noise to cause malfunction.

A third problem is that, as a result of the foregoing characteristics during formation of the N buffer layer 15, a scratch or a foreign object is caused on a surface for formation of the N buffer layer 15 during wafer process of forming the vertical structure 35, and this likely results in a phenomenon of a partially unfinished state of the N buffer layer 15. This makes the IGBT and the diode sensitive to a phenomenon of breakdown voltage defect, causing increase in defect rate of IGBT and diode chips in terms of breakdown voltage characteristics.

As described above as the second problem, in the IGBT and the diode each including the N buffer layer 15, a carrier plasma layer around the junction between the N⁻ drift layer 14 and the N buffer layer 15 is likely to be exhausted during dynamic operation according to a relationship between a carrier plasma state and an electric field intensity distribution inside the device. The exhaustion of the carrier plasma layer around the junction between the N⁻ drift layer 14 and the N buffer layer 15 results in a device interior state in which electric field intensity is increased at the junction between the N⁻ drift layer 14 and the N buffer layer 15.

Regarding a waveform during turn-off operation, the value of $dj_C/dt$ becomes greater in an IGBT and the value of $dj_A/dt$ becomes greater in a diode at the end of the turn-off operation. As there is a relationship of $V=Ldj/dt$, the snap-off phenomenon and the subsequent oscillation phenomenon occur in a voltage waveform and this may cause destruction of the device due to the snap-off phenomenon. As a result, in both the IGBT and the diode, controllability over the turn-off operation is worsened and cutoff capability during the turn-off is degraded. These snap-off phenomenon and oscillation phenomenon depend on a condition for the turn-off operation. Specifically, these phenomenon become noticeable under various conditions such as a condition of a high power source voltage ($V_{CC}$) to cause a depletion layer to reach the junction between the N⁻ drift layer 14 and the N buffer layer 15 easily, a condition of a low current density ($J_C$, $J_A$) to cause reduction in carrier density inside the device, a condition of high floating inductance ($L_S$) as a switching operation circuit parameter, and a condition of a low operating temperature, for example.

Regarding the voltage retaining capability as significant performance of a power semiconductor device, increase in off-loss due to increase in leakage current during breakdown voltage retention in a high-temperature state or thermal runway due to heat generation by the device itself at high temperature makes the device uncontrollable, resulting in failure in operation at high temperature. A heat generating component in power semiconductor includes loss in an on state, switching loss meaning loss during switching operation (turn-on and turn-off), and off-loss meaning loss in an off state. The foregoing situation means increase in the off-loss as one of the three heat generating components of the power semiconductor itself, and this becomes an issue in thermal design of a power module equipped with the power semiconductor.

In the conventional IGBT and diode, a parameter for the N⁻ drift layer 14 has been optimized in response to the foregoing problems by increasing the thickness of the N⁻ drift layer 14 or increasing an impurity concentration in the N⁻ drift layer 14 to reduce variation in the concentration, for example. However, increasing the thickness of the N⁻ drift layer 14 results in a harmful effect that an ON voltage is increased both in the IGBT and the diode to increase total loss. Furthermore, reducing variation in the impurity concentration in the N⁻ drift layer 14 corresponds to imposing restriction on a technique of manufacturing an Si wafer and on an Si wafer to be used, causing price rise of the Si wafer. As described, the conventional IGBT and diode encounter a technique issue considered to be a dilemma in improving device performance.

As solutions to the foregoing second problem, U.S. Pat. Nos. 6,482,681, 7,514,750, and 7,538,412 suggest use of proton (H⁺) for forming the N buffer layer 15 composed of a plurality of layers. According to these techniques, a high concentration of proton is required for breakdown voltage retention as the fundamental characteristics of power semiconductor in consideration of thickness reduction of the N⁻ drift layer 14 as a trend toward total loss reduction in the IGBT or diode. However, increasing the concentration of proton is accompanied by increase in crystal defect occurring during introduction of proton or increase in defect density to cause a recombination center of carriers due to crystal defect. This causes a disadvantage that off-loss is increased in the IGBT and the diode (namely, a leakage current is increased at high temperature and a high voltage) or destruction tolerance is reduced. Fundamental performance required to be achieved by the power semiconductor is to have voltage retaining capability while reducing total loss, and to guarantee destruction tolerance. Increase in off-loss increases the amount of heat generated by the IGBT or the diode itself, and this becomes an issue in high-temperature operation or in thermal design of a power module itself equipped with the power semiconductor. Specifically, the foregoing techniques do not satisfy requirement in the power semiconductor with the most recent tendency toward a smaller thickness of the N⁻ drift layer 14. Furthermore, increasing the concentration of proton causes reduction in the processing capability of an ion implantation device in introducing proton into Si. This further causes a disadvantage in terms of a device manufacturing technique.

As described above, an N buffer layer structure to solve the foregoing issue is required in wafer process using a wafer prepared by the FZ method or the MCZ method and responsive to dimension increase of an Si wafer. Furthermore, being less sensitive is also required in response to a phenomenon of breakdown voltage defect in the IGBT or the diode due to a partially unfinished state of the N buffer layer 15 caused by bad influence in the wafer process.

In view of the foregoing, the technique according to the present disclosure is intended to realize the following in bipolar power semiconductor such as a power semiconductor IGBT or FWD as a key component of a power module (rated breakdown voltage ≥600 V):

(a) A vertical structure to increase voltage cutoff capability in an off state (static breakdown voltage retaining capability), to reduce a leakage current during retention of a breakdown voltage (voltage) at high temperature, and to realize reduction in off-loss and high-temperature operation;

(b) A vertical structure to suppress a snap-off phenomenon and an oscillation phenomenon resulting from the snap-off phenomenon at the end of turn-off operation;

(c) A vertical structure to realize improvement of cutoff capability during turn-off operation (dynamic destruction tolerance) and extension of a safe operating temperature range; and (d) A vertical structure incorporable to a wafer process technique responsive to dimension increase of a wafer (≥200 mm) for manufacturing semiconductor.

Figure 5:
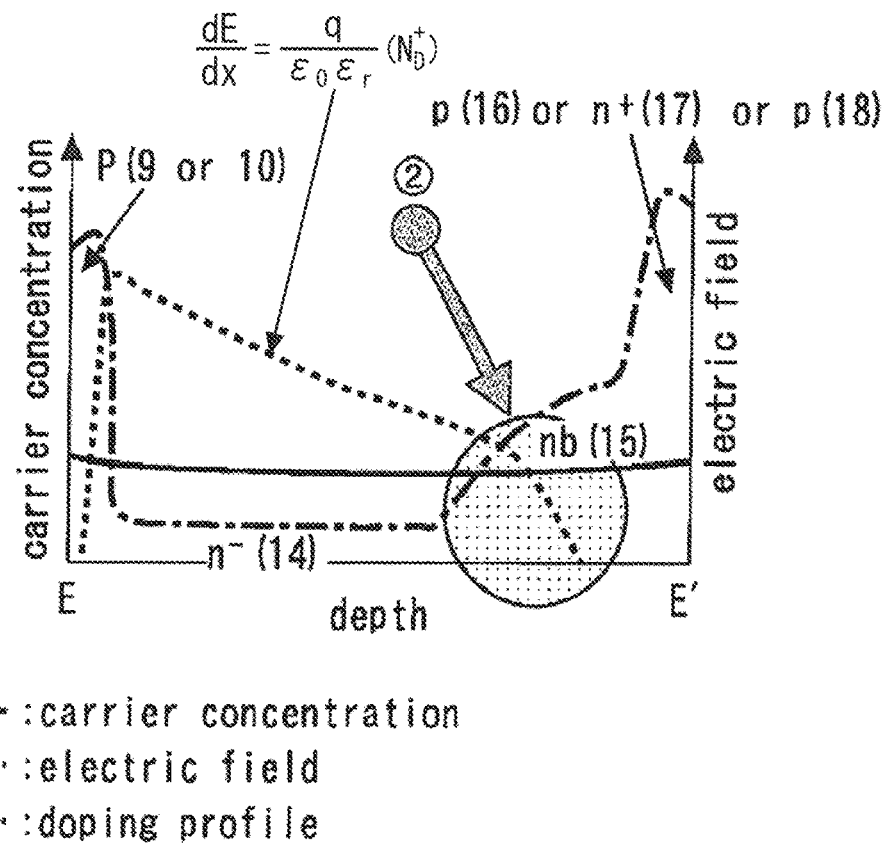
Figure 6:
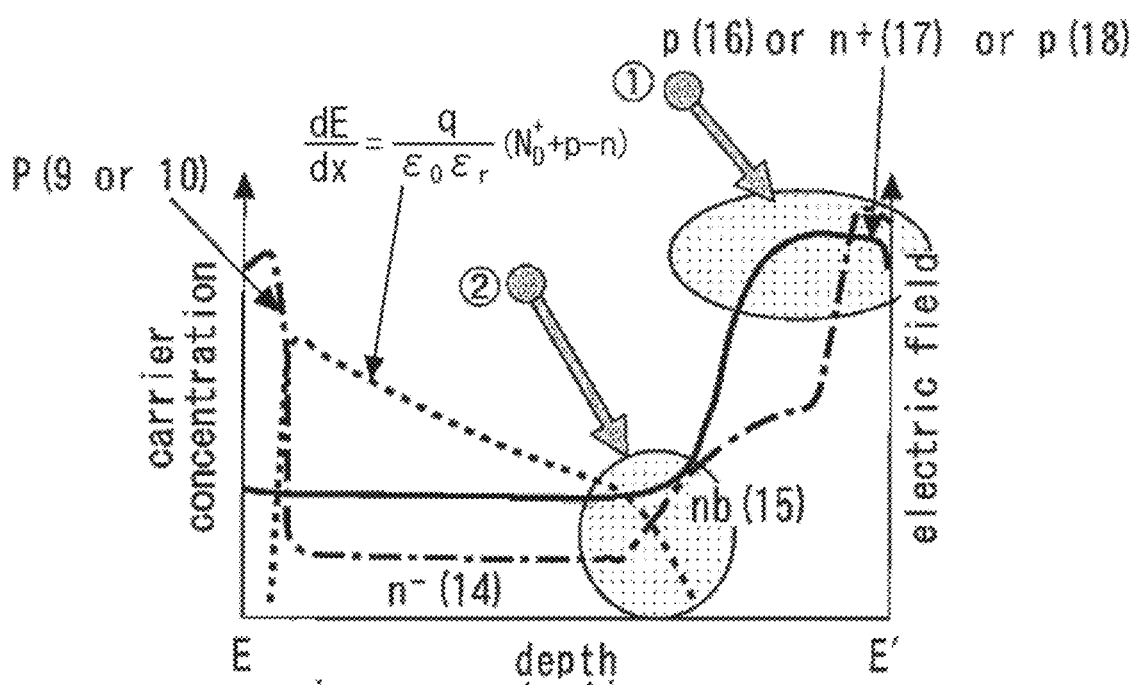

The ideas of the vertical structures suggested in the present disclosure will be described using FIGS. 4 to 6. Symbols shown in FIGS. 4 to 6 have the meanings as follows:

$Q_{pl}$: charge of plasma layer (charge in a plasma layer)
$n_{pi}$: electron/hole concentration in plasma layer (the concentration of electron/hole in the plasm layer)
V: potential
q: elementary charge (1.60218×10⁻¹⁹ C)
$\varepsilon_0$: dielectric constant in vacuum (8.85418×10⁻¹⁴ F/cm)
$\varepsilon_r$: relative dielectric constant (in Si, 11.9)
$N^+_D$: ionized donor concentration (cm⁻³)
n, p: free electron/hole concentration (cm⁻³)
$J_n$, $J_p$: current density of electron/hole current (A/cm⁻³)
$V_{sat(n)}$, $V_{sat(p)}$: saturation drift velocity of electron/hole (cm/s)

The foregoing technical issue resulting from the problems observed in the conventional IGBT and diode is considered to be solved by realizing the following vertical structure, particularly characterized by the N buffer layer 15. The concept described below is common between an IGBT and a diode. An idea relating to the N buffer layer 15 forming the vertical structure suggested in the present disclosure is given in the following sections i, ii, and iii.

Figure 4:
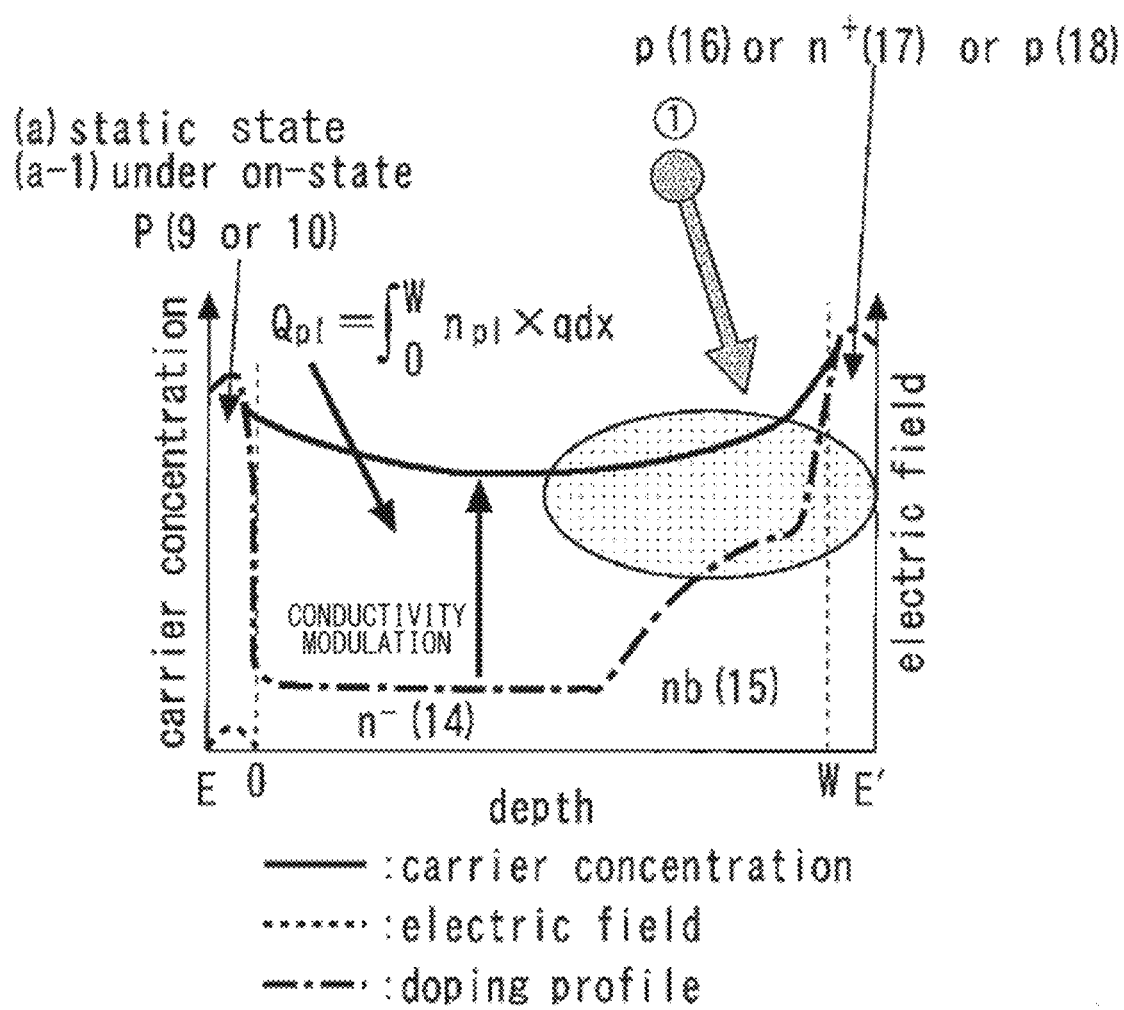
FIGS. 4 to 6 explain a role intended to be fulfilled by an N buffer layer.

(i) Regarding the exhaustion phenomenon of the carrier plasma layer around the junction between the N⁻ drift layer 14 and the N buffer layer 15 during turn-off operation, the carrier plasma layer is caused to remain as indicated by a circle 1 with an arrow in FIG. 4. Specifically, by generating a conductivity modulation phenomenon while the device in an ON state even inside the N buffer layer 15, a concentration in the N buffer layer 15 is reduced to maintain the carrier plasma layer. As the carrier plasma layer is a high concentration layer of a concentration of equal to or greater than 10¹⁶ cm⁻³, the concentration is reduced to a lower level on the order of 10¹⁵ cm⁻³. In this case, a charge amount in the carrier plasma layer is expressed by the relational expression of $Q_{pl}$ shown in FIG. 4.

(ii) In order to hold electric field intensity in a static state inside the N buffer layer 15 and cause a depletion layer to extend gently inside the N buffer layer 15 during dynamic operation, a gentle concentration gradient is formed around the junction between the N⁻ drift layer 14 and the N buffer layer 15. As indicated by a circle 2 with an arrow in FIG. 5, the depletion layer stops in the N buffer layer 15 according to a relationship with the remaining carrier plasma layer. At this time, the gradient of an electric field intensity distribution is expressed by the relational expression of dE/dx shown in FIG. 6.

(iii) By forming a low-concentration thick N layer with a concentration gradient, breakdown voltage characteristics as the fundamental performance of power semiconductor are guaranteed. Specifically, the current amplification factor ($\alpha_{pnp}$) of a PNP transistor provided in an IGBT and in an RFC diode during breakdown voltage retention is reduced to reduce a leakage current during off, thereby realizing reduction in off-loss.

Namely, the N buffer layer 15 is responsible for a role of guaranteeing breakdown voltage characteristics such as stabilization of the breakdown voltage characteristics and reduction in off-loss, and then controlling a carrier plasma state inside the device during operation of the device.

As a result, it becomes possible to suppress a snap-off phenomenon and an oscillation phenomenon resulting from the snap-off phenomenon at the end of turn-off operation after the stabilization of the breakdown voltage characteristics and reduction in off-loss are guaranteed in the IGBT and the diode. This allows implementation of power semiconductor with good controllability over switching operation and improvement of destruction tolerance in a dynamic state. Furthermore, sensitiveness is reduced in response to a phenomenon of breakdown voltage defect in the IGBT and the diode due to a partially unfinished state of the N buffer layer 15 caused by bad influence in the wafer process, thereby achieving the effect of suppressing defect rate increase of IGBT and diode chips.

The N buffer layer 15 of the semiconductor device according to the first preferred embodiment will be described next in detail. As described above, the N buffer layer 15 of the semiconductor device according to the first preferred embodiment is composed of the first buffer layer 15-1 in the lower layer and the second buffer layer 15-2 in the upper layer.

The first buffer layer 15-1 is a region in which a peak impurity concentration ($C_{nb1,p}$) is from 1.0×10¹⁶ to 5.0×10¹⁶ cm⁻³, and a depth from the back side of the semiconductor substrate ($X_{j,nb1}$) is from 1.2 to 5.0 μm.

The second buffer layer 15-2 is a region in which a maximum peak impurity concentration (($C_{nb2,p})_{max}$) is greater than an impurity concentration in the semiconductor substrate ($C_{n-}$: range from 1.0×10¹² to 5.0×10¹⁴ cm⁻³) and equal to or less than 1.0×10¹⁵ cm⁻³, and a depth from the back side of the semiconductor substrate ($X_{j,nb2}$) is from 4.0 to 50 μm.

In light of the foregoing relationship, the first buffer layer 15-1 and the second buffer layer 15-2 forming the N buffer layer 15 are to fulfill their roles described below in consideration of the role shown in FIGS. 4 to 6 intended to be fulfilled by the N buffer structure.

The first buffer layer 15-1 is responsible for the role of stopping the depletion layer extending from the main junction in a static state (a region indicated by the circle 2 with an arrow in FIG. 5) to achieve the effect of providing stable breakdown voltage characteristics and reducing off-loss by reducing a leakage current during off.

In the second buffer layer 15-2, by the presence of a carrier plasma layer generated by a conductivity modulation phenomenon in an on state (in a state where a rated main current flows), an impurity concentration is increased from a concentration in a doping profile determined during formation of the second buffer layer 15-2 in the wafer process (a region indicated by the circle 1 with an arrow shown in FIG. 4). For this reason, the second buffer layer 15-2 is given the role of expanding the base width of a PNP transistor to achieve the effect of reducing the current amplification factor ($\alpha_{pnp}$) and reducing off-loss by reducing a leakage current during off. This carrier plasma layer functions as a remaining carrier plasma layer in a dynamic state (a region indicated by a circle 1 with an arrow shown in FIG. 6). The second buffer layer 15-2 is further responsible for the role of causing a depletion layer from the main junction and a dynamic state to extend at a lower speed in a static state than a speed of movement inside the N$^-$ drift layer 14, and controlling an electric field intensity distribution using the presence of the carrier plasma layer remaining from an on state (a region indicated by a circle 2 with an arrow shown in FIG. 6), thereby achieving the effect of suppressing a snap-off phenomenon and an oscillation phenomenon resulting from the snap-off phenomenon at the end of turn-off operation, improving controllability over switching operation, and improving destruction tolerance in a dynamic state.

In the following description, a layer simply called an "N buffer layer 15" basically means the N buffer layer 15 composed of the first buffer layer 15-1 and the second buffer layer 15-2 described above. If the semiconductor device according to the present disclosure and a conventional semiconductor device are described in comparison with each other, for example, the N buffer layer 15 composed of the first buffer layer 15-1 and the second buffer layer 15-2 may be called a "new structure N buffer layer 15," and an N buffer layer 15 of a conventional single layer structure (composed only of a layer corresponding to the first buffer layer 15-1) may be called a "conventional structure N buffer layer 15." The RFC diode of the first preferred embodiment including the new structure N buffer layer 15 may be called a "new structure RFC diode," and a conventional RFC diode including the conventional structure N buffer layer 15 may be called a "conventional structure RFC diode."

A method of forming the new structure N buffer layer 15 will be described in a fourth preferred embodiment in association with "Trap B ratio" described later.

In the RFC diode according to the first preferred embodiment, parameters for diffusion layers other than the N buffer layer 15 are set as follows. The N$^-$ drift layer 14 is formed using an Si wafer (FZ wafer) prepared by the FZ method having an impurity concentration ($C_{n-}$) from $1.0 \times 10^{12}$ to $5.0 \times 10^{14}$ cm$^{-3}$. A final device thickness ($t_{device}$) is from 40 to 700 μm. The P anode layer 10 is set at a surface impurity concentration of equal to or greater than $1.0 \times 10^{16}$ cm$^{-3}$, a peak impurity concentration from $2.0 \times 10^{16}$ to $1.0 \times 10^{18}$ cm$^{-3}$, and a depth from 2.0 to 10.0 μm. The N$^+$ cathode layer 17 is set at a surface impurity concentration from $1.0 \times 10^{18}$ to $1.0 \times 10^{21}$ cm$^{-3}$ and a depth from 0.3 to 0.8 μm. The P cathode layer 18 is set at a surface impurity concentration from $1.0 \times 10^{16}$ to $1.0 \times 10^{20}$ cm$^{-3}$ and a depth from 0.3 to 0.8 μm.

Figure 7:
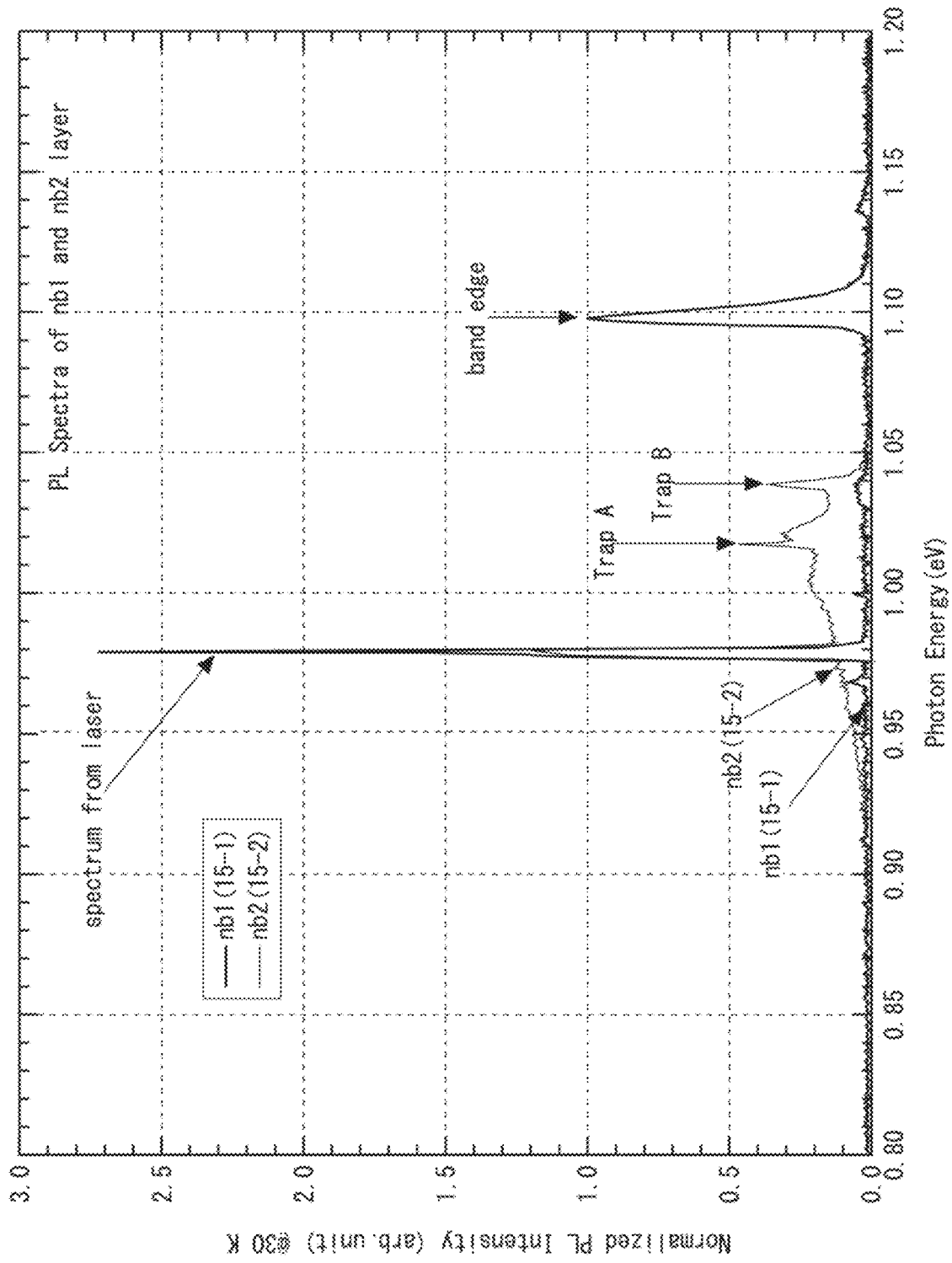
FIG. 7 shows result of PL spectral about a first buffer layer and a second buffer layer.

FIG. 7 shows result of spectral obtained by a photoluminescence (PL) method about the first buffer layer 15-1 and the second buffer layer 15-2 forming the new structure N buffer layer 15. The PL method is an analysis method of irradiating semiconductor with light and observing light emitted during recombination of an electron-hole pair after passing through a defect level. The PL measurement was made by using He—Ne laser (wavelength: 633 nm) and by setting a temperature at 30 K, laser intensity to impinge on a sample surface at 4.5 mW, a laser diameter at 1.3 μm, and laser intensity on the sample surface at 0.339 MW/cm$^2$.

In FIG. 7, a vertical axis shows PL intensity normalized using intensity at the band terminal of each layer. The PL intensity on the vertical axis of FIG. 7 shows defect density. Higher PL density means higher defect density of defects as origins of the PL intensity. As understood from FIG. 7, while nothing was detected in the first buffer layer 15-1, a PL spectrum having two characteristic peaks derived from lattice defect was obtained in the second buffer layer 15-2. These two characteristic peaks are levels resulting from Trap A (photon energy: 1.0182 eV) and Trap B (photon energy: 1.0398 eV) existing in the second buffer layer 15-2.

Trap A and Trap B detected in this layer agree with the photon energy of an aggregated matter (W-centre) of lattice defect occurring during introduction of proton into Si and the photon energy of a lattice defect pair (X-centre) occurring during re-aggregation of proton after the proton is diffused by annealing respectively, as understood from the following thesis: R. Jones, T. A. G. Eberlein, N. Pinho, B. J. Coomer, J. P. Gross, P. R. Briddom and S. Oberg, "Self-Interstitial Clusters in Silicon," Nucl. Instrum. Methods Phys. Res. B, Beam Interact. Mater. At., vol. 186, pp. 10.18, January 2002, doi: 10.1016/S0168-583X (01) 00872-2.

As described above, the N buffer layer 15 is composed of the first buffer layer 15-1 with no lattice defect and the second buffer layer 15-2 with lattice defect. Namely, the N buffer layer 15 is composed of a plurality of N layers of different carrier lifetimes, and the first buffer layer 15-1 has a longer carrier lifetime than the second buffer layer 15-2.

With carrier lifetime in the first buffer layer 15-1 expressed as $\tau_{15a}$, carrier lifetime in the second buffer layer 15-2 as $\tau_{15b}$, carrier lifetime in the N$^-$ drift layer 14 as $\tau_{14}$, carrier lifetime in the N$^+$ cathode layer 17 as $\tau_{17}$, and carrier lifetime in the P cathode layer 18 as $\tau_{18}$, the relationship of $\tau_{15b} < \tau_{17} \approx \tau_{18} \approx \tau_{15a} \approx \tau_{14}$ is established in the RFC diode of the first preferred embodiment (the detail of which will be described in a fourth preferred embodiment).

Satisfying this relationship between the carrier lifetimes achieves the effect of stabilizing the efficiency of carrier injection from the lower surface side in an on state of the diode (electron injection efficiency $\gamma_{n,\ active}$ shown in FIG. 2), the effect of reducing a leakage current occurring when the main junction is depleted by application of a reverse bias, and the effect of encouraging carrier recombination using the second buffer layer 15-2. As a result, the following effects are expected to be achieved: stable on operation of the diode (FIG. 31), reduction in off-loss (FIG. 32), high-temperature operation based on thermally stable operation (FIGS. 32 and 38), improvement of dynamic durability (FIGS. 34 and 37, for example), etc.

Next, regarding the RFC diode with the new structure N buffer layer 15, influence on device performance by two types of traps existing in the second buffer layer 15-2 will be clarified to explain the operation of the new structure N buffer layer 15, thereby verifying the effect of the technique according to the present disclosure in terms of device performance. In discussing a relationship between the two types of traps existing in the second buffer layer 15-2 and the device performance, a Trap B ratio defined by the following formula (1) is set as an index to the relationship between the two types of traps and the device performance.

$$\text{Trap } B \text{ ratio } (\%) = \{S_{PLB}/(S_{PLA} + S_{PLB})\} \times 100 \qquad \text{Formula (1)}$$

In the formula (1), $S_{PLB}$ is the PL intensity of Trap B and $S_{PLA}$ is the PL intensity of Trap A.

Figure 8:
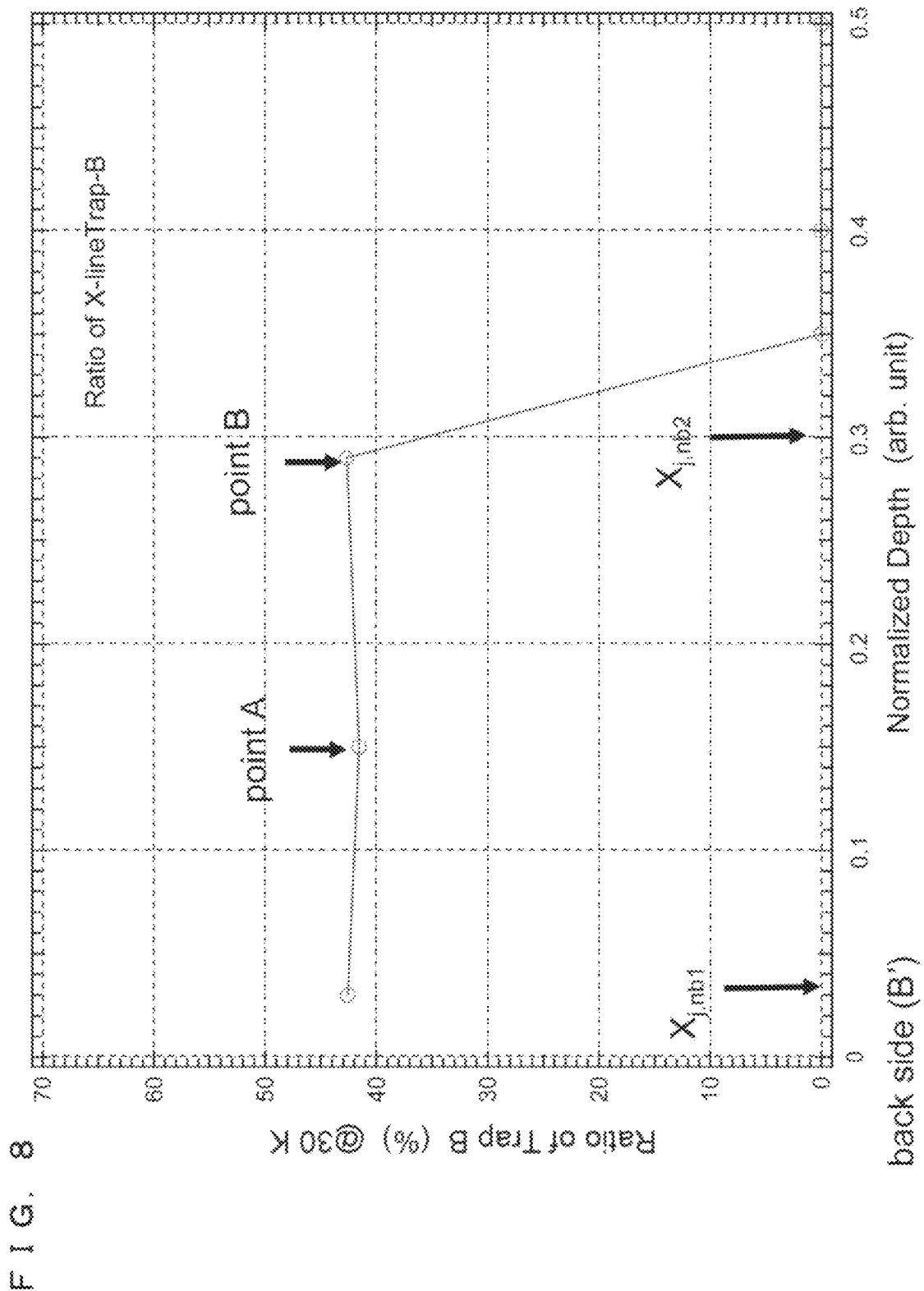
FIG. 8 shows change in Trap B ratio from a lower surface side of the second buffer layer toward an N− drift layer.

FIG. 8 shows change in Trap B ratio in the depth direction of the second buffer layer 15-2. Numerical values on the horizontal axis are obtained by normalizing a device thickness using the thickness ($t_{device}$) of the device. In FIG. 8, $X_{j,nb1}$ and $X_{j,nb2}$ mean a junction between the first buffer layer 15-1 and the second buffer layer 15-2 and a junction between the second buffer layer 15-2 and the N⁻ drift layer 14 respectively. As Trap A and Trap B are not detected from the N⁻ drift layer 14, a Trap B ratio is zero after $X_{j,nb2}$. As will be described later, to obtain the effect achieved by the new structure N buffer layer 15, a Trap B ratio is required to be controlled within a range from 15 to 55%. As understood from FIG. 8, a Trap B ratio is constantly within the foregoing permissible range in the second buffer layer 15-2. Trap B ratios shown in FIGS. 27 to 30 referred to later are numerical values obtained around the center of the second buffer layer 15-2 on the basis of the behavior shown in FIG. 8.

A structure in the intermediate region R2 and the edge termination region R3 in a prototyped RFC diode corresponds to the structure shown in FIG. 3. The N buffer layer 15 has the same structure in the intermediate region R2 and the edge termination region R3 as the structure in the active cell region R1. Namely, the N buffer layer 15 in the prototyped new structure RFC diode includes the first buffer layer 15-1 and the second buffer layer 15-2 extending over the active cell region R1, the intermediate region R2, and the edge termination region R3. The N buffer layer 15 in a prototyped conventional structure RFC diode has a single layer structure (only a layer corresponding to the first buffer layer 15-1) extending over the active cell region R1, the intermediate region R2, and the edge termination region R3.

Figure 9:
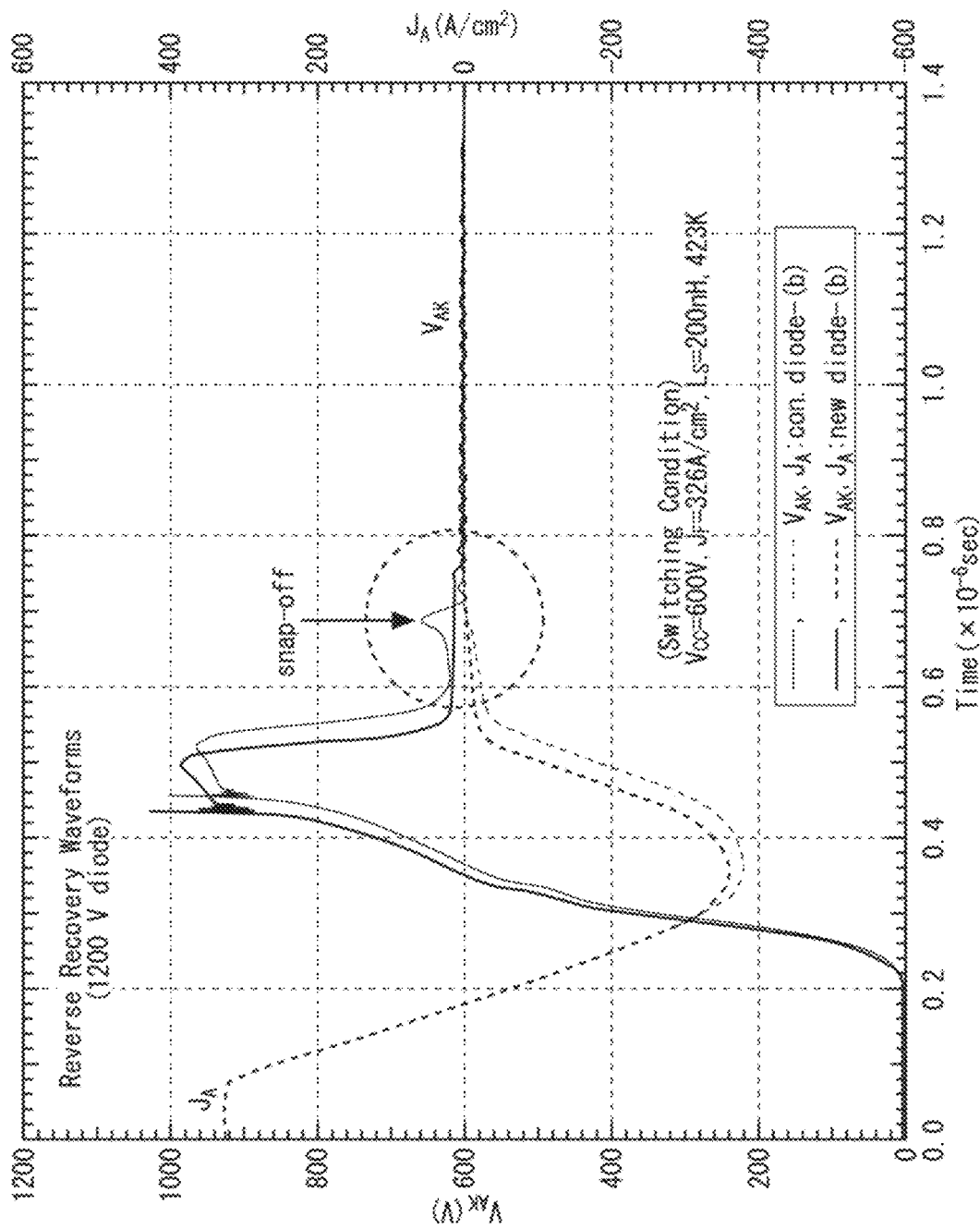
FIG. 9 shows simulation result about recovery waveforms (1200 V class) of a conventional structure RFC diode and a new structure RFC diode.

FIG. 9 shows simulation result about recovery operations of the conventional structure RFC diode and the new structure RFC diode. A part surrounded by a dotted circle in FIG. 9 is shown in an enlarged manner in FIG. 10. The conventional structure RFC diode and the new structure RFC diode shown in FIG. 9 have the same thickness ($t_{device}$) and the same impurity concentration ($C_{n-}$) in the N⁻ drift layer 14. Regarding an indication given to each graph, "new diode-(b)" means the new structure RFC diode and "con. diode-(b)" means the conventional structure RFC diode.

Figure 10:
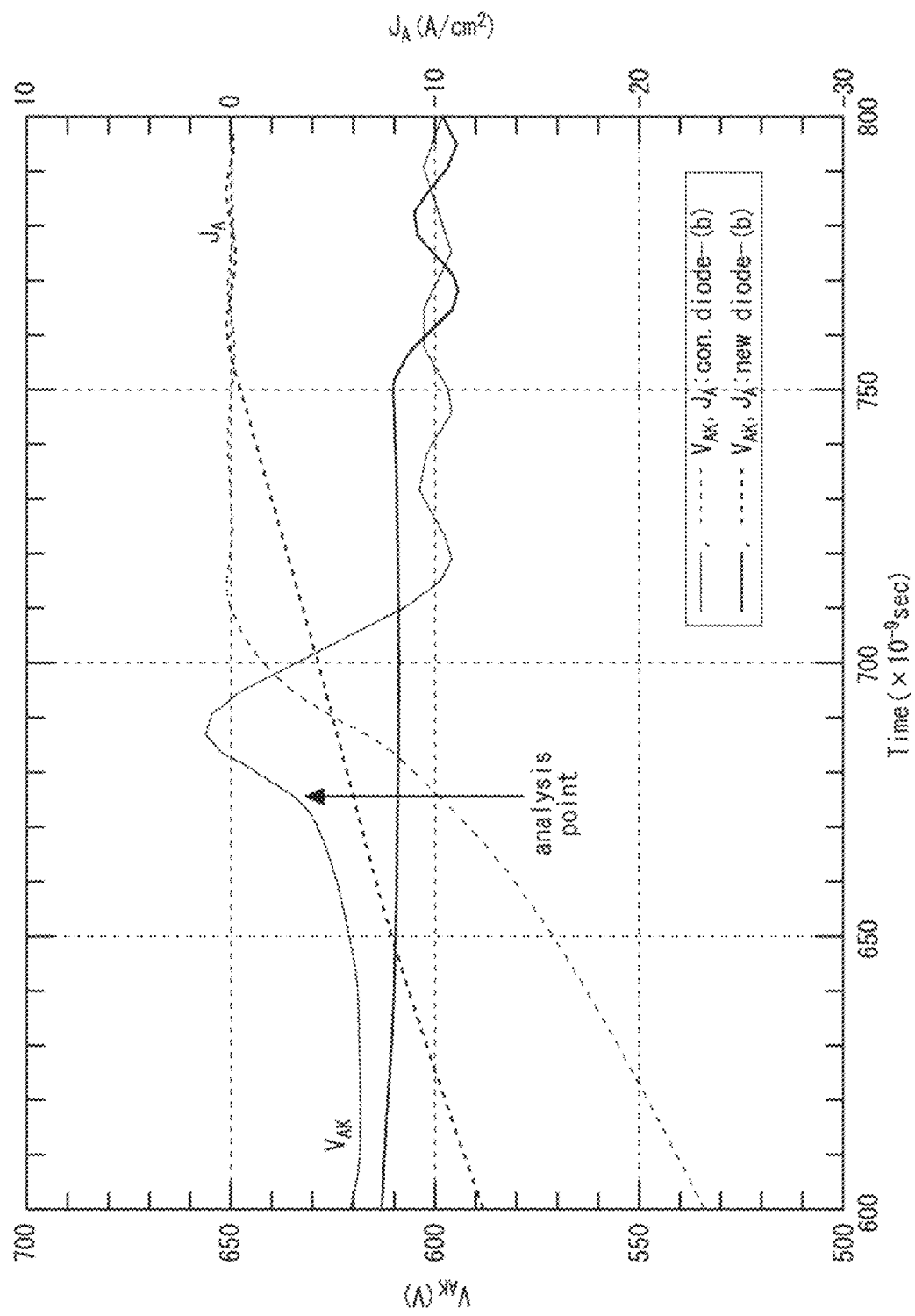
FIG. 10 shows a part of FIG. 9 in an enlarged manner.
Figure 12:
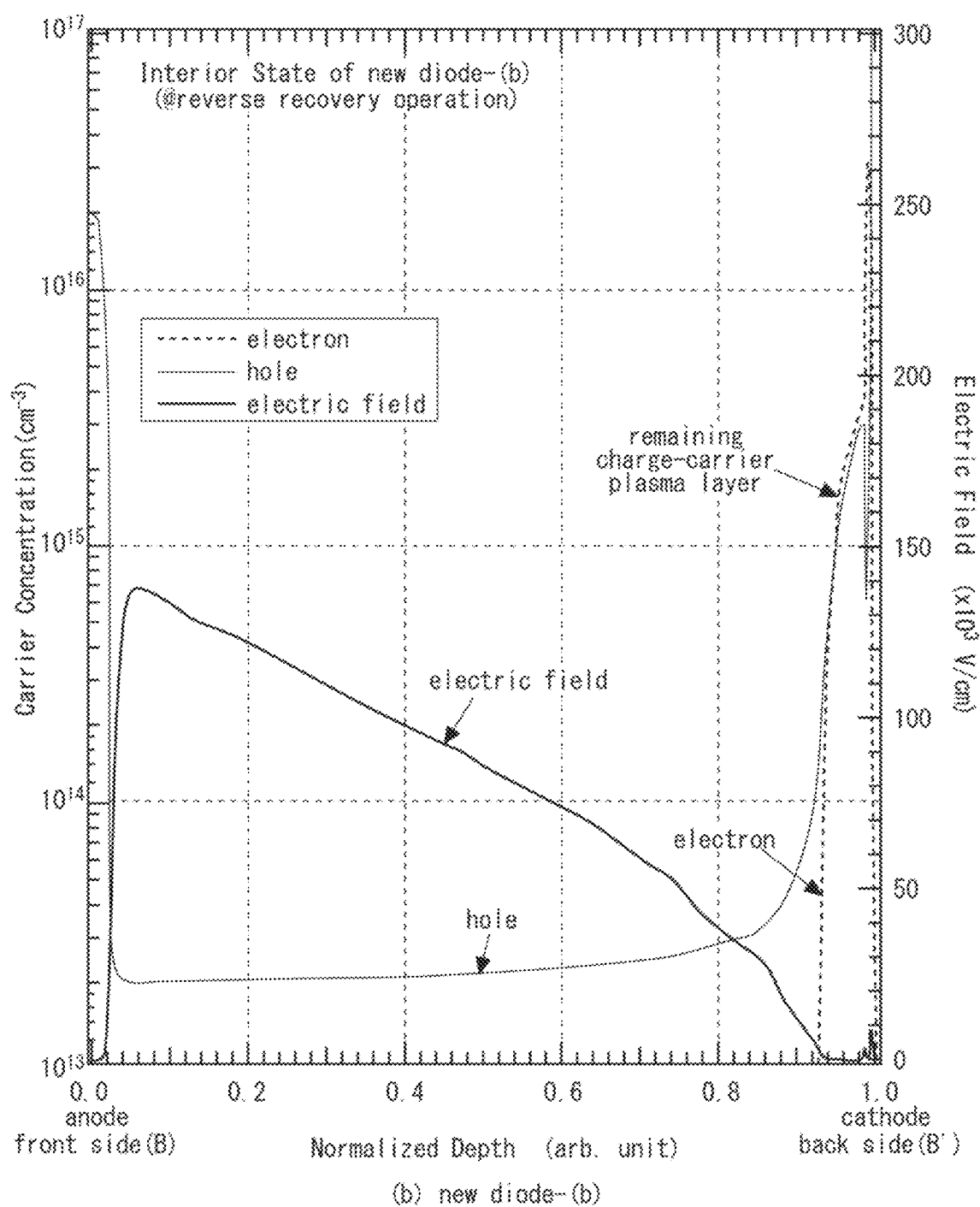
FIG. 12 shows simulation result about a carrier concentration distribution and an electric field intensity distribution between a first main surface and a second main surface at analysis points of FIG. 10 observed in a PNP transistor region of the new structure RFC diode.

FIGS. 11 and 12 each show simulation result about a carrier concentration distribution and an electric field intensity distribution between the first main surface and the second main surface at analysis points of FIG. 10 observed in the PNP transistor region R22 of the RFC diode. FIG. 11 shows the result about the conventional structure RFC diode. FIG. 12 shows the result about the new structure RFC diode. As understood from FIGS. 11 and 12, a carrier plasma layer remaining on the cathode side during recovery operation is present in the new structure RFC diode, unlike in the conventional structure RFC diode. In the new structure RFC diode, by the presence of this remaining carrier plasma layer, electric field intensity on the cathode side is relaxed in the latter half of recovery operation. As a result, as shown in FIG. 9, dj/dt at the end of the recovery operation is reduced in the new structure RFC diode compared with the conventional structure RFC diode to achieve the effect of suppressing a snap-off phenomenon.

Figure 13:
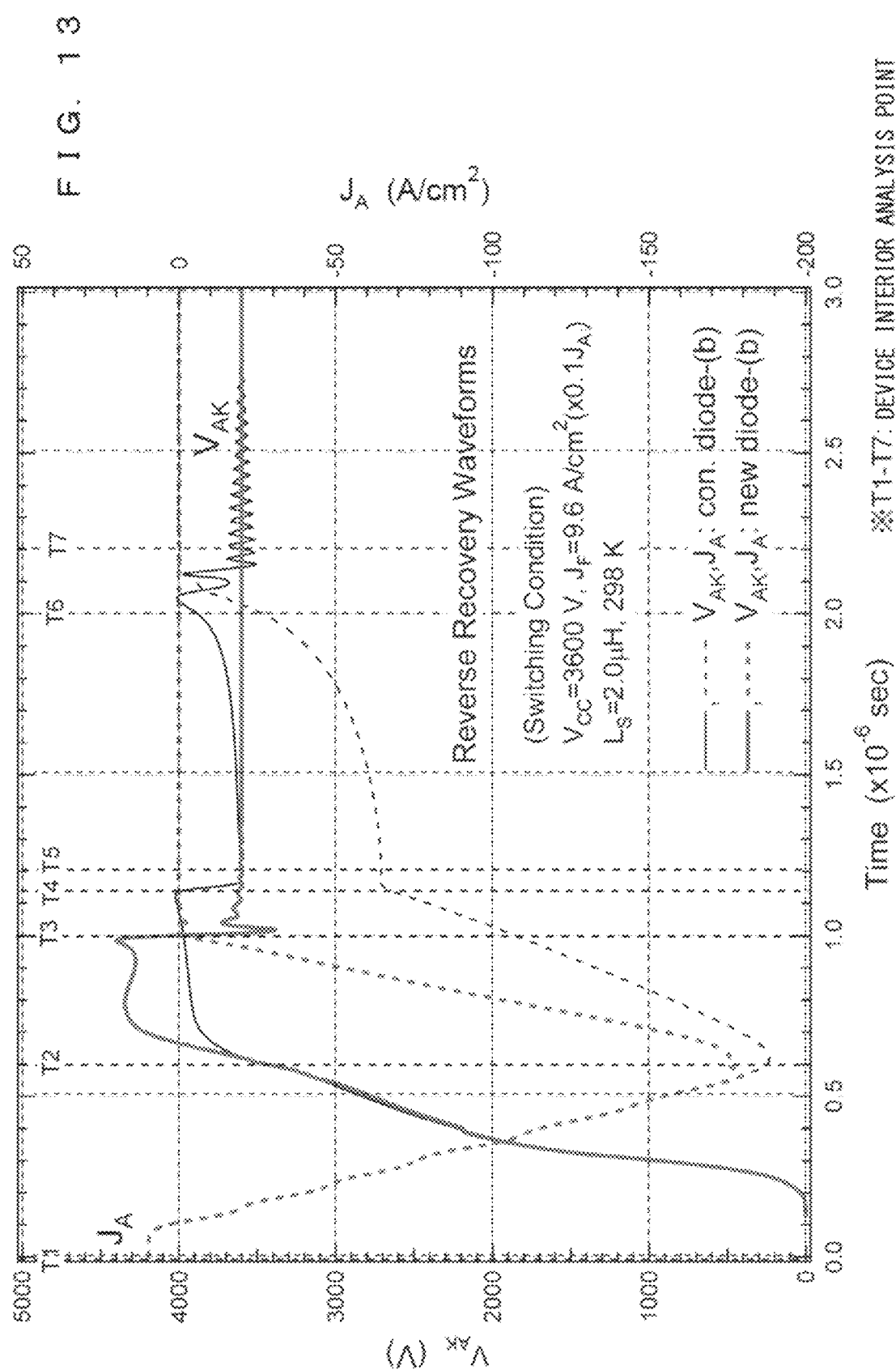
FIG. 13 shows simulation result about recovery waveforms (4.5 kV class) observed during snappy recovery operations in the conventional structure RFC diode and new structure RFC diode.
Figure 14:
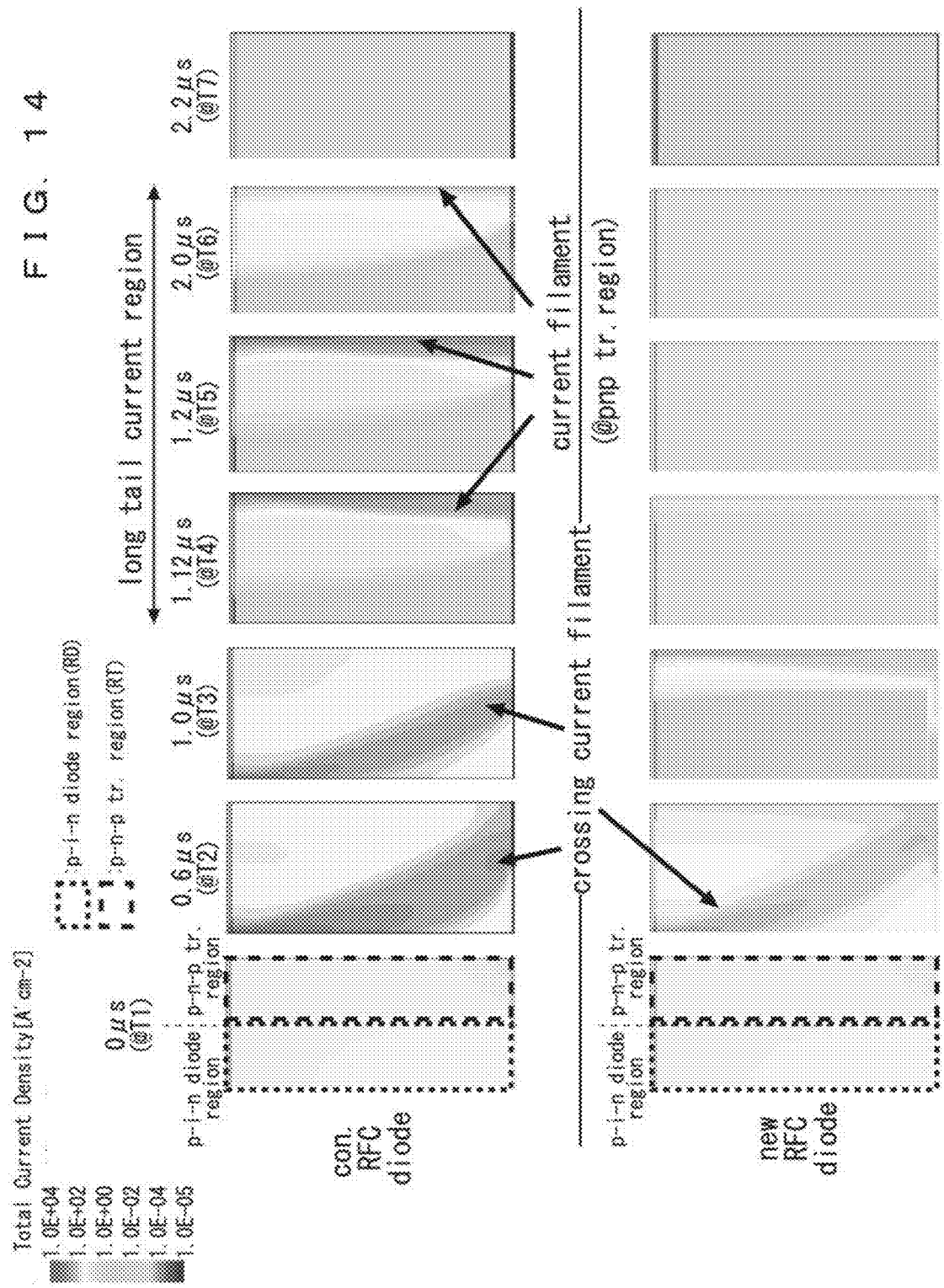
FIG. 14 shows current density distributions in the conventional structure RFC diode and new structure RFC diode observed at analysis points T1 to T7 of FIG. 13.

FIG. 13 shows simulation result about recovery waveforms observed during snappy recovery operations in the 4.5 kV class conventional structure RFC diode and new structure RFC diode. FIG. 14 shows device interior states (current density distributions) in the conventional structure RFC diode and new structure RFC diode observed at analysis points T1 to T7 of FIG. 13.

Figure 17:
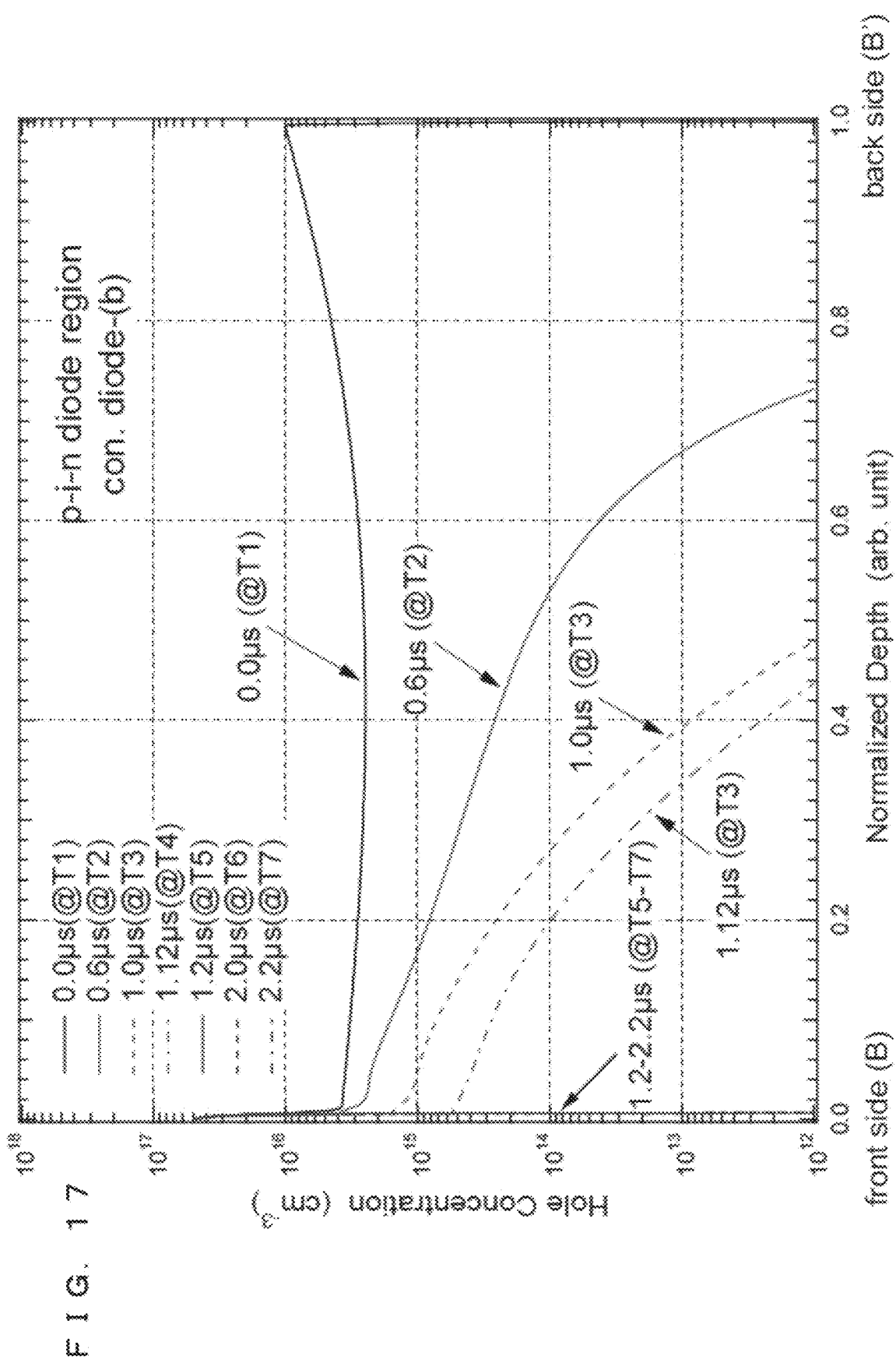
FIG. 17 shows a hole concentration distribution observed at the analysis points T1 to T7 of FIG. 13 in the PiN diode region of the conventional structure RFC diode.
Figure 19:
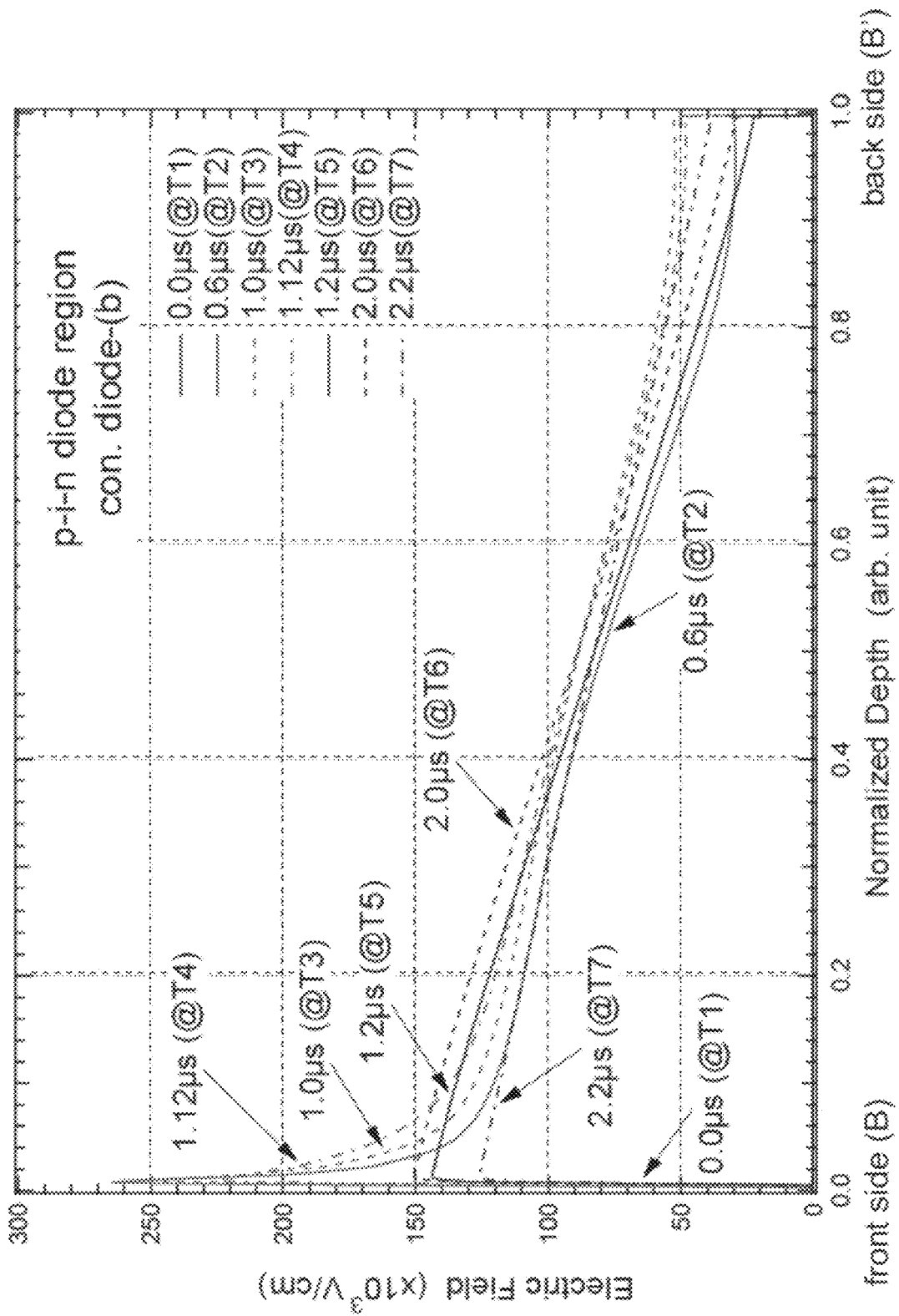
FIG. 19 shows an electric field intensity distribution observed at the analysis points T1 to T7 of FIG. 13 in the PiN diode region of the conventional structure RFC diode.
Figure 20:
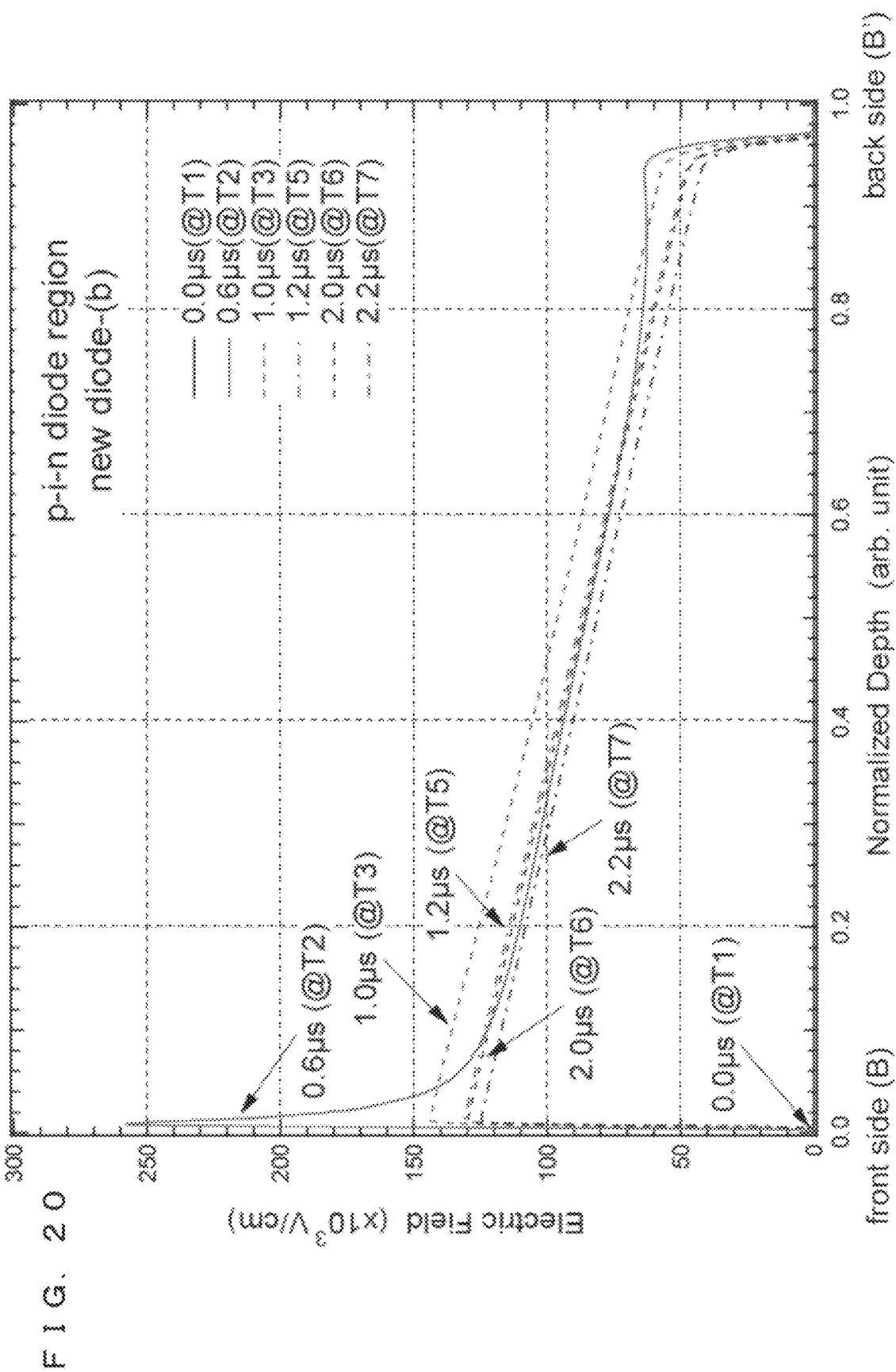
FIG. 20 shows an electric field intensity distribution observed at the analysis points T1 to T7 of FIG. 13 in the PiN diode region of the new structure RFC diode.
Figure 21:
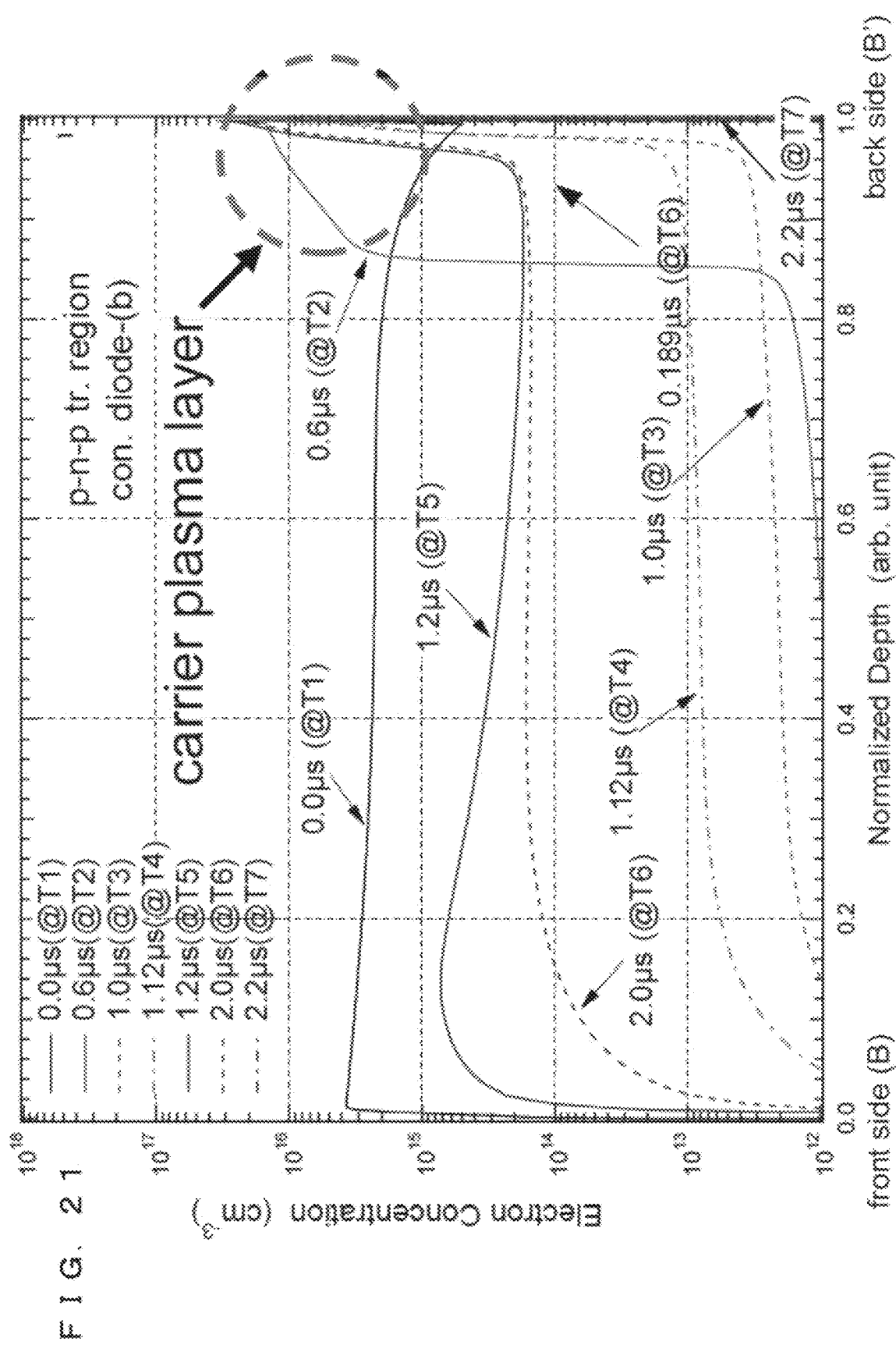
FIG. 21 shows an electron concentration distribution observed at the analysis points T1 to T7 of FIG. 13 in the PNP transistor region of the conventional structure RFC diode.
Figure 22:
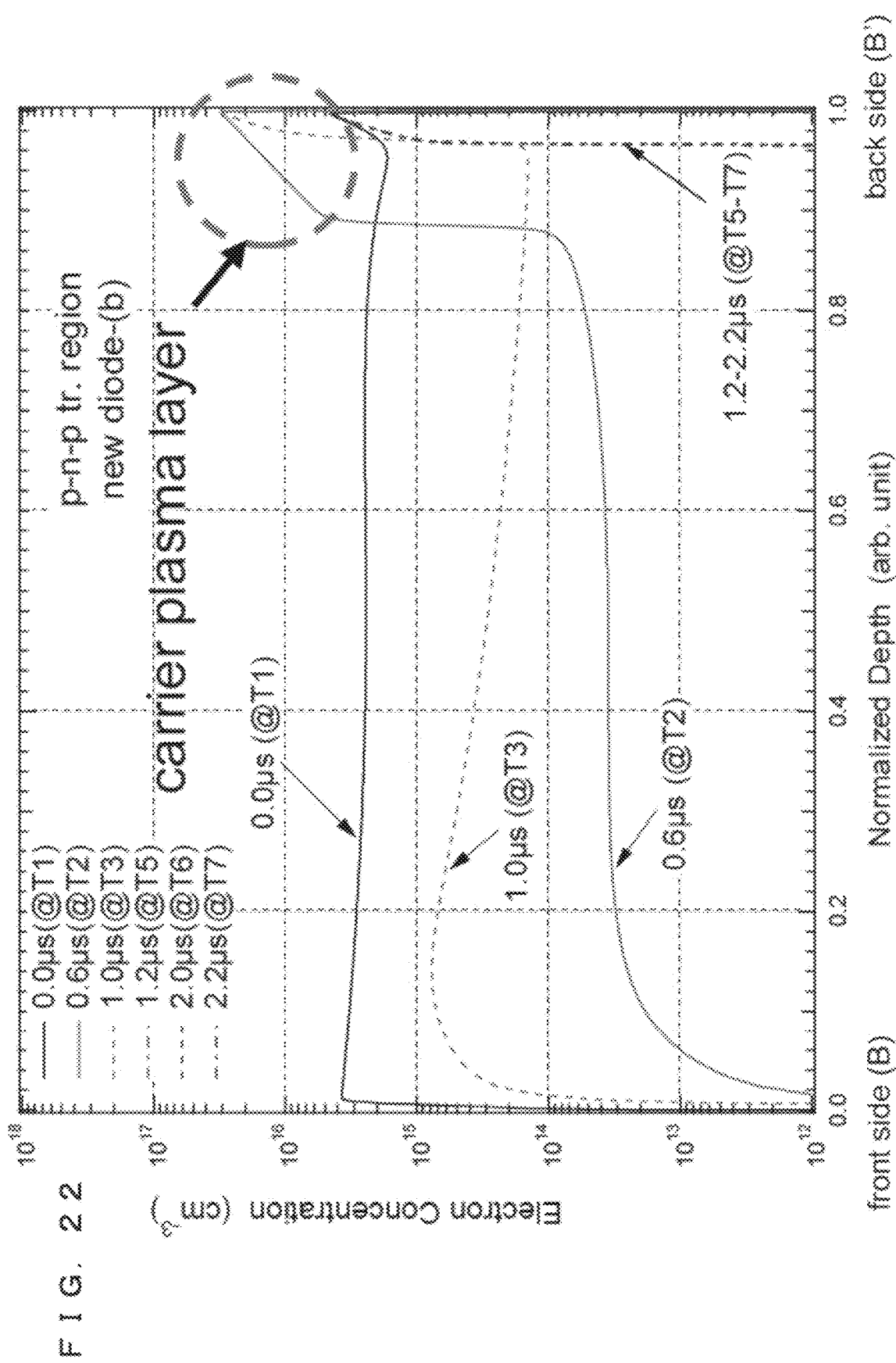
FIG. 22 shows an electron concentration distribution observed at the analysis points T1 to T7 of FIG. 13 in the PNP transistor region of the new structure RFC diode.
Figure 23:
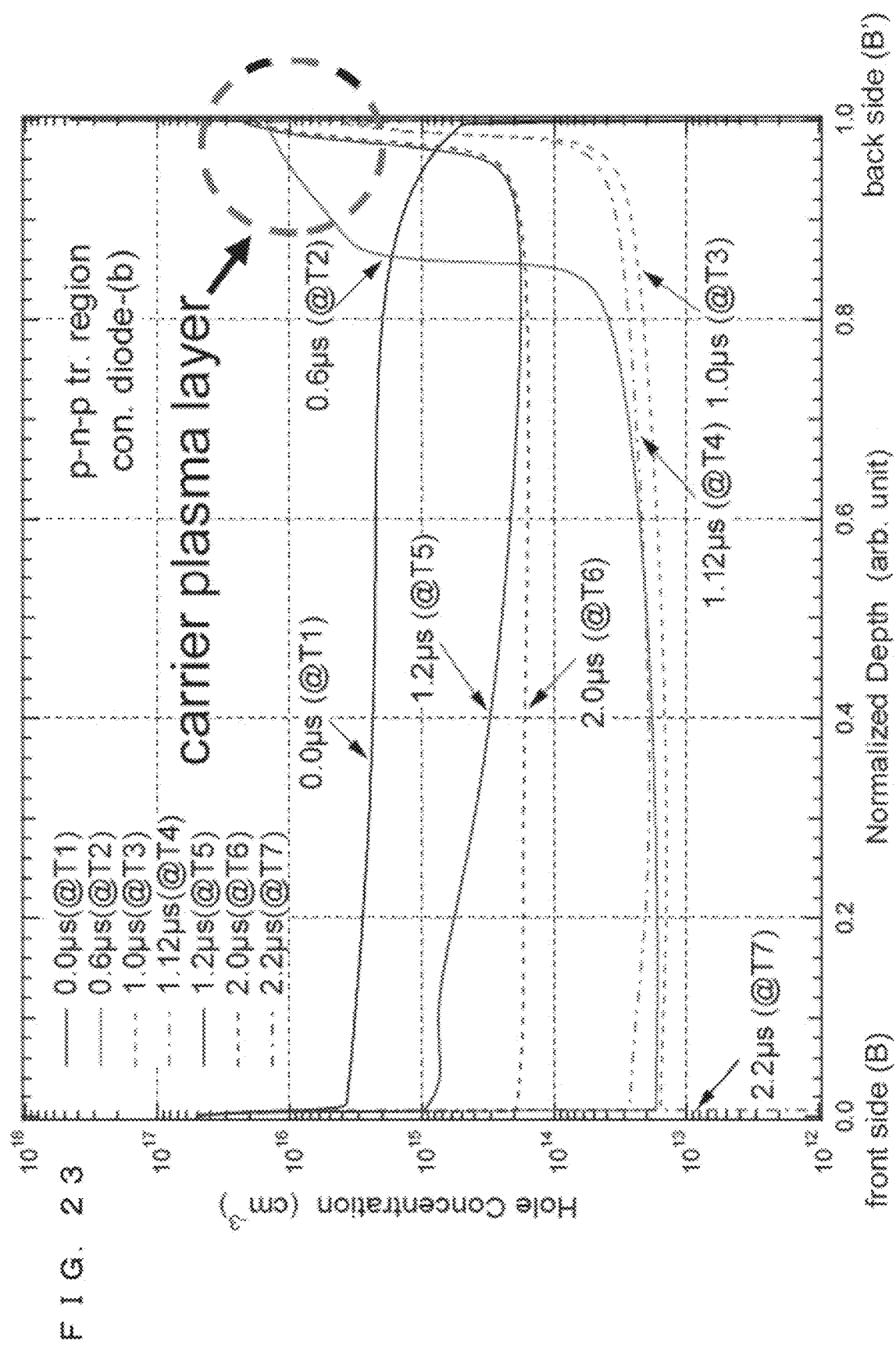
FIG. 23 shows a hole concentration distribution observed at the analysis points T1 to T7 of FIG. 13 in the PNP transistor region of the conventional structure RFC diode.
Figure 25:
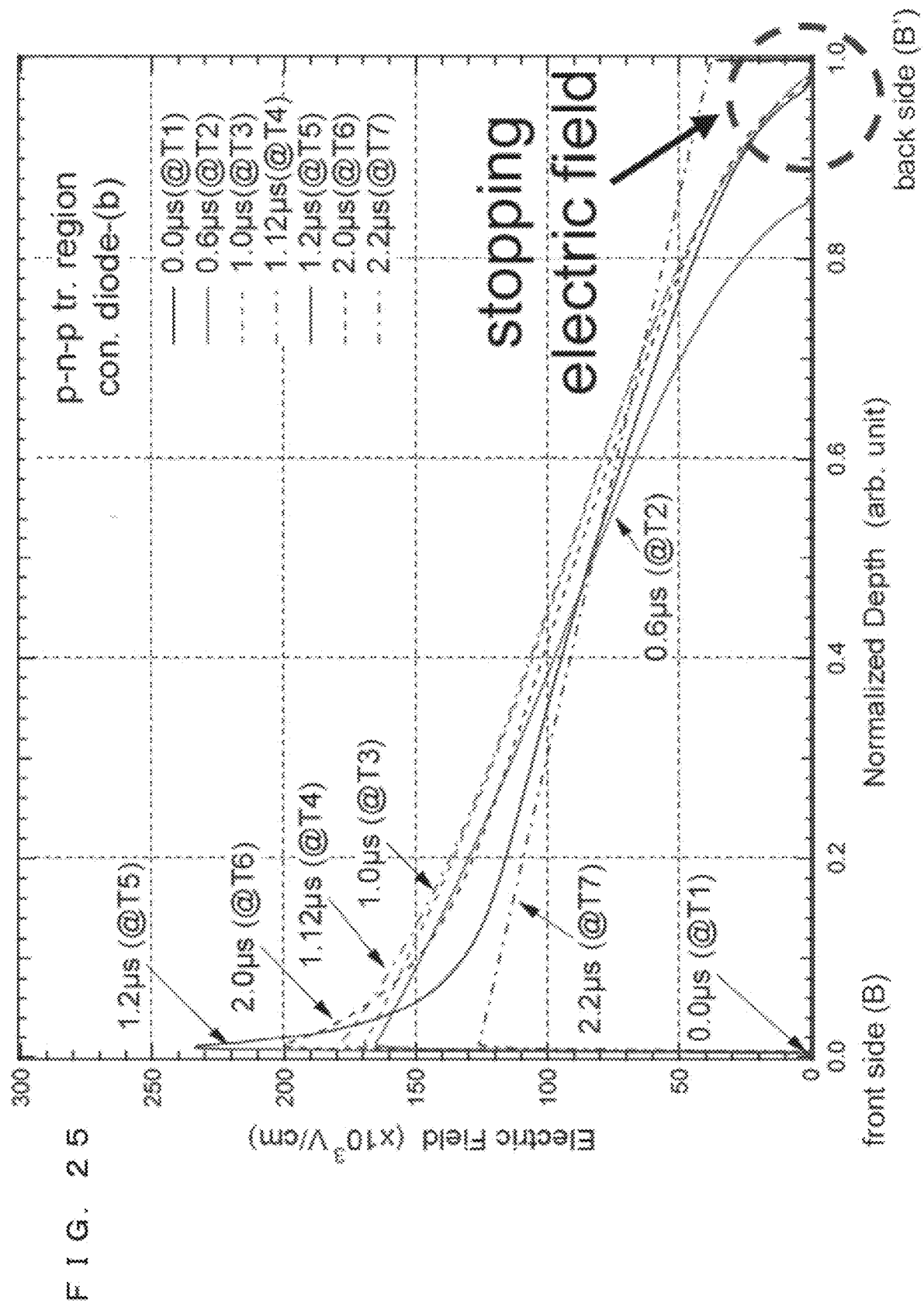
FIG. 25 shows an electric field intensity distribution observed at the analysis points T1 to T7 of FIG. 13 in the PNP transistor region of the conventional structure RFC diode.

FIGS. 15 to 26 show interior states (electron and hole concentration distributions, electric field intensity distributions) in the PiN diode region R21 and the PNP transistor region R22 of the RFC diode observed at the analysis points T1 to T7 of FIG. 13. Specifically, FIG. 15 shows an electron concentration distribution observed in the PiN diode region R21 of the conventional structure RFC diode. FIG. 16 shows an electron concentration distribution observed in the PiN diode region R21 of the new structure RFC diode. FIG. 17 shows a hole concentration distribution observed in the PiN diode region R21 of the conventional structure RFC diode. FIG. 18 shows a hole concentration distribution observed in the PiN diode region R21 of the new structure RFC diode. FIG. 19 shows an electric field intensity distribution observed in the PiN diode region R21 of the conventional structure RFC diode. FIG. 20 shows an electric field intensity distribution observed in the PiN diode region R21 of the new structure RFC diode. FIG. 21 shows an electron concentration distribution observed in the PNP transistor region R22 of the conventional structure RFC diode. FIG. 22 shows an electron concentration distribution observed in the PNP transistor region R22 of the new structure RFC diode. FIG. 23 shows a hole concentration distribution observed in the PNP transistor region R22 of the conventional structure RFC diode. FIG. 24 shows a hole concentration distribution observed in the PNP transistor region R22 of the new structure RFC diode. FIG. 25 shows an electric field intensity distribution observed in the PNP transistor region R22 of the conventional structure RFC diode. FIG. 26 shows an electric field intensity distribution observed in the PNP transistor region R22 of the new structure RFC diode. Numerical values on the horizontal axis of each graph in each drawing are obtained by normalizing a device thickness using the thickness ($t_{device}$) of the device.

As understood from FIG. 13, in the conventional structure RFC diode, a huge tail current is generated in the latter half of the recovery operation. As shown in FIGS. 15 to 26, the conventional structure RFC diode is considered to lead to destruction of the device after generating the tail current at the latter half of the recovery operation according to the following steps.

In a first step, as a result of a difference in controlled operating time between the PiN diode region R21 and the PNP transistor region R22, an operation mode of rate-controlling operation in the PNP transistor region R22 is determined from a moment after a $J_{RR}$ point (T2 in FIG. 13) when operation in the PiN diode region R21 converges. In a subsequent second step, a carrier concentration is increased on the cathode side for encouraging hole injection. While electric field on the cathode side is relaxed, electric field intensity is increased at the main junction between the P anode layer 10 and the N⁻ drift layer 14 to encourage impact ionization. Then, in a third step, electrons resulting from the impact ionization encouraged at the main junction are injected into the N⁻ drift layer 14 to cause increase in a base current in the PNP transistor region R22, thereby causing a huge tail current on a recovery waveform. Finally, in a fourth step, the huge tail current is caused and at the same time, a PNP transistor starts to operate. This makes the recovery operation uncontrollable, resulting in destruction of the device.

In the new structure RFC diode including the N buffer layer 15 with lattice defect present in the second buffer layer 15-2, the foregoing mode in the third step is not generated to make the recovery operation controllable. The reason for this is that, in the new structure RFC diode, a carrier plasma layer existing on the cathode side vanishes in response to encouragement of carrier recombination by the lattice defect in the second buffer layer 15-2. This suppresses increase in electric field intensity at the main junction between the P anode layer 10 and the N⁻ drift layer 14 to cause extension of a depletion layer toward the cathode side.

As a result, in the new structure RFC diode, operation in the PNP transistor region R22 is minimized as understood from the current density distribution shown in FIG. 14. This shortens a period when a current filament phenomenon occurs at the device interior analysis point T2 in such a manner as to extend over the PIN diode region R21 and the PNP transistor region R22. This allows the new structure RFC diode to finish its recovery operation while the tail current is suppressed, as shown in FIG. 13. As a result, in the new structure RFC diode, a huge tail current is not generated during recovery operation in a snappy mode to allow expansion of a safe operating temperature range in which recovery operation is guaranteed. This effect is achieved by the presence of lattice defect in the second buffer layer 15-2 of the new structure N buffer layer 15.

Figure 27:
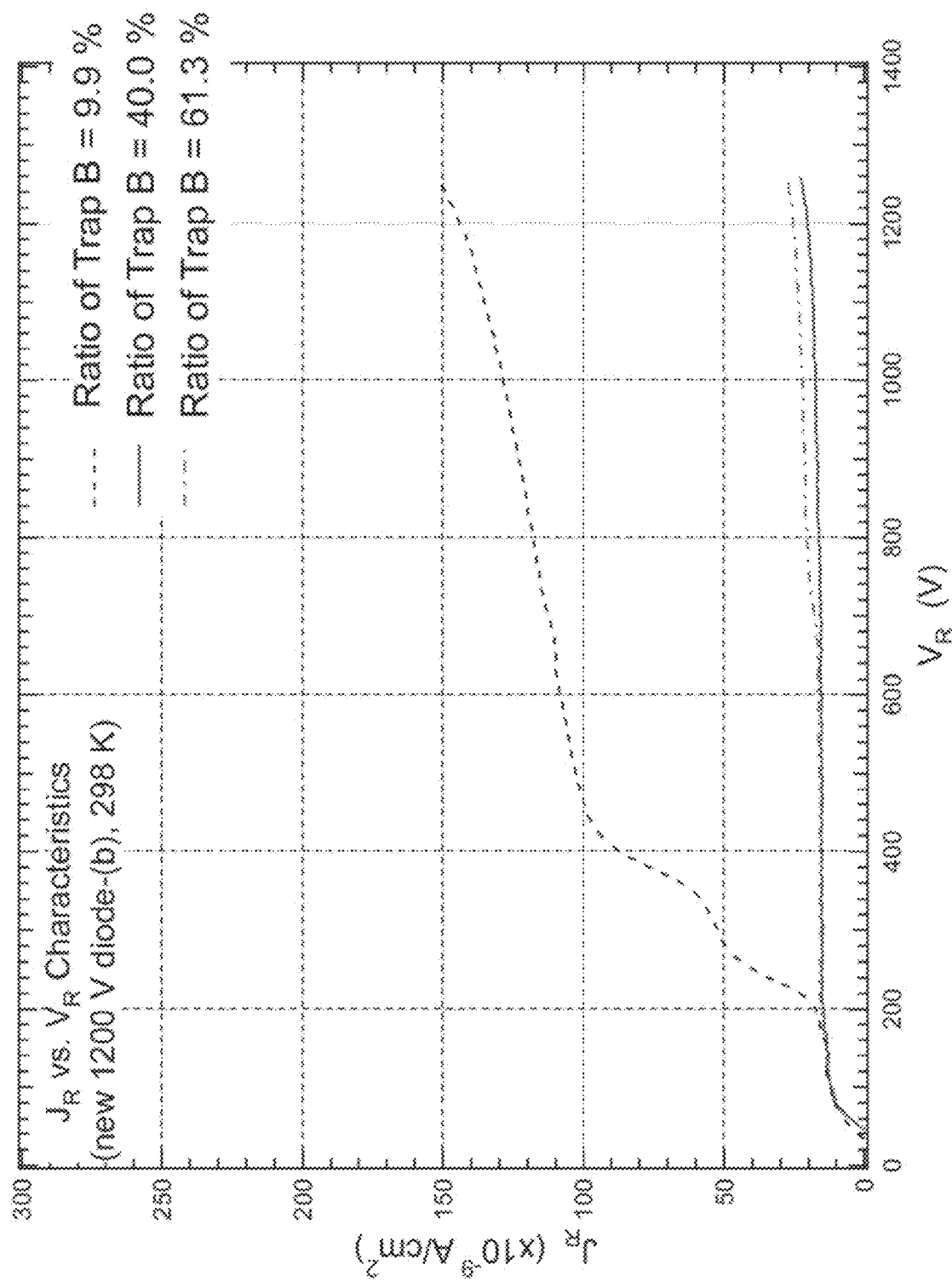
FIG. 27 shows the dependence of $J_R$-$V_R$ characteristics on a Trap B ratio observed at 298 K in a prototyped 1200 V class new structure RFC diode.

FIG. 27 shows $J_R$-$V_R$ characteristics at 298 K observed in a prototyped 1200 V class new structure RFC diode having various Trap B ratios. Here, $J_R$ is leakage current density (A/cm²) and $V_R$ is a reverse bias voltage (V). It is seen that the $J_R$-$V_R$ characteristics of the diode are influenced by a Trap B ratio, and a low Trap B ratio causes increase in leakage current ($J_R$) with $V_R$ of equal to or greater than 200 V, thereby degrading the $J_R$-$V_R$ characteristics. Namely, a low Trap B ratio reduces voltage retaining capability as the fundamental performance of power semiconductor.

Figure 28:
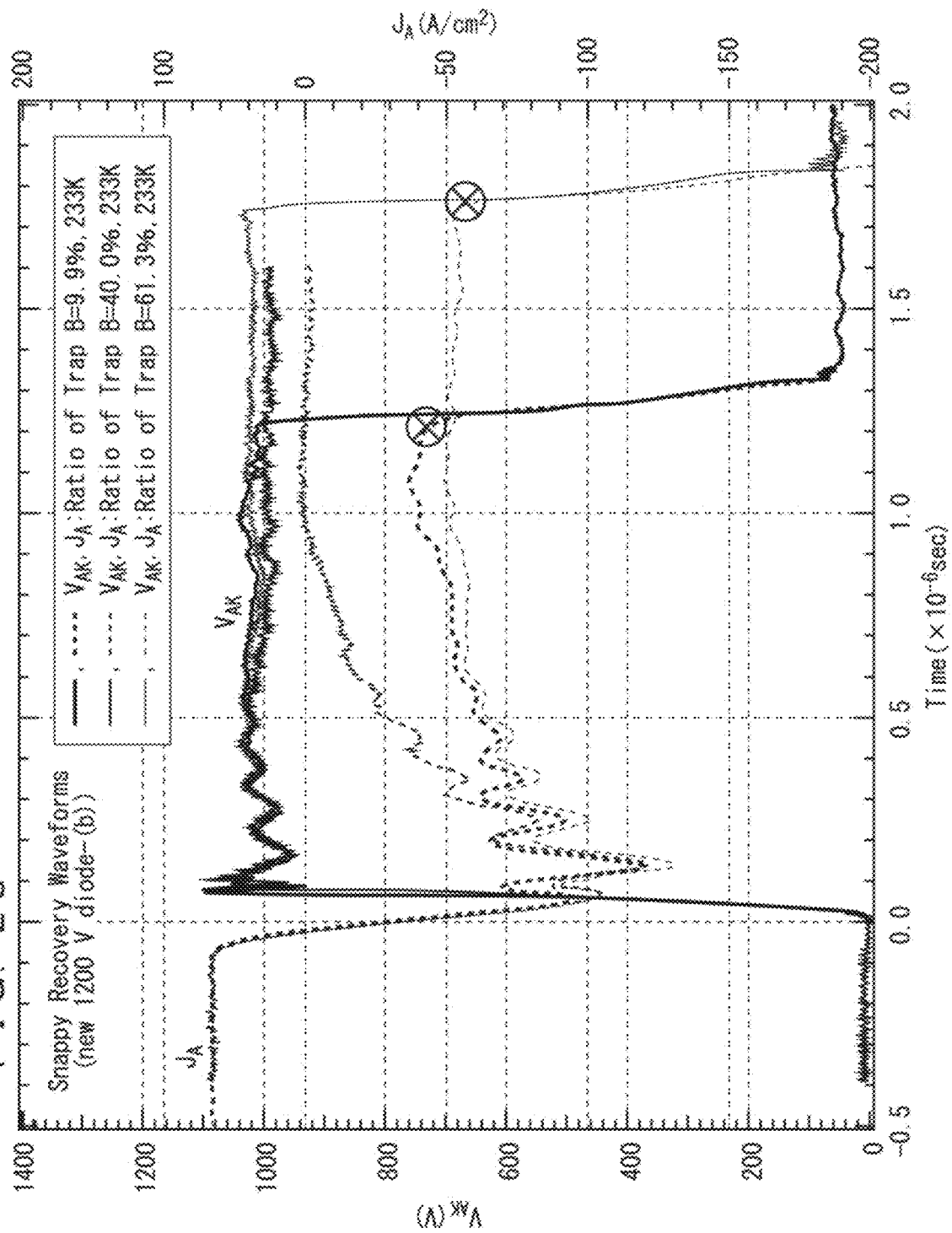
FIG. 28 shows the dependence of a snappy recovery waveform on a Trap B ratio observed at low temperature in the prototyped 1200 V class new structure RFC diode.

FIG. 28 shows snappy recovery waveforms at low temperature observed in the prototyped 1200 V class new structure RFC diode having various Trap B ratios. In the new structure RFC diode, lattice defect in the second buffer layer 15-2 is controlled to provide a Trap B ratio of 40%. By doing so, even at a low temperature state of 233 K, it still becomes possible to cut off recovery operation without increasing a tail current in the latter half of the recovery operation and without increasing a reverse recovery charge amount ($Q_{RR}$).

FIG. 29 is a list showing a summarized relationship between the device performance of the 1200 V class new structure RFC diode and a Trap B ratio. As understood from FIG. 29, in the diode with the new structure N buffer layer 15, controlling lattice defect in the second buffer layer 15-2 forming the N buffer layer 15 and including the lattice defect allows improvement of diode performance.

Figure 30:
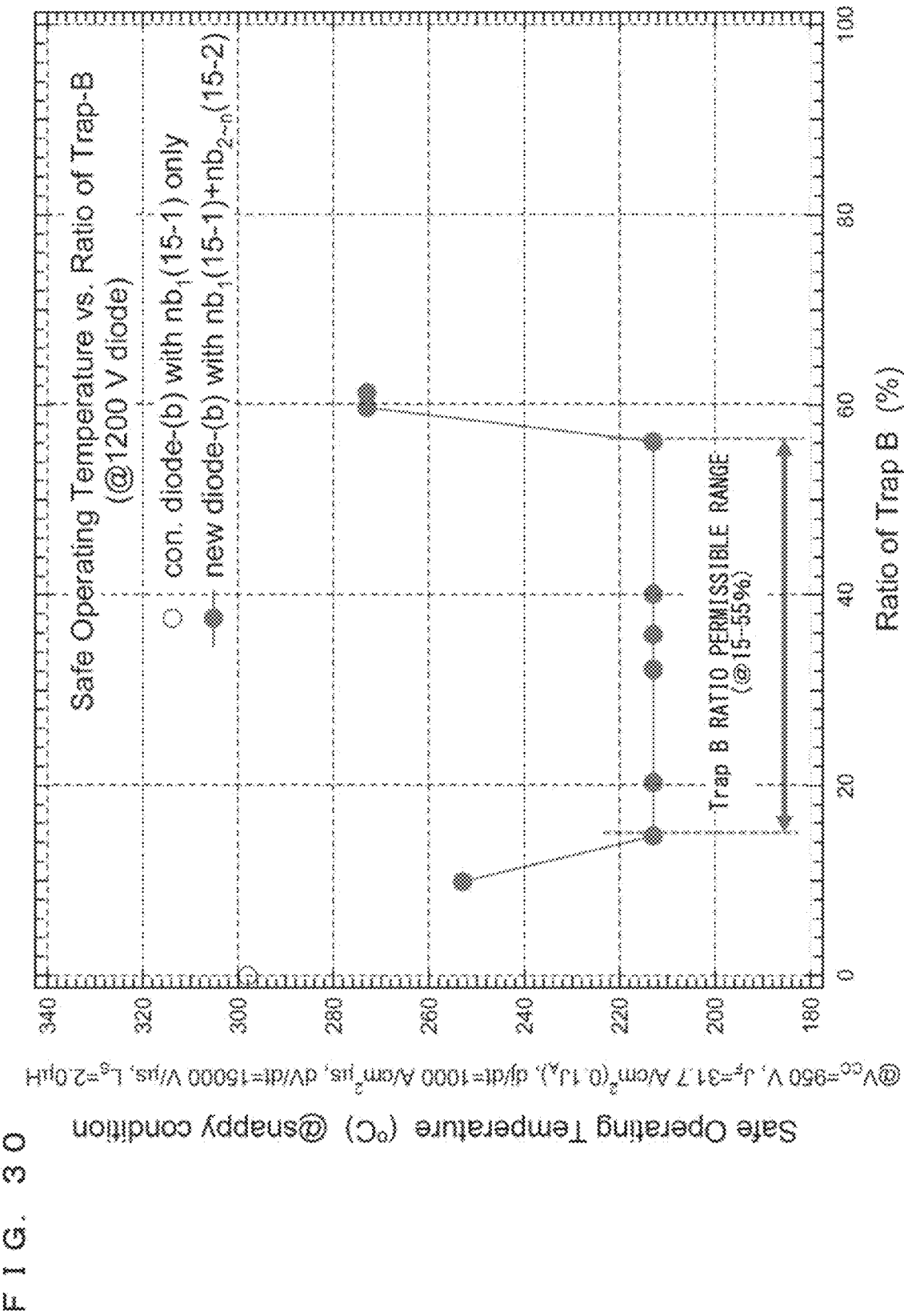
FIG. 30 shows a relationship between a safe operating temperature range and a Trap B ratio in a snappy mode observed in the 1200 V class new structure RFC diode.

FIG. 30 shows a relationship between a safe operating temperature range and a Trap B ratio during snappy recovery operation of the 1200 V class new structure RFC diode. On the basis of FIGS. 13 and 26, the new structure RFC diode is assumed to expand a safe operating temperature range in which snappy recovery operation is guaranteed. As understood from FIG. 30, by controlling Trap B to a range from 15 to 55% in lattice defect in the second buffer layer 15-2, a tail current increased region resulting from reduction in $Q_{RR}$ in the latter half of the recovery operation is not caused as shown in FIG. 28, as will be described later. This achieves cutoff of the recovery operation even at a low temperature state of 213 K to allow expansion of an operating temperature range toward a lower temperature side.

The following shows result of verification of device performance about the new structure RFC diode in which Trap B in lattice defect in the second buffer layer 15-2 is controlled within a range from 15 to 55%. In this prototyped RFC, the intermediate region R2 and the edge termination region R3 also have the respective structures shown in FIG. 3. The structure of the N buffer layer 15 in the intermediate region R2 and the edge termination region R3 is the same as that in the active cell region R1.

Figure 31:
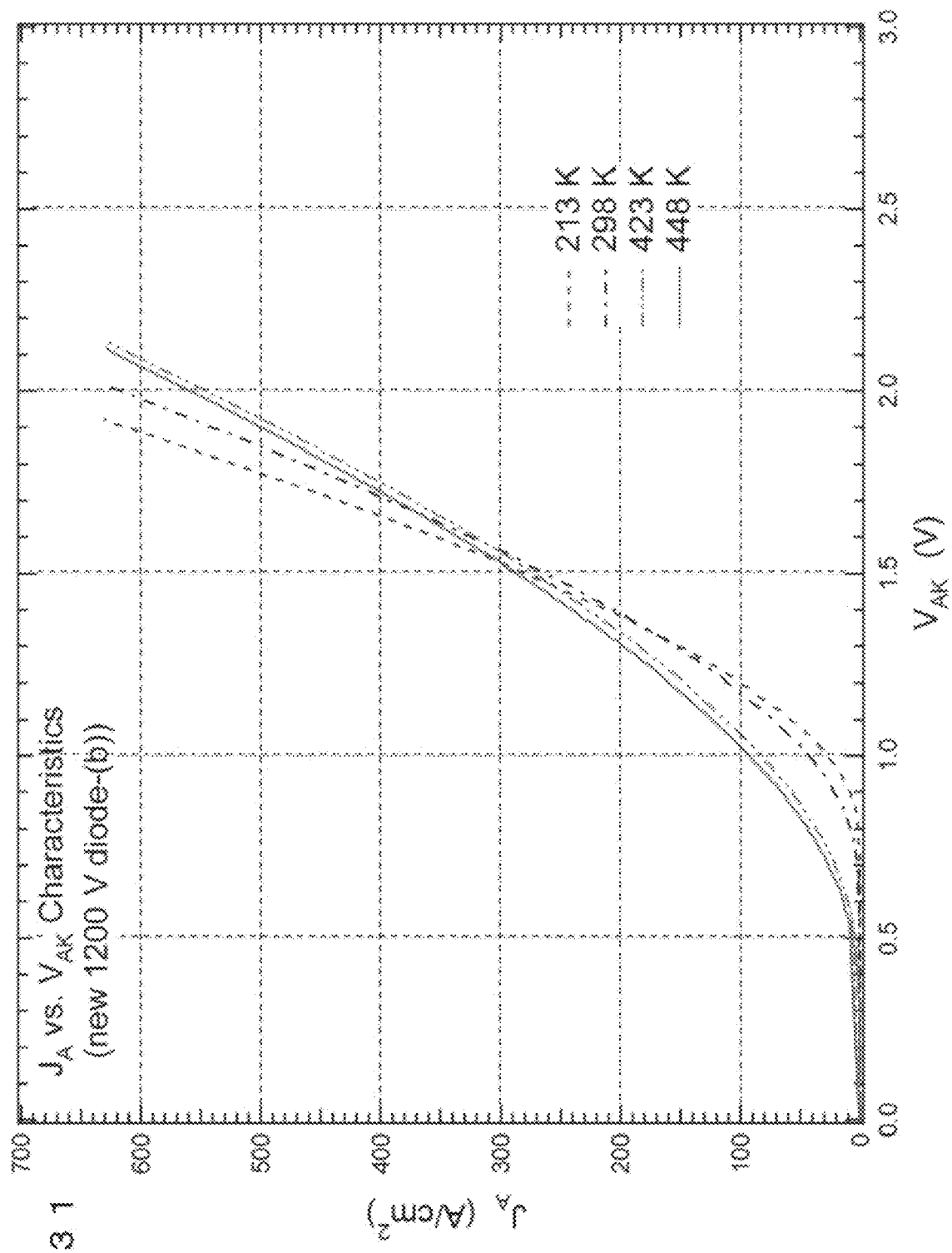
FIG. 31 shows the dependence of the output characteristics of the prototyped 1200 V class new structure RFC diode on an operating temperature.

FIG. 31 shows the dependence of the output characteristics of the prototyped 1200 V class new structure RFC diode on an operating temperature. In the new structure RFC diode, while the N buffer layer 15 includes the second buffer layer 15-2 with lattice defect, satisfying the relationship between carrier lifetimes described above stabilizes $\gamma_{n,\ active}$. This prevents the occurrence of a snap-back phenomenon even at a low temperature state of 213 K, making it possible to guarantee normal on operation.

In a power module, a large number of power semiconductor elements are required to operate in parallel. In the new structure RFC diode, a voltage ($V_F$) around rated current density exhibits positive temperature dependence from 213 to 423 K (behavior of increasing $V_F$ with temperature increase). This is effective performance in terms of current distribution in causing a large number of new structure RFC diodes to operate in parallel.

Figure 32:
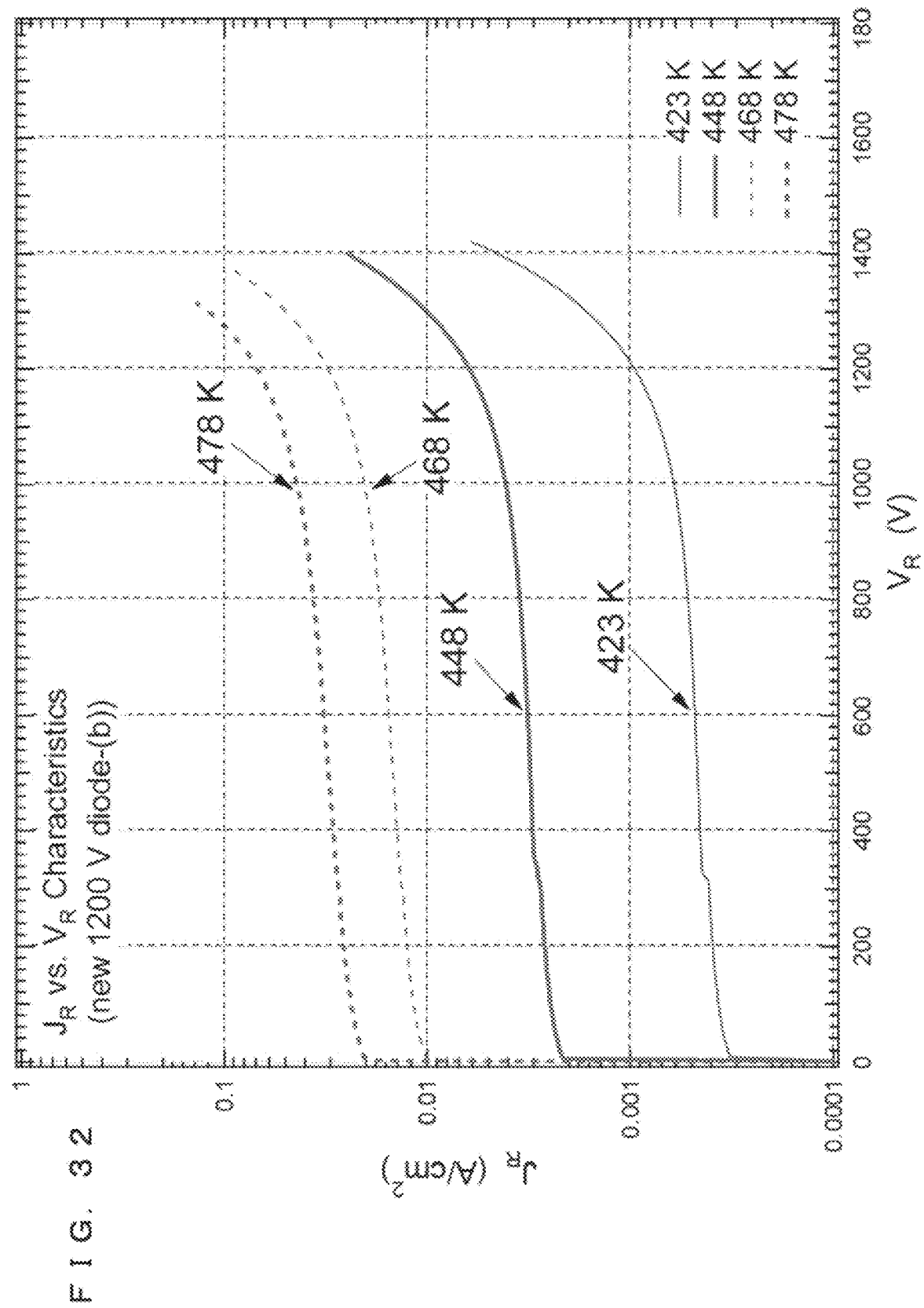
FIG. 32 shows the dependence of the $J_R$-$V_R$ characteristics of the prototyped 1200 V class new structure RFC diode on an operating temperature.

FIG. 32 shows the dependence of the $J_R$-$V_R$ characteristics of the prototyped 1200 V class new structure RFC diode on an operating temperature. In the new structure RFC diode, while the N buffer layer 15 includes the second buffer layer 15-2 with lattice defect, satisfying the relationship between carrier lifetimes described above prevents thermal runway even at a high temperature of 478K to achieve both low off-loss performance and high voltage retaining capability.

FIG. 33 shows recovery waveforms in a prototyped 1200 V class conventional structure RFC diode and the prototyped 1200 V class new structure RFC diode observed at 298K. The conventional structure RFC diode and the new structure RFC diode shown in FIG. 33 have the same thickness ($t_{device}$) and the same impurity concentration ($C_{n^-}$) in the N⁻ drift layer 14. As compared with the conventional structure RFC diode, the new structure RFC diode suppresses a snap-off phenomenon and a subsequent oscillation phenomenon at the end of recovery operation to exhibit excellent behavior of soft recovery.

FIG. 34 shows recovery waveforms in a snappy mode observed at a low temperature (253 K) in the 1200 V class conventional structure RFC diode and new structure RFC diode. As compared with the conventional structure RFC diode, the new structure RFC diode suppresses a huge tail current even in a snappy mode to achieve cutoff even under a strict recovery condition.

Figure 36:
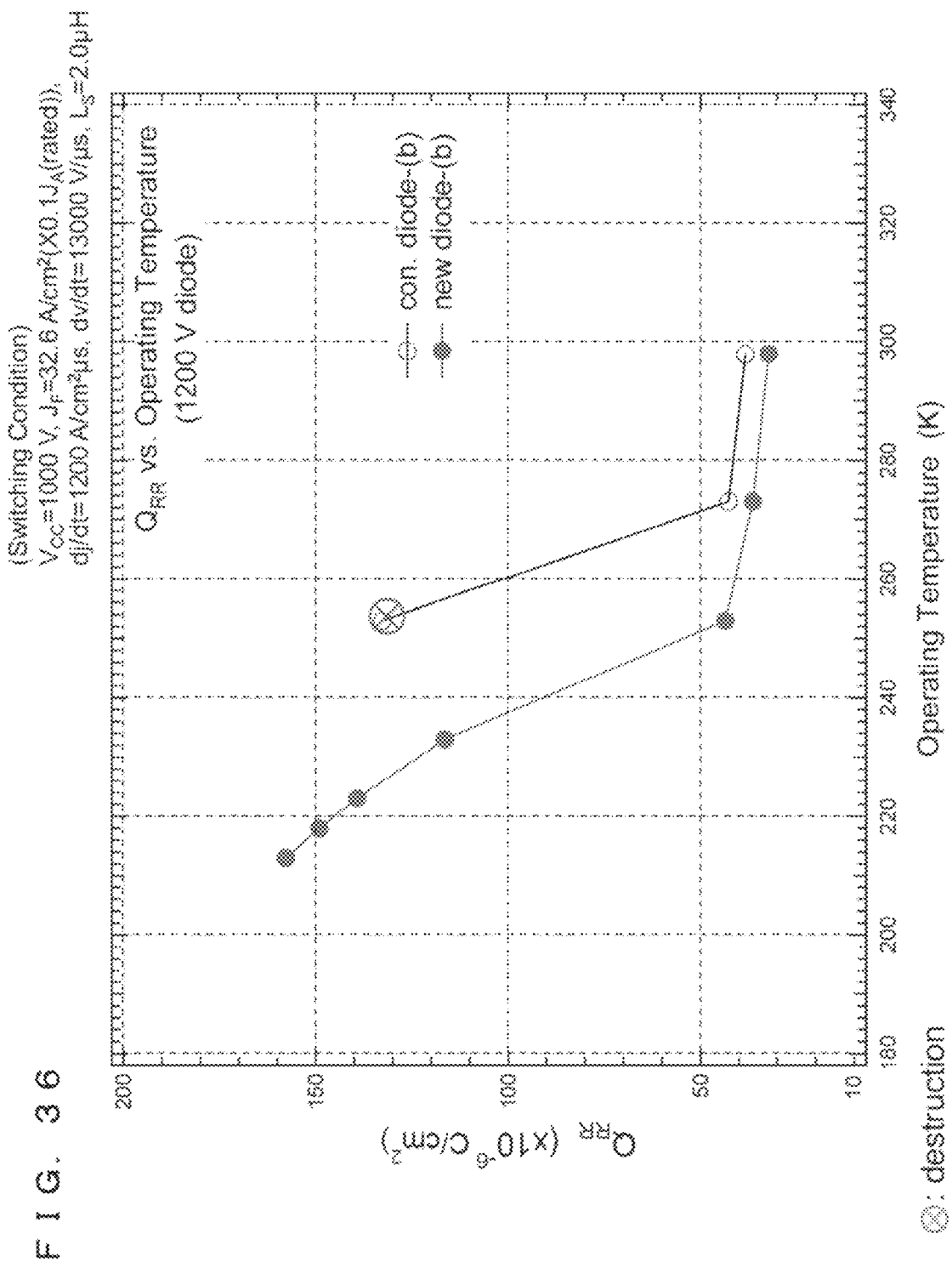
FIG. 36 shows relationships between an operating temperature and a reverse recovery charge amount observed at a power source voltage of 1000 V in the prototyped 1200 V class conventional structure RFC diode and new structure RFC diode.

FIGS. 35 and 36 show relationships between a reverse recovery charge amount ($Q_{RR}$), a power source voltage ($V_{CC}$), and an operating temperature in respective recovery operations with attention focused on a destruction phenomenon due to the huge tail current shown in FIG. 34. FIG. 35 shows relationships between a power source voltage and a reverse recovery charge amount observed at 253 K in the prototyped 1200 V class conventional structure RFC diode and new structure RFC diode. FIG. 36 shows relationships between an operating temperature and a reverse recovery charge amount observed at a power source voltage of 1000 V in these conventional structure RFC diode and new structure RFC diode.

As understood from FIGS. 35 and 36, as compared with the conventional structure RFC diode, in the new structure RFC diode, the dependence of $Q_{RR}$ on $V_{CC}$ and an operating temperature is low. It can be said that operation in the PNP transistor region R22 to cause increase in $Q_{RR}$ is suppressed to achieve excellent durability during dynamic operation of the RFC diode. This behavior results from the role of encouraging carrier recombination in the latter half of recovery operation fulfilled by lattice defect in the second buffer layer 15-2 of the new structure N buffer layer 15.

Figure 37:
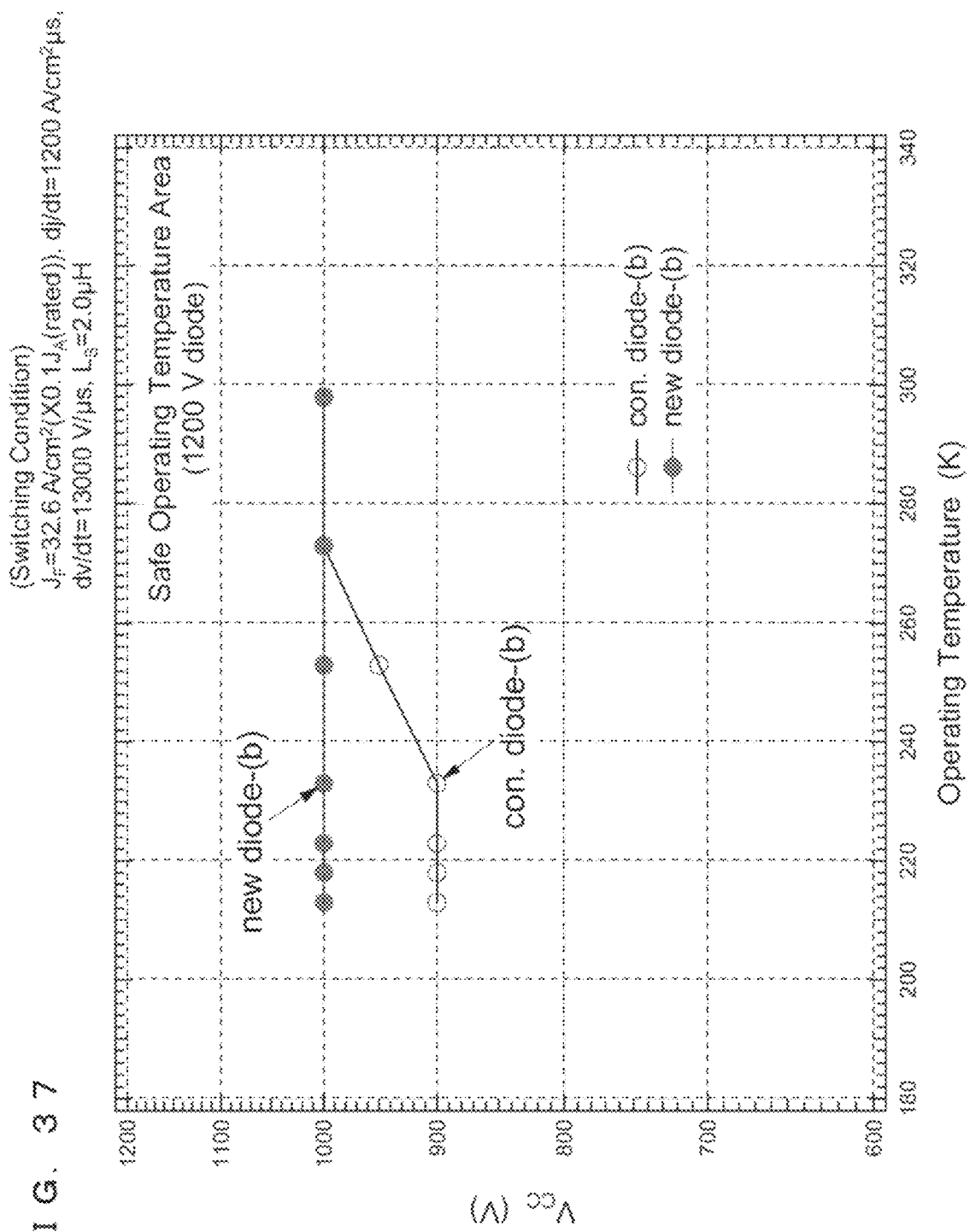
FIG. 37 shows result of comparison in a safe operating temperature area in a snappy mode at low temperature between the prototyped 1200 V class conventional structure RFC diode and new structure RFC diode.

FIG. 37 shows relationships between an operating temperature and $V_{CC}$ at low temperature allowing cutoff of snappy recovery operation observed in the prototyped 1200 V class conventional structure RFC diode and new structure RFC diode. An internal part of FIG. 37 shows data in a safe operating area (SOA). As understood from FIG. 37, the new structure RFC diode achieves the effect of expanding the safe operating area on a low temperature side of 253 K toward a higher $V_{CC}$ side.

FIG. 38 shows waveforms showing cutoff capability during recovery operation at high current density and at a high temperature (473 K) observed in the prototyped 1200 V class new structure RFC diode. As the new structure RFC diode satisfies the relationship between carrier lifetimes described above, current density (3000 A/cm$^2$) about ten times as high as rated current density is cut off even at a high temperature of 473 K, showing that the new structure RFC diode has sufficient cutoff capability.

Figure 39:
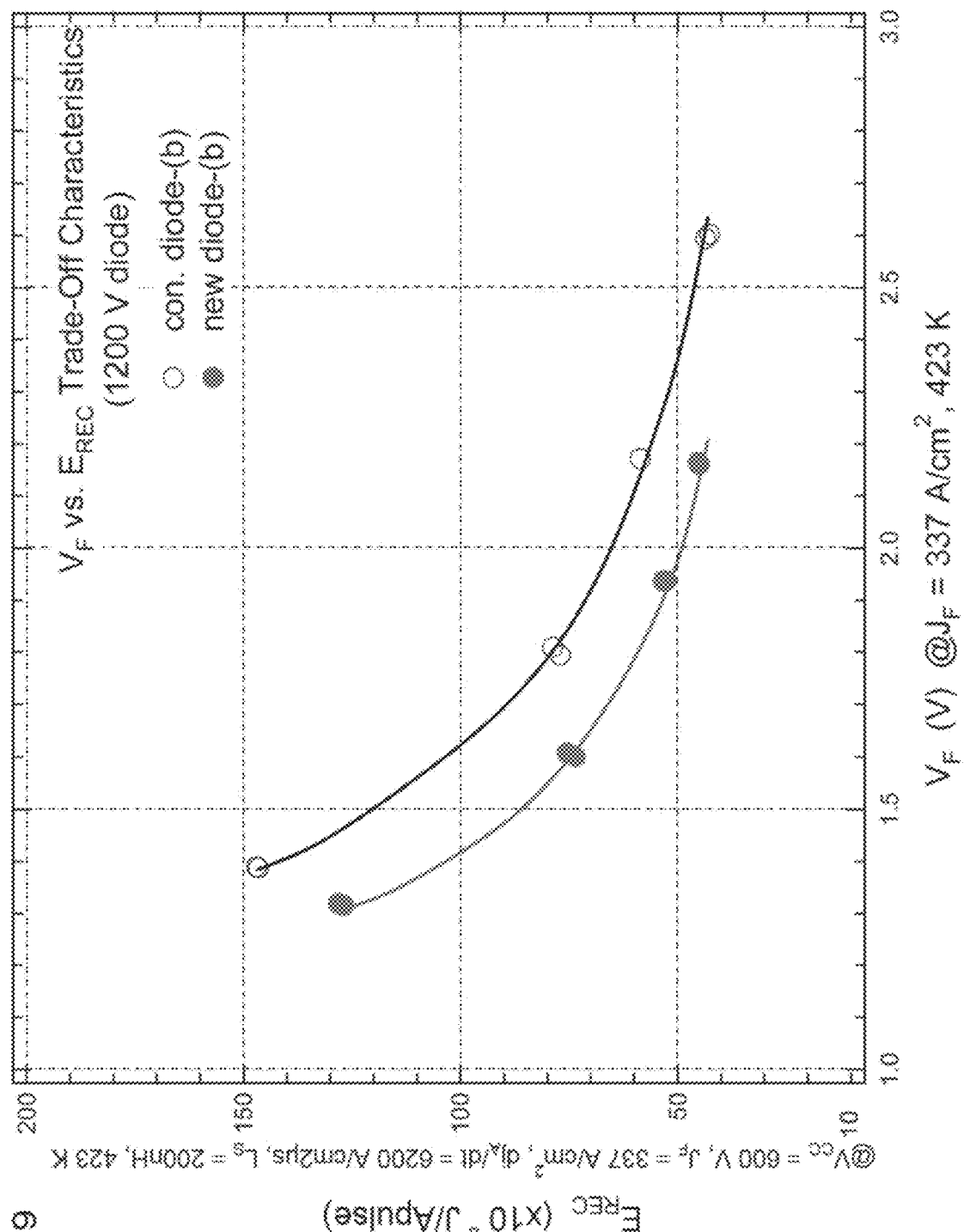
FIG. 39 shows $V_F$-$E_{REC}$ trade-off characteristics observed in the prototyped 1200 V class conventional structure RFC diode and new structure RFC diode.

FIG. 39 shows result of comparison between the prototyped 1200 V class conventional structure RFC diode and new structure RFC diode in terms of trade-off characteristics between an on voltage ($V_F$) and recovery loss ($E_{REC}$). The new structure RFC diode shrinks in the device thickness ($t_{device}$) as compared with the conventional structure RFC diode. Furthermore, as shown in FIGS. 33 to 38, the new structure RFC diode achieves reduction in total loss performance shown in FIG. 39 while improving durability during dynamic operation as shown in FIGS. 33 to 38.

As described above, while the new structure N buffer layer 15 includes the second buffer layer 15-2 with lattice defect, Trap B in the lattice defect in the second buffer layer 15-2 is controlled within a range from 15 to 55% and the foregoing relationship between carrier lifetimes is satisfied, thereby providing a thermally stable state. This allows the new structure N buffer layer 15 to guarantee normal on operation, sufficient breakdown voltage retaining capability at low off-loss not to cause thermal runway even at high temperature, high cutoff capability at high temperature, high voltage, or large current, performance of reducing total loss, operation at a high temperature of 473 K, etc. in the RFC diode. Namely, the new structure N buffer layer 15 is a technique that fulfills the objects (a) to (c) described above.

Second Preferred Embodiment

In a second preferred embodiment, the new structure N buffer layer 15 is applied to a PiN diode and it is verified that the new structure N buffer layer 15 applied in this way behaves in the same manner as in the first preferred embodiment.

Figure 40:
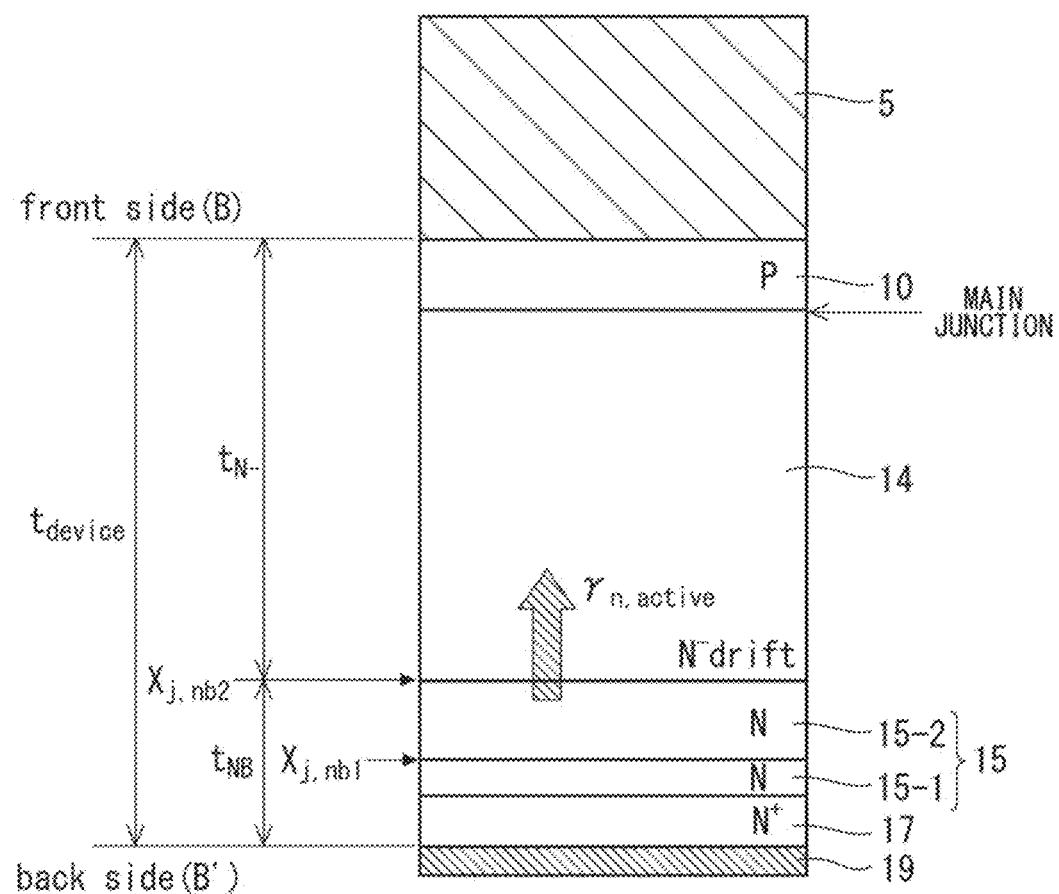
FIG. 40 is a sectional view of a PiN diode according to a second preferred embodiment.

FIG. 40 is a sectional view of a PiN diode showing a semiconductor element according to the second preferred embodiment and corresponding to a section taken along the line A1-A2 of FIG. 1. FIG. 41 is a sectional view showing an example of the structure of an outer peripheral part of a semiconductor device including the PiN diode according to the second preferred embodiment and corresponding to the section taken along the line A3-A4 of FIG. 1. The structures in FIGS. 40 and 41 include the N$^+$ cathode layer 17 as the only cathode layer as a result of deletion of the P cathode layer 18 from the structures in FIGS. 2 and 3 described in the first preferred embodiment.

As shown in FIG. 41, a structure composed of a stack of the N$^-$ drift layer 14, the N buffer layer 15, and the N$^+$ cathode layer 17 is defined in such a manner as to extend over the active cell region R1, the intermediate region R2, and the edge termination region R3. This structure corresponds to a vertical structure 35 of the PiN diode.

As shown in FIG. 40, the N buffer layer 15 of the PiN diode according to the second preferred embodiment is a new structure N buffer layer 15 including the first buffer layer 15-1 and the second buffer layer 15-2. In the following description, the PIN diode of the second preferred embodiment including the new structure N buffer layer 15 may be called a "new structure PiN diode," and a conventional PiN diode including the conventional structure N buffer layer 15 may be called a "conventional structure PIN diode."

With carrier lifetime in the first buffer layer 15-1 expressed as $\tau_{15a}$, carrier lifetime in the second buffer layer 15-2 as $\tau_{15b}$, carrier lifetime in the N$^-$ drift layer 14 as $\tau_{14}$, and carrier lifetime in the N$^+$ cathode layer 17 as $\tau_{17}$, the relationship of $\tau_{15b} < \tau_{17} \approx \tau_{15a} \approx \tau_{14}$ is established in the PiN diode of the second preferred embodiment (the detail of which will be described in a fourth preferred embodiment).

The following describes how the PiN diode according to the second preferred embodiment also allows suppression of a snap-off phenomenon and a subsequent oscillation phenomenon during recovery operation, and improvement of destruction tolerance during the recovery operation. Result of the verification given herein is obtained using a 4.5 kV PiN diode. Like in the first preferred embodiment, in the new structure PiN diode described by referring to FIGS. 42 to 44, Trap B in lattice defect in the second buffer layer 15-2 is controlled within a range from 15 to 55%. The intermediate region R2 and the edge termination region R3 in the prototyped PiN diode have the respective structures shown in FIG. 41. The structure of the N buffer layer 15 in the intermediate region R2 and the edge termination region R3 is the same as that in the active cell region R1.

In the PiN diode according to the second preferred embodiment, parameters for diffusion layers other than the N buffer layer 15 are set as follows. The N$^-$ drift layer 14 is formed using an Si wafer (FZ wafer) prepared by the FZ method having an impurity concentration ($C_{n-}$) from $1.0 \times 10^{12}$ to $5.0 \times 10^{14}$ cm$^{-3}$. A final device thickness ($t_{device}$) is from 40 to 700 μm. The P anode layer 10 is set at a surface impurity concentration of equal to or greater than $1.0 \times 10^{16}$ cm$^{-3}$, a peak impurity concentration from $2.0 \times 10^{16}$ to $1.0 \times 10^{18}$ cm$^{-3}$, and a depth from 2.0 to 10.0 μm. The N$^+$ cathode layer 17 is set at a surface impurity concentration from $1.0 \times 10^{18}$ to $1.0 \times 10^{21}$ cm$^{-3}$ and a depth from 0.3 to 0.8 μm. Parameters for the N buffer layer 15 (first buffer layer 15-1 and second buffer layer 15-2) may be the same as those in the first preferred embodiment.

FIG. 42 shows waveforms observed during snappy recovery operations in a 4.5 kV class conventional structure PiN diode and in a 4.5 kV class new structure PiN diode at 298 K. As compared with the RFC diode, a remaining carrier plasma layer is more likely to be exhausted on the cathode side in the latter half of the recovery operation. This reduces the effect of suppressing a snap-off phenomenon during the recovery operation. For this reason, in FIG. 42, a snap-off phenomenon is caused in the conventional structure PiN diode to cause destruction of the device thereafter.

By contrast, in the new structure PiN diode, a remaining carrier plasma layer around the junction between the N⁻ drift layer 14 and the N buffer layer 15 exerts influence to cause a depletion layer from the main junction to extend at a lower speed in the second buffer layer 15-2 during the recovery operation. Thus, even on the occurrence of a snap-off phenomenon, a snap-off voltage is still controlled at a low level. Specifically, in the new structure PiN diode, a carrier plasma layer exists in the second buffer layer 15-2 from an on state, like the region indicated by a circle 1 with an arrow in each of FIGS. 4 and 6. Thus, by the presence of the remaining carrier plasma layer in the second buffer layer 15-2 that is a point of the occurrence of a snap-off phenomenon in the conventional structure PiN diode, an electric field intensity distribution is controlled. This achieves the effect of delaying the point of the occurrence of a snap-off phenomenon and preventing destruction of the device.

Figure 43:
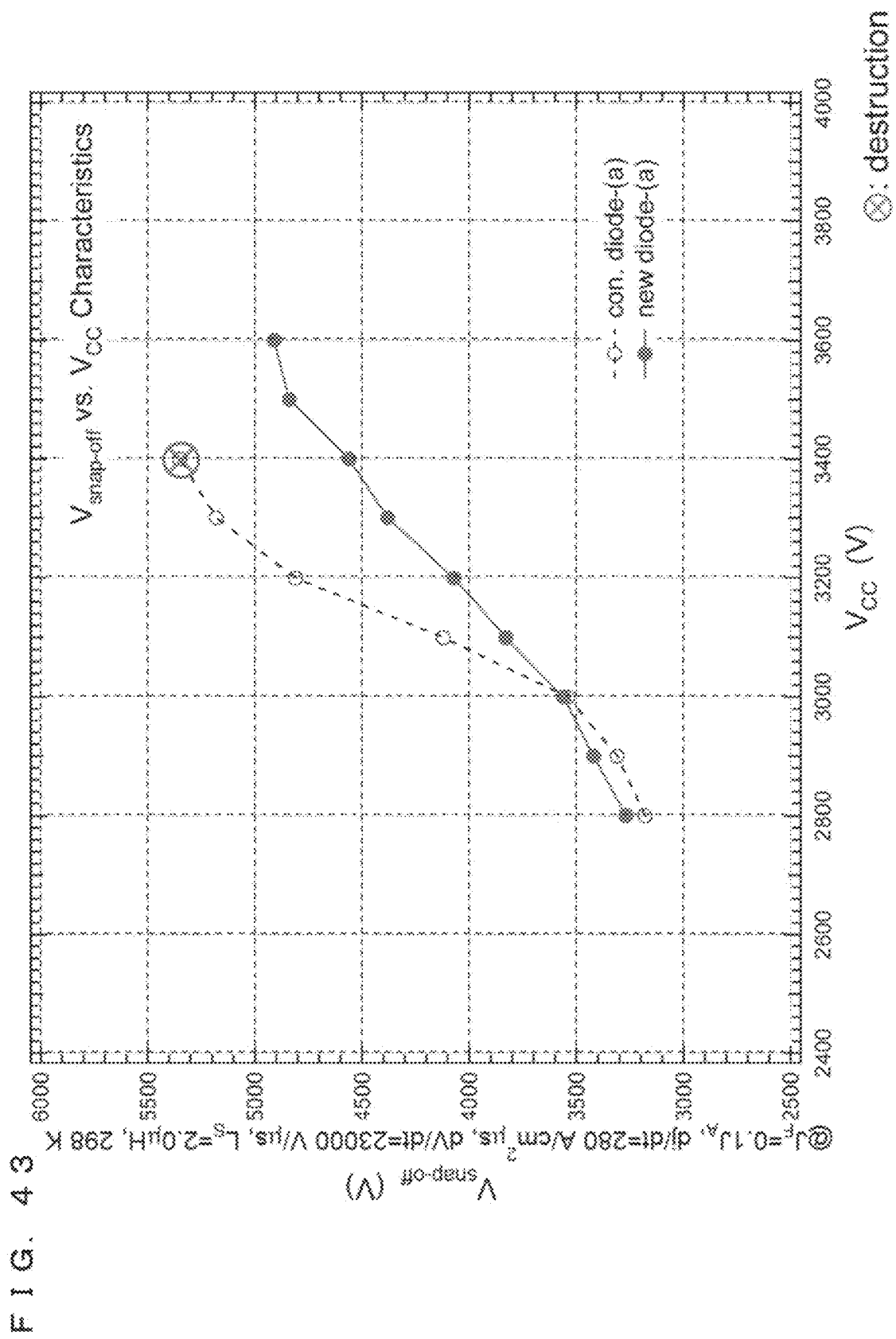
FIG. 43 shows a relationship between a power source voltage and a snap-off voltage observed at 298 K in the prototyped 4.5 kV class conventional structure PIN diode and new structure PiN diode.

FIG. 43 shows a relationship between a power source voltage ($V_{CC}$) and a snap-off voltage ($V_{snap\text{-}off}$) observed at 298 K in the 4.5 kV class conventional structure PiN diode and new structure PiN diode. The new structure PiN diode does not cause destruction of the device even with a voltage leading to destruction of the conventional structure PiN diode, showing that destruction tolerance is improved during snappy recovery operation. Furthermore, as compared with the conventional structure PIN diode, the new structure PiN diode reduces the dependence of a snap-off voltage on $V_{CC}$ to make the snap-off voltage $V_{CC}$ less sensitive, showing that the new structure PiN diode is used most effectively in achieving high destruction tolerance at higher $V_{CC}$.

FIG. 44 shows a relationship between a power source voltage ($V_{CC}$) and a reverse recovery charge amount ($Q_{RR}$) observed at 298 K in the 4.5 kV class conventional structure PiN diode and new structure PiN diode. In the new structure PiN diode, the dependence of $Q_{RR}$ on $V_{CC}$ is less than in the conventional structure PiN diode. This leads to the effect of improving destruction tolerance during snappy recovery operation in the new structure PiN diode.

As described above, the PiN diode also achieves the effect of improving destruction tolerance by using the new structure N buffer layer 15 with Trap B in lattice defect in the second buffer layer 15-2 controlled within a range from 15 to 55%.

Third Preferred Embodiment

In a third preferred embodiment, the new structure N buffer layer 15 is applied to an IGBT and it is verified that the new structure N buffer layer 15 applied in this way behaves in the same manner as in the first preferred embodiment.

Figure 45:
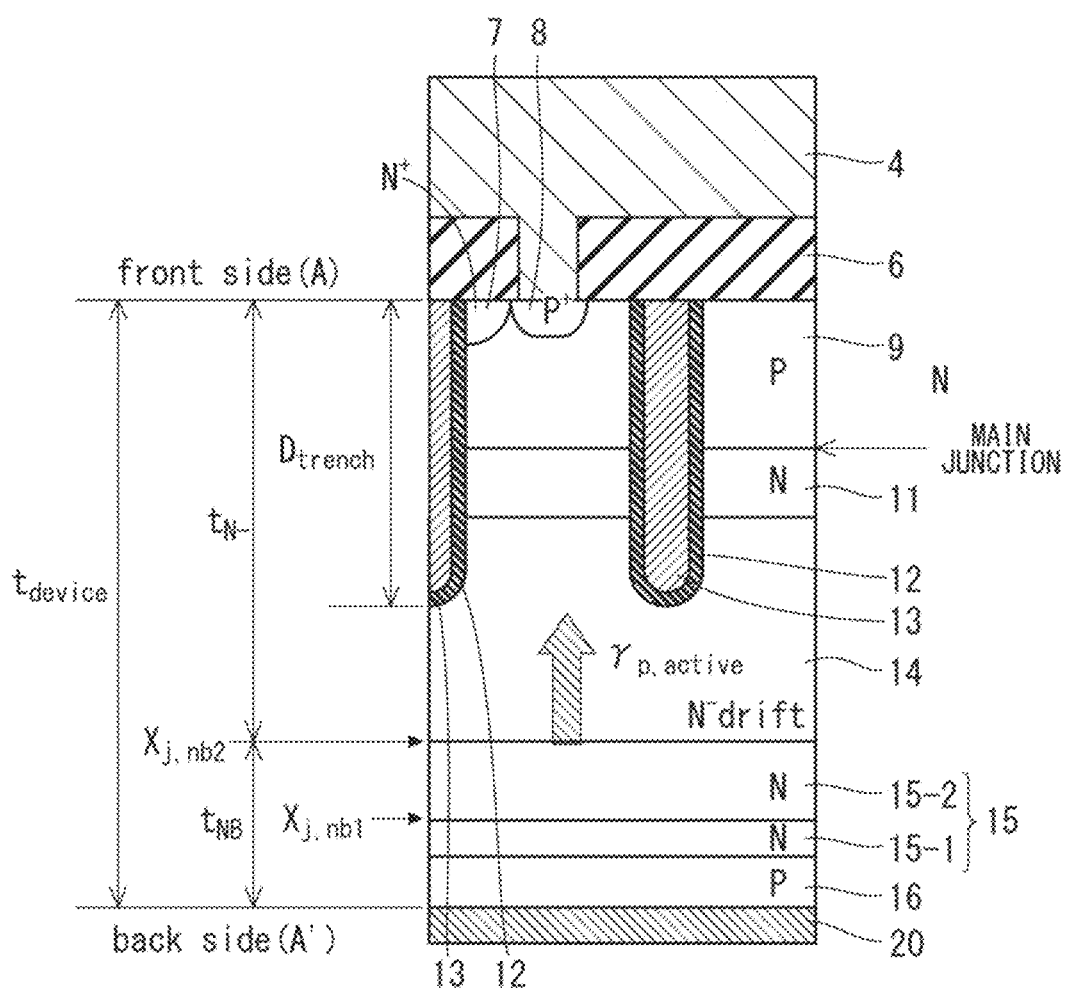
FIG. 45 is a sectional view of an IGBT according to a third preferred embodiment.
Figure 46:
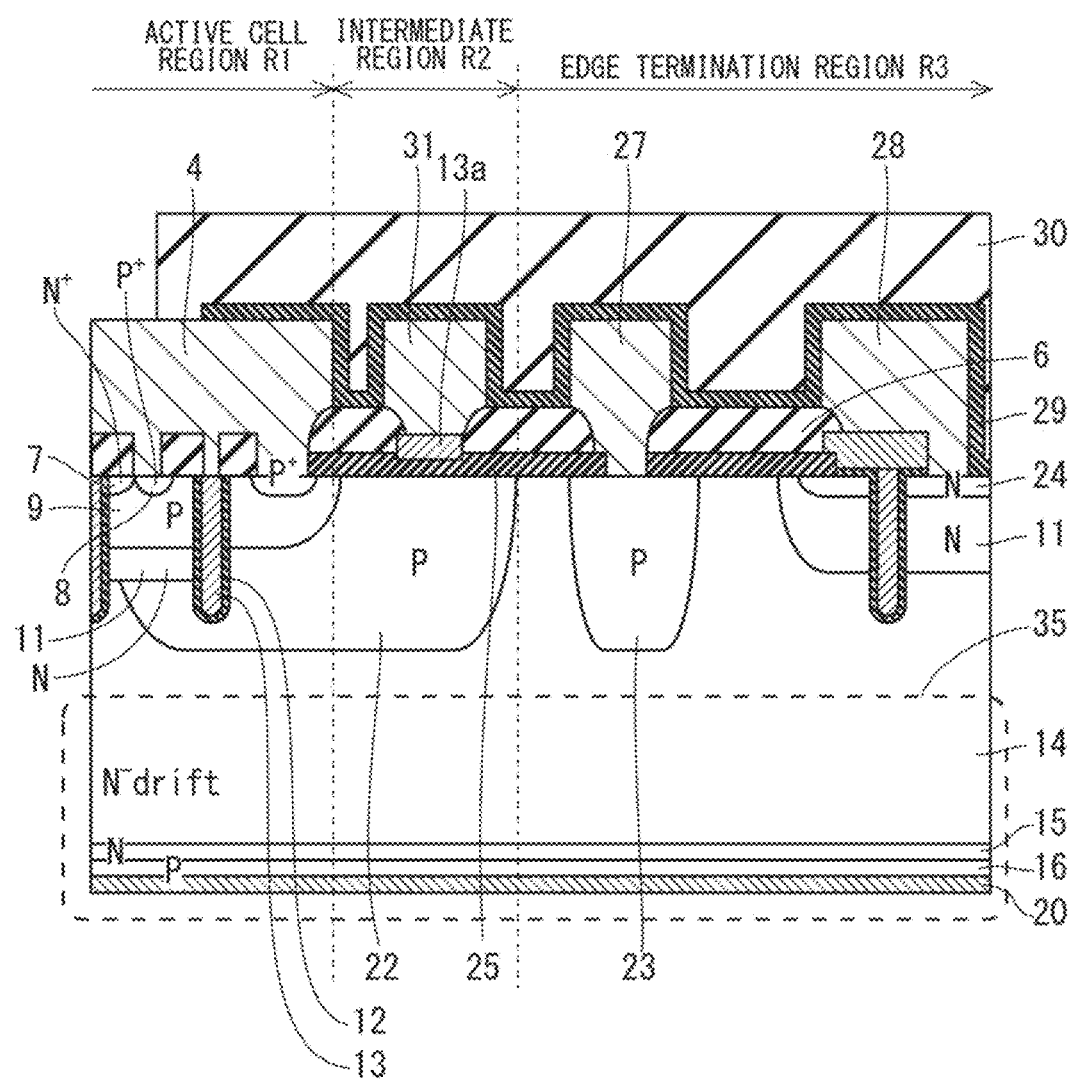
FIGS. 46 and 47 are sectional views each showing an example of the structure of an outer peripheral part of a semiconductor device including the IGBT according to the third preferred embodiment.

FIG. 45 is a sectional view showing a trench gate IGBT as a semiconductor element according to the third preferred embodiment and corresponding to a section taken along the line A1-A2 of FIG. 1. FIG. 46 is a sectional view showing an example of the structure of an outer peripheral part of a semiconductor device including the IGBT according to the third preferred embodiment and corresponding to the section taken along the line A3-A4 of FIG. 1.

The structure of the IGBT formed in the active cell region R1 will be described first by referring to FIG. 45. The semiconductor substrate forming the IGBT includes an N⁻ drift layer 14 of an N type (first conductivity type). The semiconductor substrate includes an N-type N buffer layer 15 higher in peak impurity concentration than the N⁻ drift layer 14 formed under the N⁻ drift layer 14. The N buffer layer 15 is the new structure N buffer layer 15 composed of the first buffer layer 15-1 on the lower side and the second buffer layer 15-2 on the upper side. While not shown in the drawings, the N buffer layer 15 of FIG. 46 also includes the first buffer layer 15-1 and the second buffer layer 15-2.

The semiconductor substrate includes a P collector layer 16 of a P type (second conductivity type) formed under the N buffer layer 15. The P collector layer 16 is formed in a surface portion of the semiconductor substrate on the back side (second main surface side). A collector electrode 20 is formed on the back side of the semiconductor device in such a manner as to contact the P collector layer 16.

The semiconductor substrate includes an N layer 11 higher in peak impurity concentration than the N⁻ drift layer 14 formed on the N⁻ drift layer 14, and a P-type P base layer 9 formed on the N layer 11. The P base layer 9 is formed in a surface portion of the semiconductor substrate on the upper surface side (main surface side). The P base layer 9 has a surface portion in which an N-type N⁺ emitter layer 7 and a P-type P⁺ layer 8 higher in peak impurity concentration than the P base layer 9 are formed selectively. In the IGBT, a junction between the P base layer 9 and the N layer 11 functions as a main junction.

The semiconductor substrate has an upper surface at which a trench is formed in such a manner as to penetrate the P base layer 9 and the N layer 11 in the vertical direction to reach the N⁻ drift layer under the P base layer 9 and the N layer 11. A gate insulating film 12 is formed on the inner wall of the trench, and a gate electrode 13 is formed on the gate insulating film 12 in such a manner as to fill the trench. The gate electrode 13 faces the N⁻ drift layer 14, the N layer 11, the P base layer 9, and the N⁺ emitter layer 7 across the gate insulating film 12. The gate electrode 13, the N⁺ emitter layer 7, the P base layer 9, and the N layer 11 form an insulated gate transistor structure (MOS transistor structure) in the IGBT.

An interlayer insulating film 6 is formed on the upper surface of the semiconductor substrate in such a manner as to cover the gate electrode 13. An emitter electrode 4 is formed on the interlayer insulating film 6. The emitter electrode 4 is electrically connected to the N⁺ emitter layer 7 and the P⁺ layer 8 through a contact hole. The gate electrode 13 formed in an outer peripheral part of the active cell region R1 (the right one of two gate electrodes 13 shown in the active cell region R1 in FIG. 46) does not make a contribution as an original gate electrode but is a dummy electrode set at the same potential as the emitter electrode 4. As mentioned in Japanese Patent No. 4205128, Japanese Patent No. 4785334, and Japanese Patent No. 5634318, the purpose and effect of the dummy electrode are to achieve suppression of saturation current density in the IGBT, suppression of oscillation in a no-load short-circuit state by means of control over capacitance characteristics, resultant improvement of short-circuit tolerance, reduction in on voltage by means of increase in carrier concentration on the emitter side.

Next, the structures of the intermediate region R2 and the edge termination region R3 of the IGBT will be described by referring to FIG. 46.

The N⁻ drift layer 14 extends over the active cell region R1, the intermediate region R2, and the edge termination region R3. A P-type guard ring 22 is formed in a surface portion of the N⁻ drift layer 14 in the intermediate region R2 to a greater depth than the P base layer 9. The guard ring 22 extends toward the active cell region R1 to be coupled to the P base layer 9 and to surround the gate electrode 13 as a dummy electrode (namely, the guard ring 22 is formed into a greater depth than the gate electrode 13 as a dummy electrode). A P-type field limiting ring 23 is formed selectively in a surface portion of the N⁻ drift layer 14 in the edge termination region R3.

A structure similar to that in the active cell region R1 and composed of the N layer 11, the gate insulating film 12, and the gate electrode 13 is formed external to the field limiting ring 23 in the edge termination region R3. An N⁺ channel stopper layer 24 is formed selectively in a surface portion of the N layer 11 in the active cell region R1. The channel stopper layer 24 is provided for the purpose of stopping extension of a depletion layer extending from a junction of the guard ring 22 and the field limiting ring 23 with the N⁻ drift layer 14.

An insulating film 25 is formed on the upper surface of the semiconductor substrate in the intermediate region R2 and the edge termination region R3. A surface gate electrode 13a leading to the gate electrode 13 is formed on the insulating film 25 in the intermediate region R2. The interlayer insulating film 6 is formed on the insulating film 25 and the surface gate electrode 13a.

An FLR electrode 27 connected to the field limiting ring 23 through a contact hole, a channel stopper electrode 28 connected to the channel stopper layer 24 through a contact hole, and a surface gate electrode 31 connected to the surface gate electrode 13a through a contact hole are formed on the interlayer insulating film 6. The FLR electrode 27, the channel stopper electrode 28, and the surface gate electrode 31 can be formed simultaneously with the emitter electrode 4 in the active cell region R1.

A passivation film 29 is formed as a protective film covering the FLR electrode 27, the channel stopper electrode 28, and the surface gate electrode 31 in such a manner as to extend over the intermediate region R2 and the edge termination region R3. A passivation film 30 is formed on the passivation film 29.

As shown in FIG. 46, a structure composed of a stack of the N⁻ drift layer 14, the N buffer layer 15, and the P collector layer 16 is defined in such a manner as to extend over the active cell region R1, the intermediate region R2, and the edge termination region R3. This structure corresponds to a vertical structure 35 of the IGBT.

Figure 47:
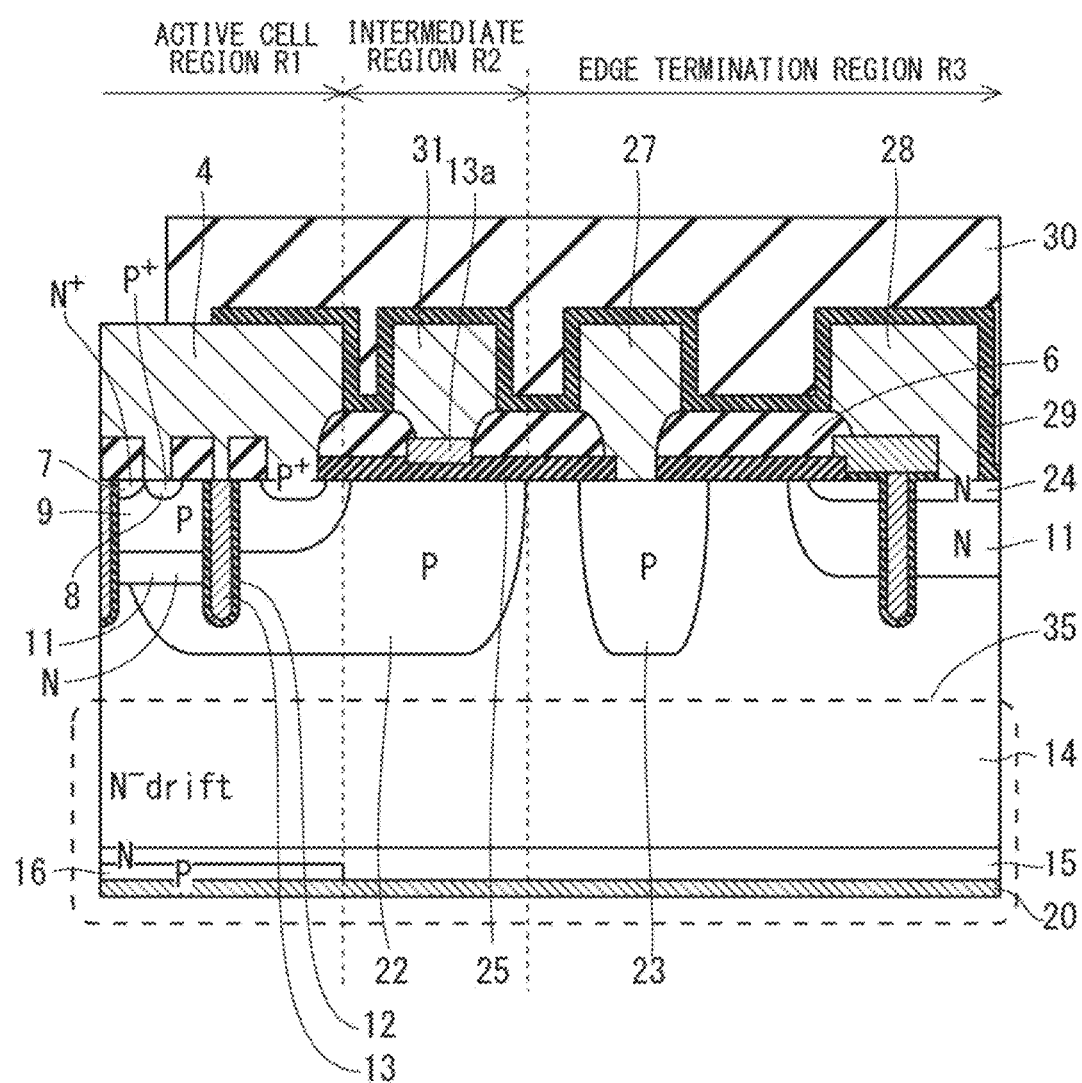

In FIG. 46, the structure with the P collector layer 16 is shown to be present further in the intermediate region R2 and the edge termination region R3. Alternatively, as shown in FIG. 47, the P collector layer 16 may be omitted in the intermediate region R2 and the edge termination region R3. Namely, the vertical structure 35 in the intermediate region R2 and the edge termination region R3 may be composed only of the N⁻ drift layer 14 and the N buffer layer 15. As compared with the IGBT in FIG. 46, an IGBT in FIG. 47 allows suppression of bad influence on an on voltage, switching loss, and an SOA in a short-circuit state, etc., making it possible to improve the SOA considerably during turn-off operation. This technique is described in detail in Japanese Patent No. 6165271.

As described above, the N buffer layer 15 of the IGBT according to the third preferred embodiment is the new structure N buffer layer 15 including the first buffer layer 15-1 and the second buffer layer 15-2. In the following description, the IGBT of the third preferred embodiment including the new structure N buffer layer 15 may be called a "new structure IGBT," and a conventional IGBT including the conventional structure N buffer layer 15 may be called a "conventional structure IGBT."

With carrier lifetime in the first buffer layer 15-1 expressed as $\tau_{15a}$, carrier lifetime in the second buffer layer 15-2 as $\tau_{15b}$, carrier lifetime in the N⁻ drift layer 14 as $\tau_{14}$, and carrier lifetime in the P collector layer 16 as $\tau_{16}$, the relationship of $\tau_{15b} < \tau_{16} \approx \tau_{15a} \approx \tau_{14}$ is established in the IGBT of the third preferred embodiment (the detail of which will be described in a fourth preferred embodiment).

Satisfying this relationship between the carrier lifetimes achieves the effect of stabilizing the efficiency of carrier injection from the lower surface side in an on state of the IGBT (hole injection efficiency $\gamma_{p, active}$ shown in FIG. 45), the effect of reducing a leakage current occurring when the main junction is depleted by application of a reverse bias, and the effect of encouraging carrier recombination using the second buffer layer 15-2. As a result, the following effects are expected to be achieved: stable on operation of the IGBT, reduction in off-loss (FIG. 56), high-temperature operation based on thermally stable operation (FIG. 56), improvement of dynamic durability (FIG. 53), etc.

In the IGBT according to the third preferred embodiment, parameters for diffusion layers other than the N buffer layer 15 and those for the trench are set as follows. The N⁻ drift layer 14 is formed using an Si wafer (FZ wafer) prepared by the FZ method having an impurity concentration ($C_{n\text{-}}$) from $1.0 \times 10^{12}$ to $5.0 \times 10^{14}$ cm⁻³. A final device thickness ($t_{device}$) is from 40 to 700 μm.

The P base layer 9 is set at a peak impurity concentration from $1.0 \times 10^{16}$ to $1.0 \times 10^{18}$ cm⁻³ and a depth greater than that of the N⁺ emitter layer 7 and less than that of the N layer 11. The N layer 11 is set at a peak impurity concentration from $1.0 \times 10^{15}$ to $1.0 \times 10^{17}$ cm⁻³ and a depth greater than that of the P base layer 9 by a range from 0.5 to 1.0 μm. The N⁺ emitter layer 7 is set at a peak impurity concentration from $1.0 \times 10^{18}$ to $1.0 \times 10^{21}$ cm⁻³ and a depth from 0.2 to 1.0 μm. The P⁺ layer 8 is set at a surface impurity concentration from $1.0 \times 10^{18}$ to $1.0 \times 10^{21}$ cm⁻³ and a depth equal to or greater than that of the N⁺ emitter layer 7. The P collector layer 16 is set at a surface impurity concentration from $1.0 \times 10^{16}$ to $1.0 \times 10^{20}$ cm⁻³ and a depth from 0.3 to 0.8 μm. The trench filled with the gate electrode 13 is set at a depth ($D_{trench}$) of equal to or greater than 2.0 μm, which is a depth reaching at least the N layer 11. Parameters for the N buffer layer 15 (first buffer layer 15-1 and second buffer layer 15-2) may be the same as those in the first preferred embodiment.

A structure in the intermediate region R2 and the edge termination region R3 in a prototyped IGBT structure corresponds to the structure shown in FIG. 46 or 47. The N buffer layer 15 has the same structure in the intermediate region R2 and the edge termination region R3 as the structure in the active cell region R1.

Figure 49:
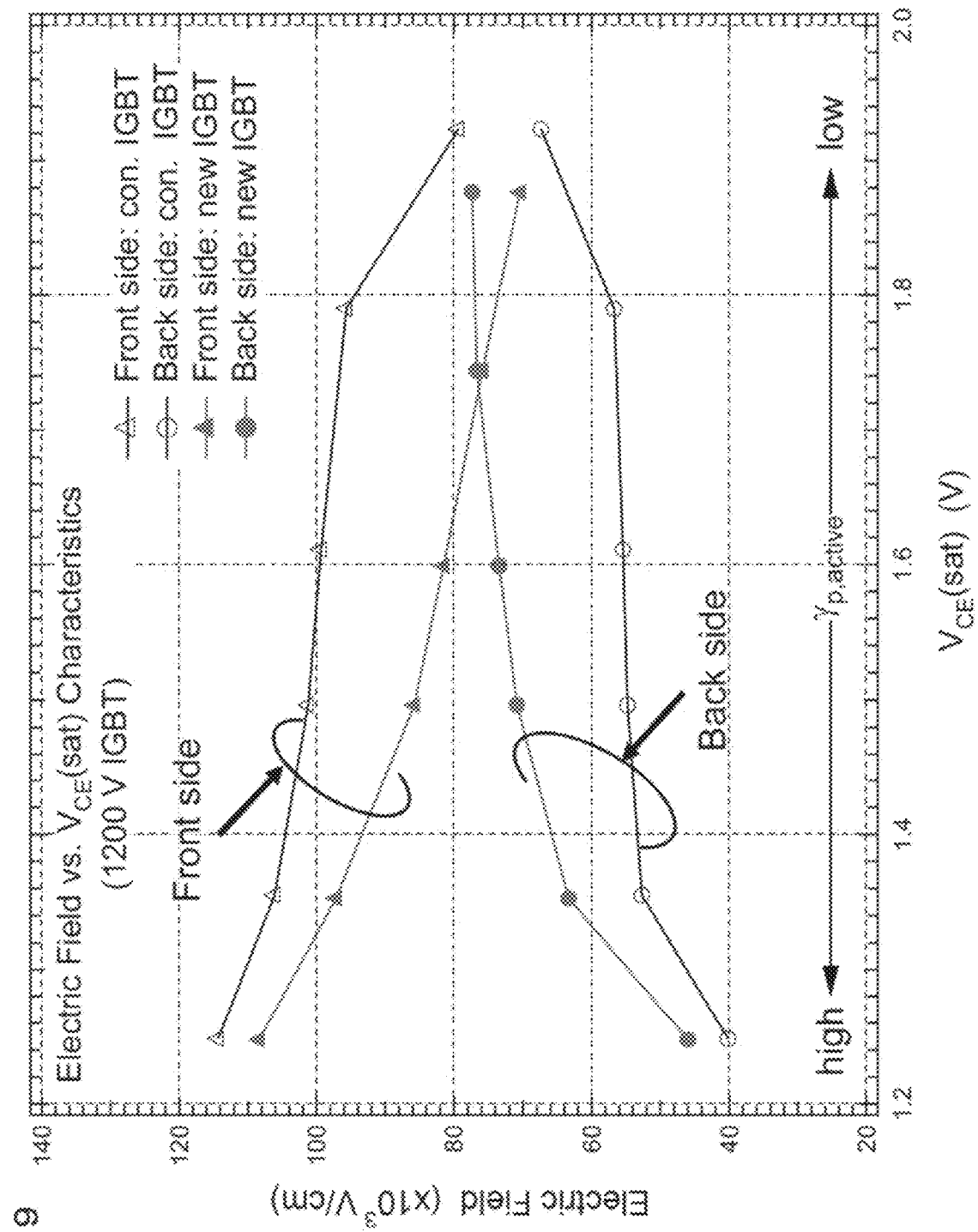
FIG. 49 shows simulation result about a relationship between electric field intensities at a device front side and a device back side and an on voltage observed in a short-circuit state in the conventional structure IGBT and the new structure IGBT.
Figure 50:
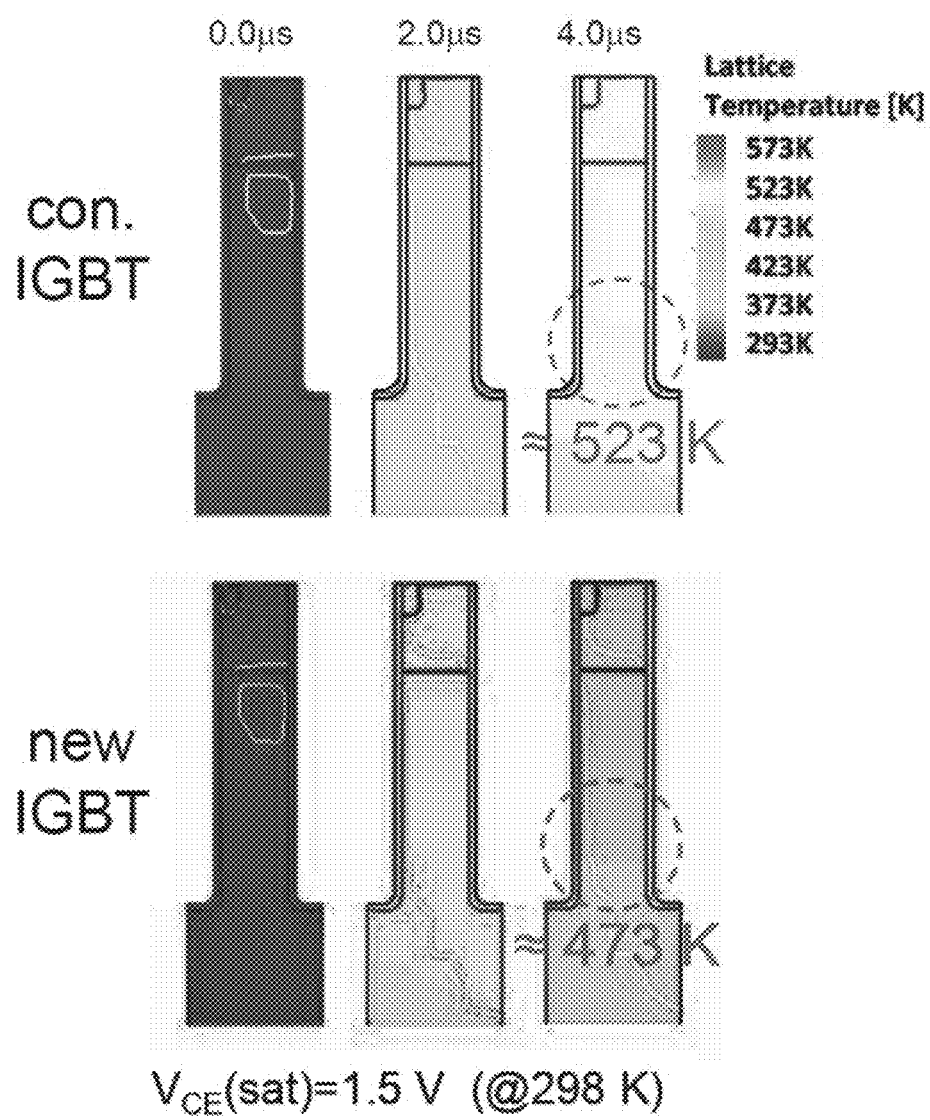
FIG. 50 shows simulation result about a device interior temperature distribution observed in a short-circuit state in the conventional structure IGBT and the new structure IGBT.

FIGS. 48 to 50 show result obtained by simulation for examining a contribution made by the new structure N buffer layer 15 in a particular short-circuit state during operation of an IGBT not observed in a diode.

Figure 51:
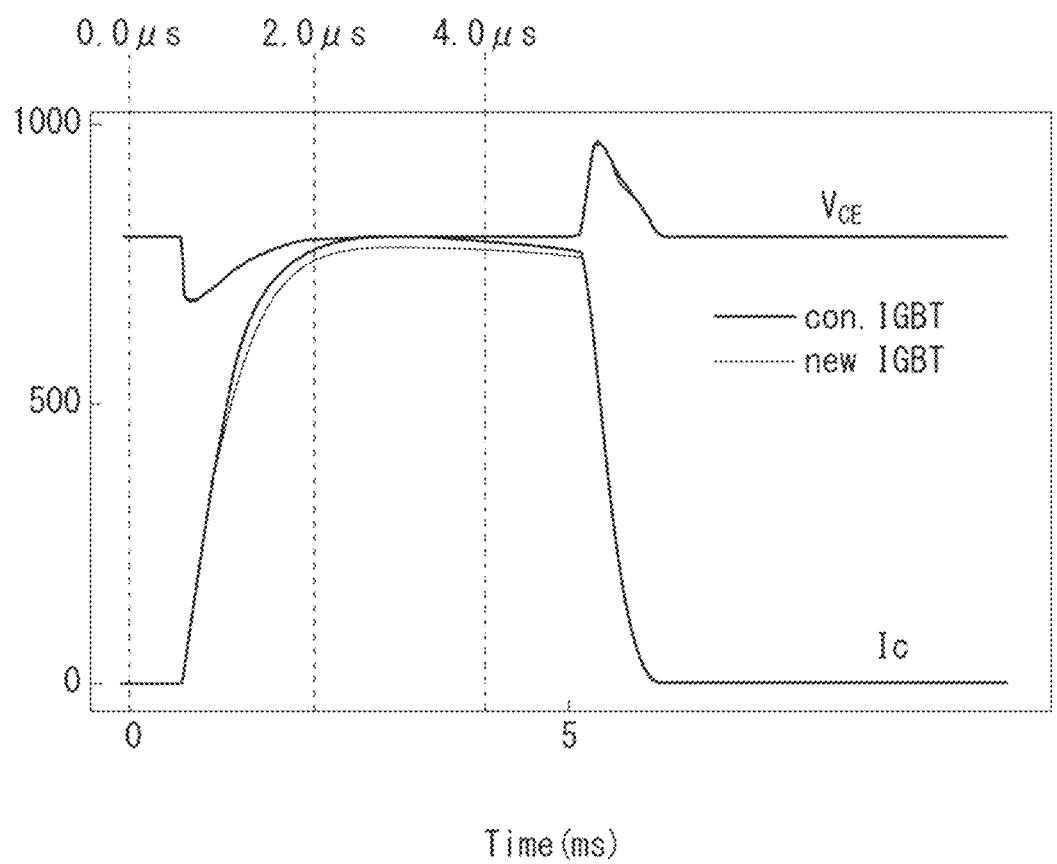
FIG. 51 is a short-circuit waveform observed by simulation during analysis of the device interior temperature distribution shown in FIG. 50.

FIG. 48 shows an electric field intensity distribution observed inside an IGBT in a short-circuit state. FIG. 49 shows relationships of electric field intensities at the device upper surface and the device back side with an on voltage ($V_{CE}$(sat)). The horizontal axis shows $V_{CE}$(sat) indicating result of control using the efficiency of hole injection ($\gamma_{p, active}$ shown in FIG. 45) from the collector side. In FIG. 49, "Front side" means electric field intensity at the main junction on the device front side, and "Back side" means maximum electric field intensity in the N buffer layer 15 on the device back side. FIG. 50 is an interior temperature distribution observed in the upper part of the device while $V_{CE}$(sat) set at a constant value and the conventional structure IGBT device and the new structure IGBT device are in a short-circuit state. Time of measurement for obtaining the temperature distribution of in FIG. 50 is shown in FIG. 51. FIG. 51 is a short-circuit waveform observed by simulation during analysis of the device interior temperature distribution shown in FIG. 50.

In the conventional structure IGBT, high efficiency of hole injection ($\gamma_{p, active}$) from the collector side increases electric field intensity at the main junction. This causes temperature increase at the upper part of the device as shown in FIG. 50, leading to a high probability of cutoff capability reduction in a short-circuit state. On the other hand, in the new structure IGBT, lattice defect in the second buffer layer 15-2 acts to encourage carrier recombination to control a carrier plasma layer at the collector in a short-circuit state. This causes a depletion layer to extend easily toward the back side of the device. Thus, as shown in FIG. 48, electric field intensity is balanced in a resultant distribution even in a short-circuit state. As a result, in the new structure IGBT, temperature increase at the upper part of the device is suppressed as compared with the conventional structure IGBT, so that cutoff capability in a short-circuit state is expected to be improved.

Figure 52:
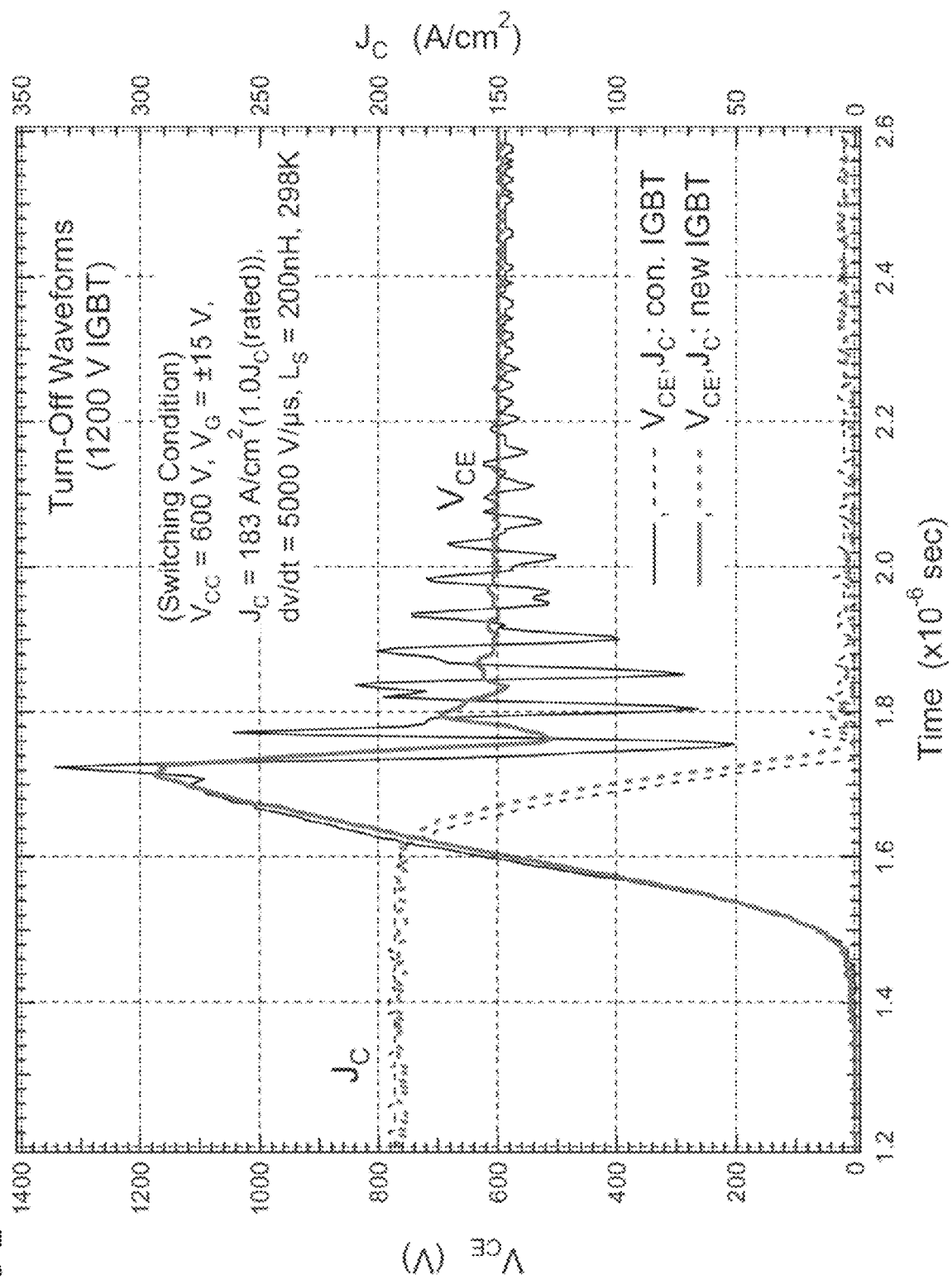
FIG. 52 shows turn-off waveforms observed at 298 K in a prototyped 1200 V class conventional structure IGBT and a prototyped 1200 V class new structure IGBT.

FIG. 52 shows turn-off waveforms observed at 298 K in a 1200 V class conventional structure IGBT and a 1200 V class new structure IGBT. The conventional structure IGBT and the new structure IGBT shown in FIG. 52 have the same thickness ($t_{device}$) and the same impurity concentration ($C_{n-}$) in the N⁻ drift layer 14. Like in the new structure RFC diode shown in FIG. 12, in the new structure IGBT, a carrier plasma layer remains on the collector side in the latter half of turn-off operation. As a result, electric field intensity on the collector side is relaxed in the new structure IGBT to suppress a snap-off phenomenon and a subsequent oscillation phenomenon observed in the conventional structure IGBT, thereby exhibiting turn-off operation with excellent controllability.

Figure 53:
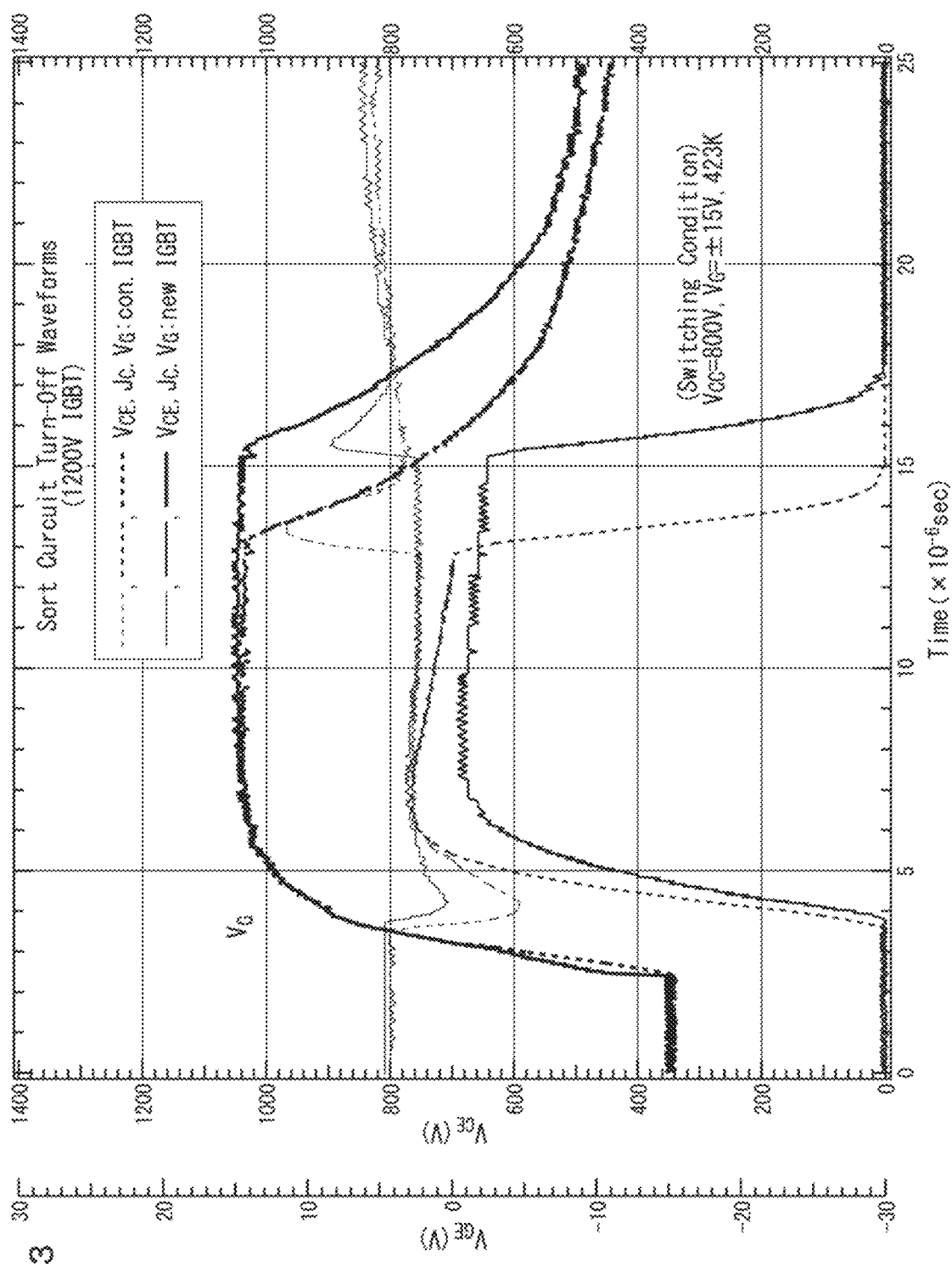
FIG. 53 shows short-circuit waveforms observed at 423 K in the prototyped 1200 V class conventional structure IGBT and new structure IGBT.
Figure 54:
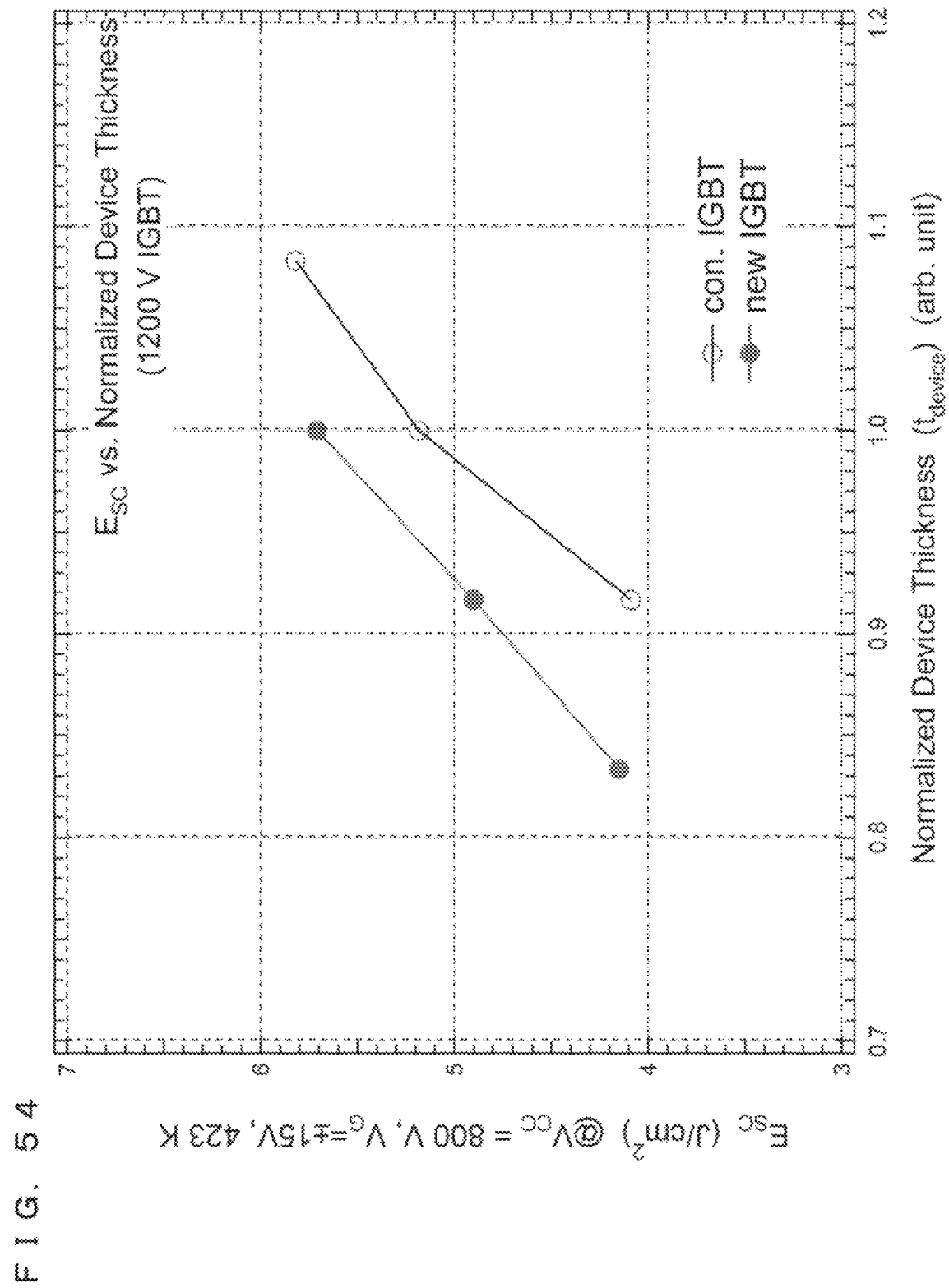
FIG. 54 shows a relationship between maximum energy density allowing cutoff of a short-circuit and a device thickness observed in the prototyped 1200 V class conventional structure IGBT and new structure IGBT.

FIG. 53 shows short-circuit waveforms observed in the 1200 V class conventional structure IGBT and new structure IGBT. FIG. 54 shows a relationship between maximum energy density (Esc) allowing cutoff of a short-circuit and a device thickness ($t_{device}$) observed in the 1200 V class conventional structure IGBT and new structure IGBT. As understood from FIGS. 53 and 54, a safe operating area (SOA) in a short-circuit state extends more widely in the new structure IGBT than in the conventional structure IGBT, making it possible to shrink the device thickness ($t_{device}$) while a sufficient SOA is guaranteed.

FIG. 55 shows trade-off characteristics between an on voltage ($V_{CE}$(sat)) and loss ($E_{OFF}$) during turn-off observed in the 1200 V class conventional structure IGBT and new structure IGBT. The new structure IGBT allows shrinkage in the device thickness ($t_{device}$) as compared with the conventional structure IGBT. The new structure IGBT provides excellent controllability during dynamic operation as shown in FIGS. 52 and 53, and realizes reduction in total loss as shown in FIG. 55 while improving durability.

Figure 56:
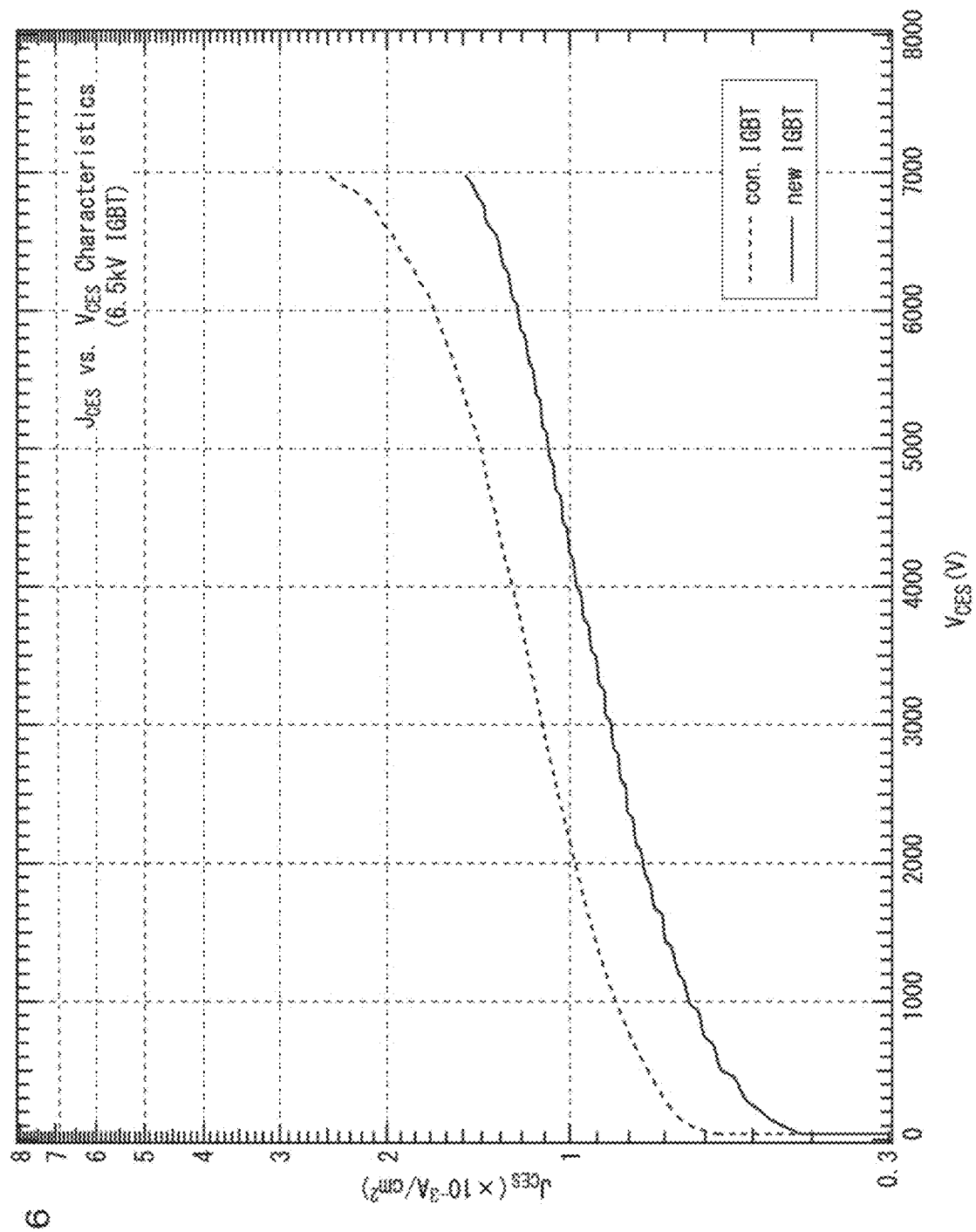
FIG. 56 shows a relationship between a main junction leakage current and a collector-to-emitter voltage observed at 423 K in a prototyped 6.5 kV class conventional structure IGBT and a prototyped 6.5 kV class new structure IGBT.
Figure 57:
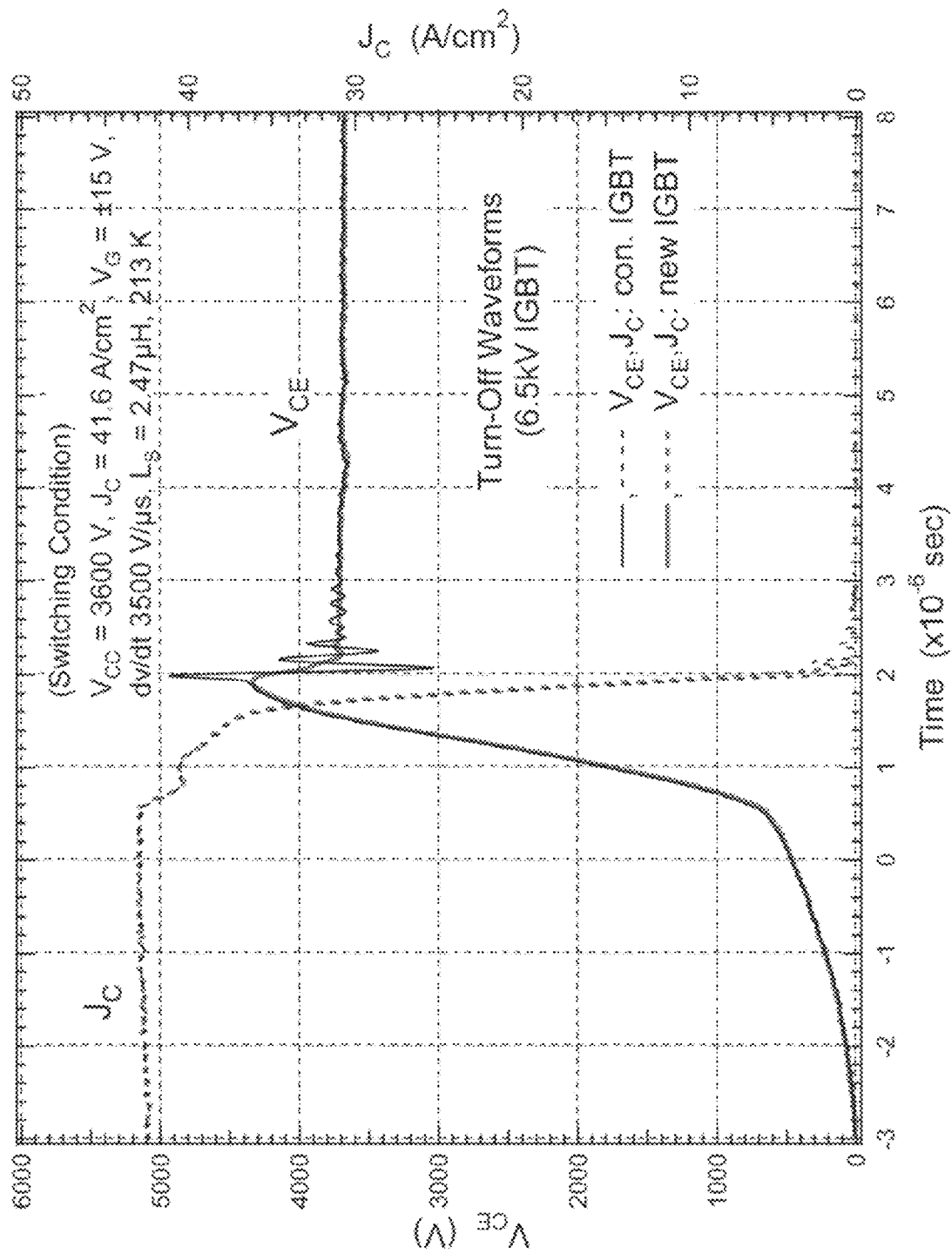
FIG. 57 shows turn-off waveforms observed at 213 K in the prototyped 6.5 kV class conventional structure IGBT and new structure IGBT.

FIGS. 56 and 57 show effect achieved by the new structure N buffer layer 15 in a high breakdown voltage class (6.5 kV) IGBT. FIG. 56 shows a relationship between a main junction leakage current ($J_{CES}$) and a collector-to-emitter voltage ($V_{CES}$) observed at 423 K in a 6.5 kV class conventional structure IGBT and in a 6.5 kV class new structure IGBT. As understood from FIG. 56, the new structure N buffer layer 15 has the action of reducing the current amplification factor ($\alpha_{pnp}$) of a PNP transistor provided in the IGBT, thereby reducing a leakage current during off to realize reduction in off-loss.

FIG. 57 shows turn-off waveforms observed at 213 K in the 6.5 kV class conventional structure IGBT and new structure IGBT. It is further understood from the turn-off waveform at a low-temperature state that, in the IGBT including the new structure N buffer layer 15, a carrier plasma layer remaining on the cathode side is present in the latter half of turn-off operation. As a result, electric field intensity on the collector side is relaxed in the new structure IGBT to suppress a snap-off phenomenon and a subsequent oscillation phenomenon, thereby exhibiting excellent turn-off operation even at low temperature.

As understood from above, an IGBT using the new structure N buffer layer 15 including the second buffer layer 15-2 in which a Trap B ratio in lattice defect is controlled within a range from 15 to 55% also fulfills the objects (a) to (c) described above.

Fourth Preferred Embodiment

In a fourth preferred embodiment, a method of manufacturing an IGBT and an RFC diode each including the new structure N buffer layer 15 will be described.

A method of manufacturing a semiconductor device including the IGBT will be described first by referring to FIGS. 58 to 70. These drawings show a manufacturing method in the active cell region R1.

A semiconductor substrate that is an FZ wafer with the N⁻ drift layer 14 is prepared. The semiconductor substrate is subjected to ion implantation and annealing to form the N layer 11 and the P base layer 9 in a surface portion of the semiconductor substrate. Then, an $SiO_2$ film 101 is formed on the P base layer 9.

The semiconductor substrate is further subjected to ion implantation and annealing to form the N⁺ emitter layer 7 selectively in the upper layer part of the P base layer 9.

Figure 60:
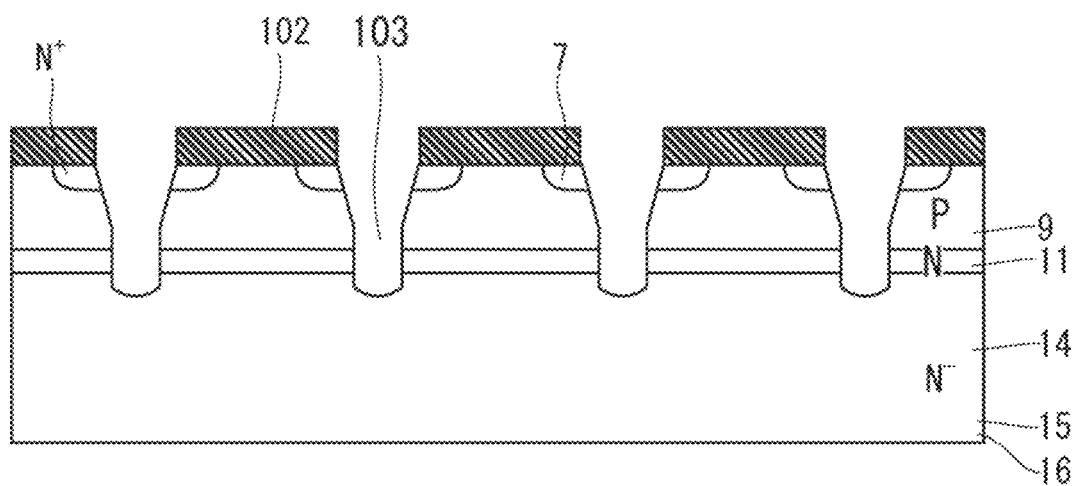

Next, as shown in FIG. 60, an oxide film 102 is formed on the upper surface of the semiconductor substrate and then patterned using photolithography technique. Next, reactive ion etching using plasma is performed on an exposed opening of the oxide film 102 to form a trench 103. Then, for the purpose of removing crystal defect and a crystal damage layer around the trench 103, rounding the bottom of the trench 103, and planarizing the inner wall of the trench 103, chemical dry etching and sacrificial oxidation process are performed. The chemical dry etching and sacrificial oxidation process are disclosed by Japanese Patent Application Laid-Open No. 7-263692 (1995), for example. An appropriate depth for the trench 103 is disclosed in WO 2009/122486, for example.

Figure 61:
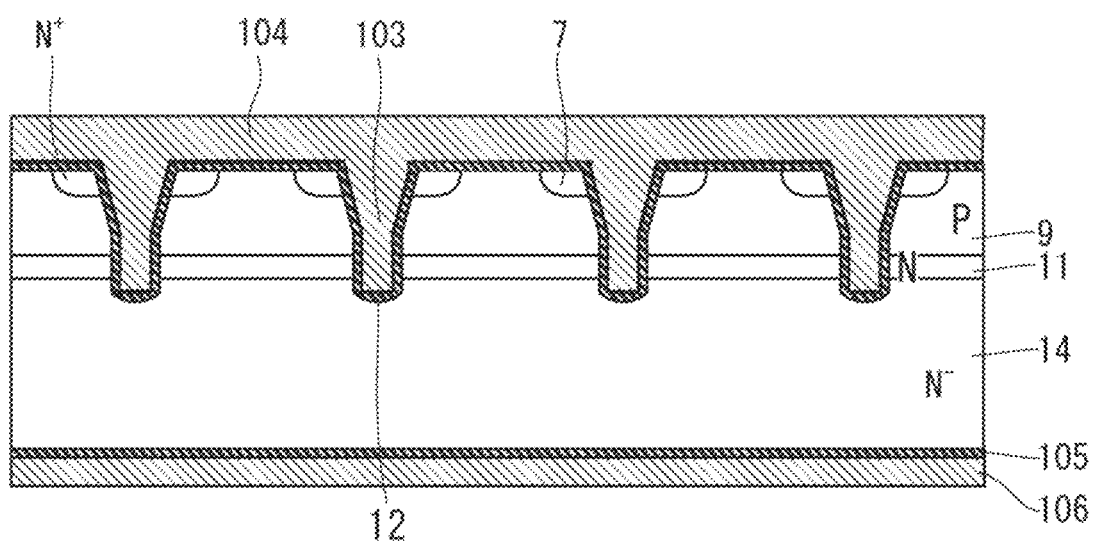

Next, as shown in FIG. 61, the gate insulating film 12 is formed on the inner wall of the trench 103 by the thermal oxidation process or chemical vapor deposition (CVD) method (see Japanese Patent Application Laid-Open No. 2001-085686, for example). Then, a polysilicon layer 104 doped with phosphorus is formed in the trench 103 including the gate insulating film 12 to fill the trench 103. An oxide film 105 is formed on the lower surface of the semiconductor substrate simultaneously with formation of the gate insulating film 12. A polysilicon layer 106 as a polysilicon layer doped with phosphorus is formed on the oxide film 105 simultaneously with formation of the polysilicon layer 104.

Figure 62:
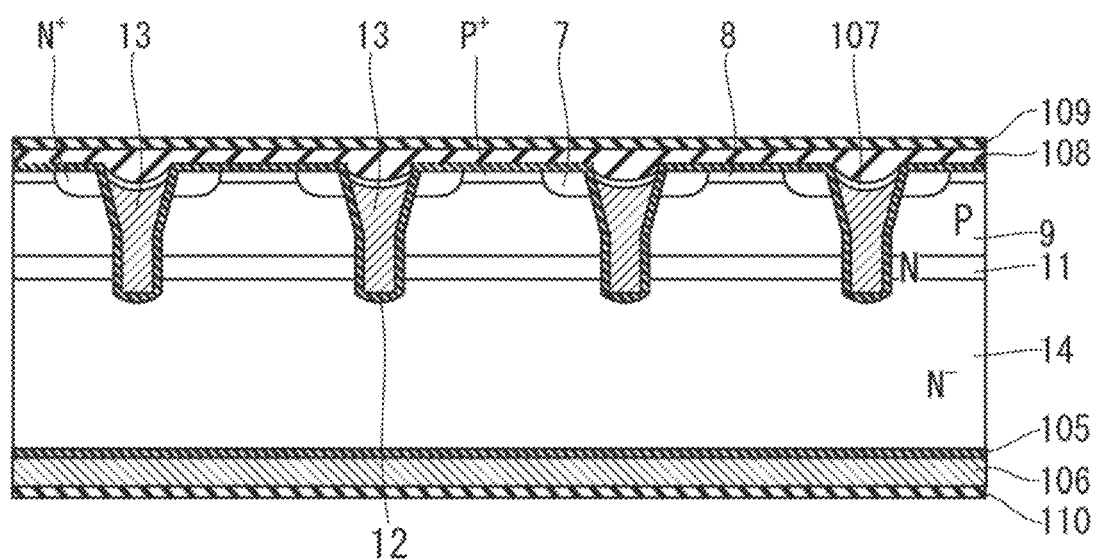

Next, as shown in FIG. 62, a part of the polysilicon layer 104 outside the trench 103 is etched. At this time, the polysilicon layer 104 remaining in the trench 103 becomes the gate electrode 13. An oxide film 107 is thereafter formed on an exposed surface of the gate electrode 13 by the thermal oxidation or CVD method. The P⁺ layer 8 is further formed on a surface of the semiconductor substrate. Next, an oxide film 108 doped with boron or phosphorus and a TEOS film 109 are formed on the upper surface of the semiconductor substrate by the CVD method to form the interlayer insulating film 6. A TEOS film or silicate glass may be formed as the oxide film 108. During formation of the oxide film 108 and the TEOS film 109, a TEOS film 110 is formed on the lower surface of the semiconductor substrate.

Figure 63:
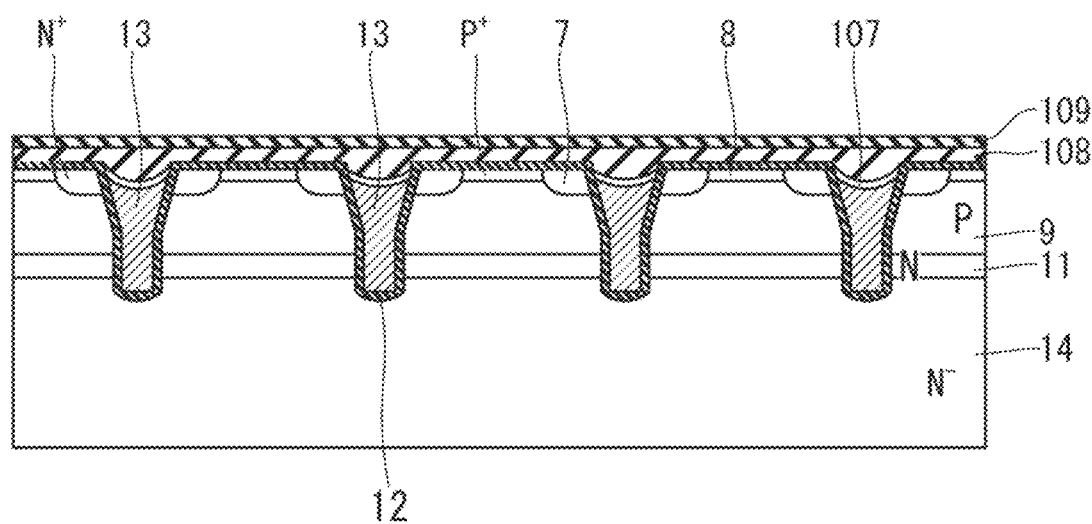

Next, as shown in FIG. 63, the TEOS film 110, the polysilicon layer 106, and the oxide film 105 on the lower surface of the semiconductor substrate are etched using a liquid containing fluoric acid or mixed acid (mixed liquid of fluoric acid, nitric acid, and acetic acid, for example) to expose the N⁻ drift layer 14.

Figure 64:
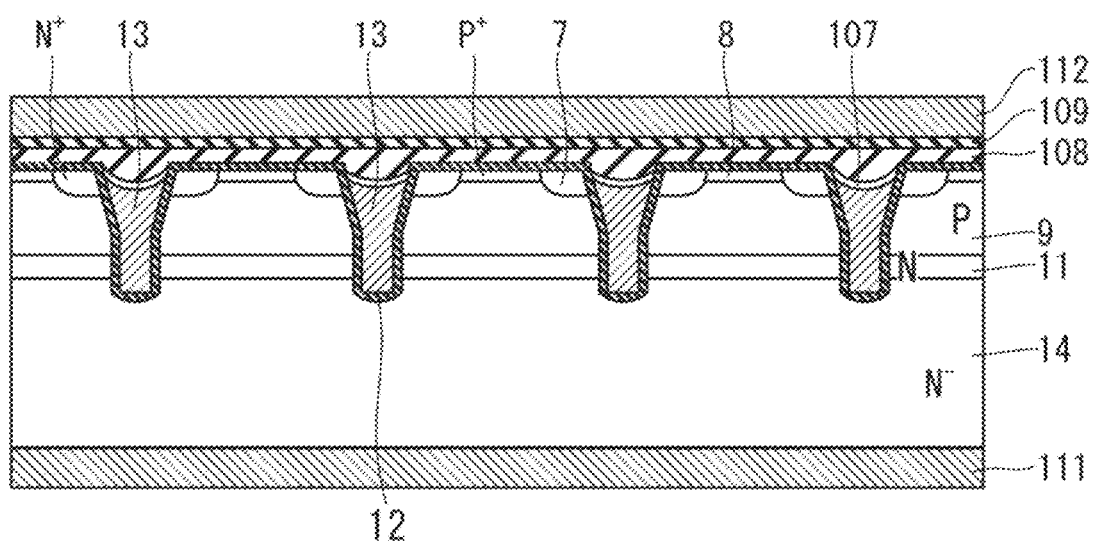

Next, as shown in FIG. 64, a polysilicon layer 111 doped with impurity is formed on the N⁻ drift layer 14 exposed on the lower surface of the semiconductor substrate by the low-pressure chemical vapor deposition (LPCVD) method. In order for the polysilicon layer 111 to become an N⁺ layer, phosphorus, arsenic, or antimony is used as the impurity for doping the polysilicon layer 111, for example. The concentration of the impurity in the polysilicon layer 111 is set to be equal to or greater than $1.0 \times 10^{19}$ (cm⁻³). The thickness of the polysilicon layer 111 is set to be equal to greater than 500 (nm). A polysilicon layer 112 is formed on the upper surface of the semiconductor substrate simultaneously with formation of the polysilicon layer 111.

Figure 65:
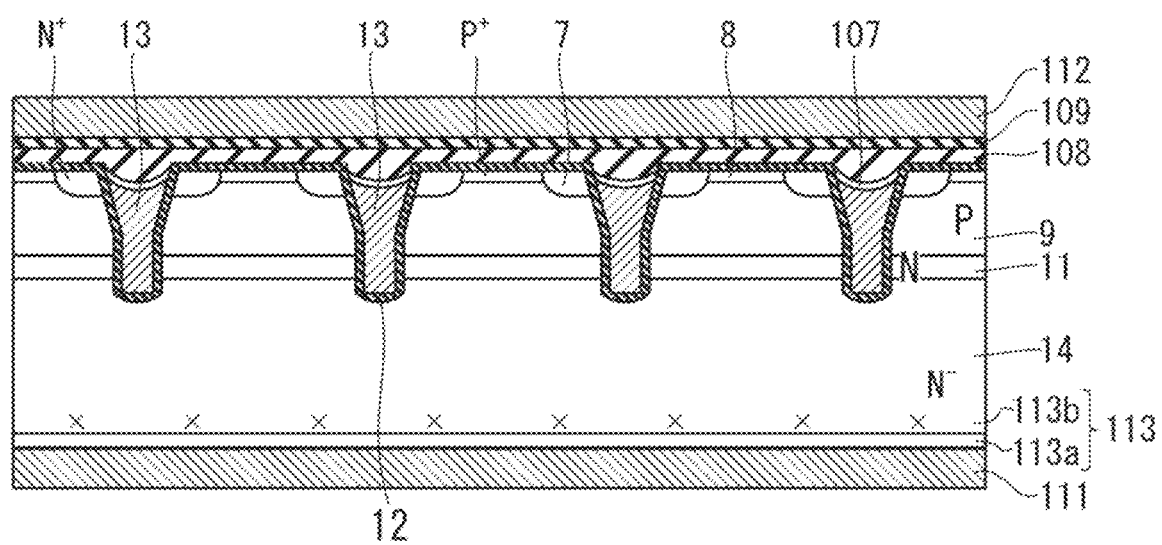

Next, as shown in FIG. 65, the temperature of the semiconductor substrate is increased to degrees from about 900 to about 1000° C. in an nitrogen atmosphere to diffuse the impurity in the polysilicon layer 111 toward the lower surface of the N⁻ drift layer 14. As a result of this diffusion, a gettering layer 113 composed of a high-concentration N⁺ layer 113a and a high crystal defect density layer 113b is formed on the lower surface of the N⁻ drift layer 14. An impurity concentration at a surface of the N⁺ layer 113a is set within a range from $1.0 \times 10^{19}$ to $1.0 \times 10^{22}$ cm⁻³, for example.

Then, the temperature of the semiconductor substrate is reduced at any temperature reducing speed to degrees from about 600 to about 700° C. and the resultant temperature is maintained for four hours or more. This step is called an annealing step. In the annealing step, the semiconductor substrate is heated. By doing so, metal impurity, polluted atoms, and damage introduced into the N⁻ drift layer 14 in the manufacturing steps are diffused and trapped in the gettering layer 113.

Figure 66:
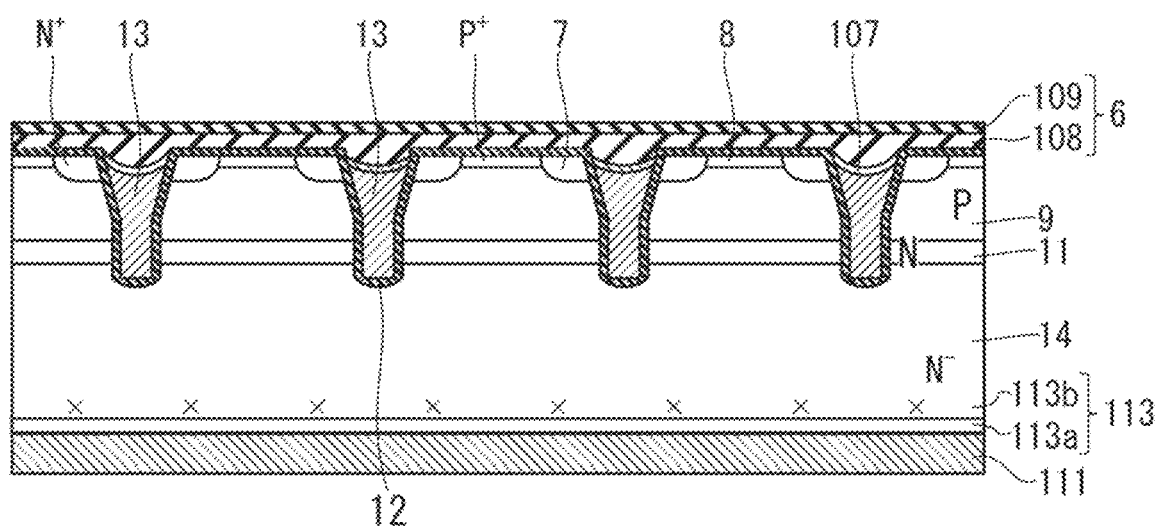

Next, as shown in FIG. 66, the polysilicon layer 112 on the upper surface of the semiconductor substrate is removed selectively using fluoric acid or mixed acid (mixed liquid of fluoric acid, nitric acid, and acetic acid, for example). The gettering process shown in FIGS. 64 to 66 is disclosed in WO 2014/054121, for example.

Figure 67:
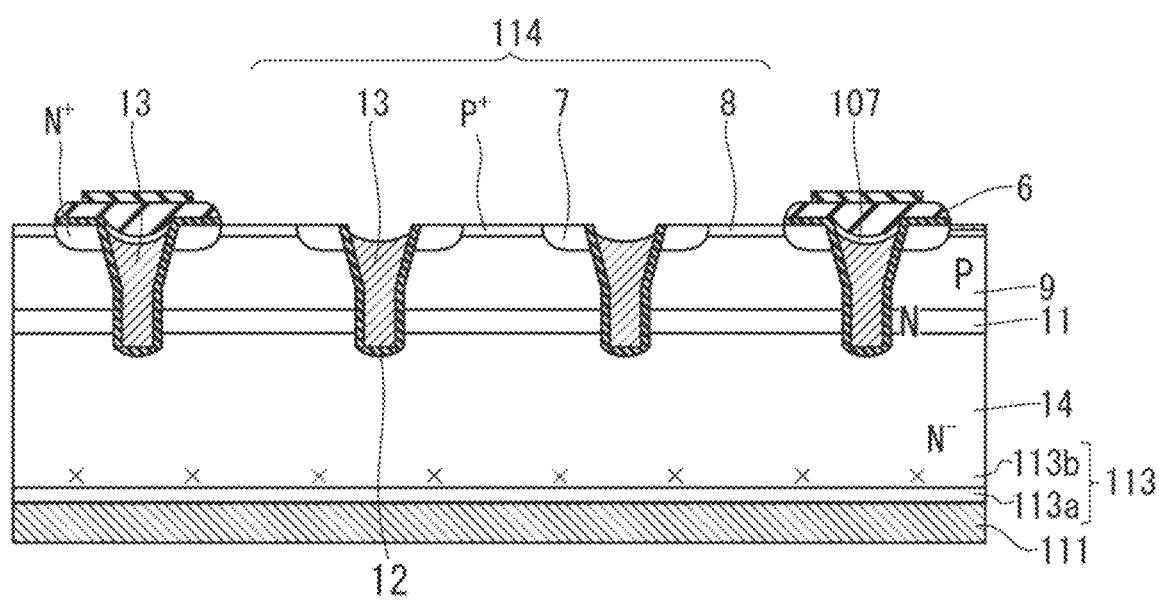

Then, as shown in FIG. 67, the interlayer insulating film 6 is partially etched on the upper surface of the semiconductor substrate to form a contact hole reaching the N⁺ emitter layer 7 and the P⁺ layer 8 and to form a trench exposed part 114 in a part of the active cell region R1 in which the upper surface of the gate electrode 13 buried in the trench is exposed. The part other than the trench exposed part 114 functions as an MOS transistor part of the IGBT.

The purpose of forming the trench exposed part 114 in a part of a formation region of the gate electrode 13 is to place some of the gate electrodes 13 at an emitter potential to reduce an effective gate width and adjust capacitance. By doing so, it becomes possible to suppress saturation current density, suppress oscillation on the occurrence of a short-circuit by means of capacitance control, improve short-circuit tolerance (for more detail, see WO 2002/058160 and WO 2002/061845, for example), and reduce an on voltage by means of increasing a carrier concentration on the emitter side during an on-state.

Figure 68:
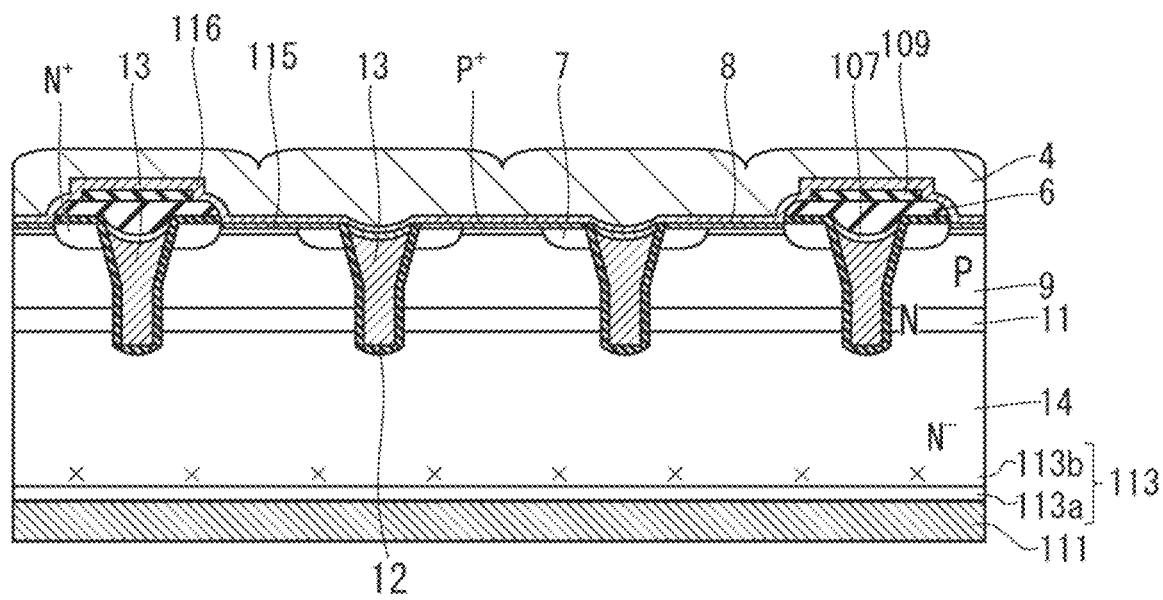

Next, as shown in FIG. 68, metal is formed by sputtering on the upper surface of the semiconductor substrate for forming a silicide layer 115 and a barrier metal layer 116. Then, a metal wiring layer containing Si added by a percentage from about 1 to about 3% is formed by sputtering, and this metal wiring layer is patterned to form the emitter electrode 4. A material of this metal wiring layer is AlSi, AlSiCu, or AlCu for example. The emitter electrode 4 is electrically connected to the trench exposed part 114.

Next, as shown in FIG. 69, the gettering layer 113 and the polysilicon layer 111 on the lower surface of the semiconductor substrate are removed by polishing or etching. Removing the gettering layer 113, etc. in this way is called a removing step. In the removing step, a part of the N⁻ drift layer 14 contacting the gettering layer 113 may be removed by an intended thickness. This makes it possible to provide the semiconductor substrate (N⁻ drift layer 14) with a thickness responsive to a breakdown voltage class of the semiconductor device.

Next, as shown in FIG. 70, the N buffer layer 15 is formed in a surface portion on the back side of the semiconductor substrate. Then, phosphorus, selenium, sulfur, or proton (hydrogen) is implanted from the back side of the semiconductor substrate and the semiconductor substrate is annealed to activate the implanted ions, thereby forming the N buffer layer 15. A process flow for the N buffer layer 15 of the fourth preferred embodiment (namely, the new structure N buffer layer 15) will be described later in detail.

Then, the P-type P collector layer 16 is formed in a surface portion of the N buffer layer 15 on the back side. Furthermore, the collector electrode 20 is formed in such a manner as to contact the P collector layer 16. The collector electrode 20 is a part to be solder-bonded to a semiconductor substrate in a module, for example, in mounting the semiconductor device on the module. For this reason, the collector electrode 20 is preferably formed by stacking several types of metal to reduce a contact resistance in the collector electrode 20.

A method of manufacturing a semiconductor device with an RFC diode will be described next by referring to FIGS. 71 to 79.

Figure 71:
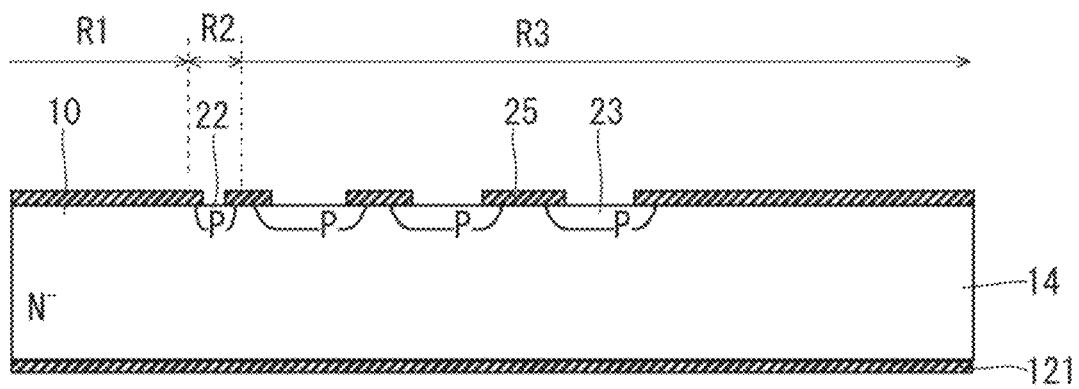

FIG. 71 shows the active cell region R1, the intermediate region R2, and the edge termination region R3. First, a semiconductor substrate provided only with the N⁻ drift layer 14 is prepared. Then, the insulating film 25 as an oxide film is formed on the semiconductor substrate and patterned. Using the insulating film 25 as a mask, ions are implanted and then the semiconductor substrate is subjected to annealing, thereby forming the guard ring 22, the field limiting ring 23, and the channel stopper layer 24 in a surface portion of the N⁻ drift layer 14 in the intermediate region R2 and the edge termination region R3. An oxide film 121 is formed on the lower surface of the semiconductor substrate during formation of the insulating film 25.

Next, as shown in FIG. 72, a surface portion of the N⁻ drift layer 14 in the active cell region R1 is subjected to ion implantation and annealing to form the P anode layer 10. A surface portion of the N⁻ drift layer 14 at an outer edge of the edge termination region R3 is subjected to ion implantation and annealing to form the channel stopper layer 24. Furthermore, the interlayer insulating film 26 as a TEOS film is formed on the upper surface of the semiconductor substrate, and then the process of exposing the lower surface of the semiconductor substrate is performed.

Figure 73:
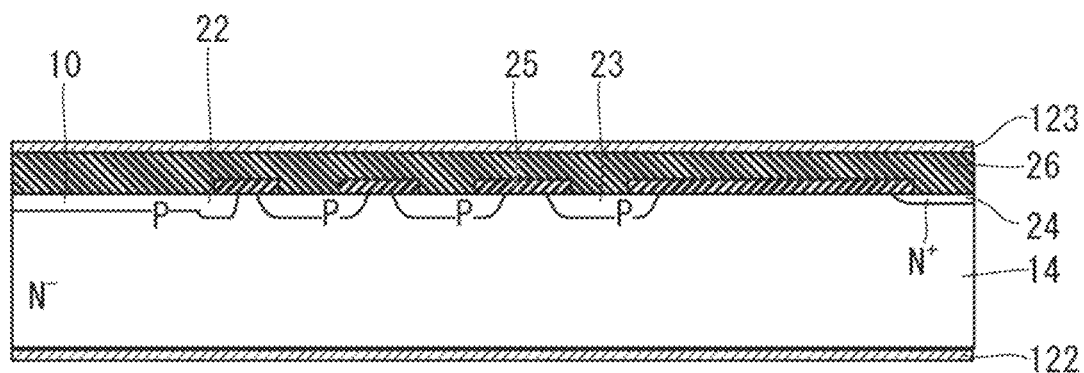

Then, as shown in FIG. 73, a polysilicon layer 122 doped with impurity is formed in such a manner as to contact the N⁻ drift layer 14 exposed on the lower surface of the semiconductor substrate. At this time, a polysilicon layer 123 is further formed on the upper surface of the semiconductor substrate.

Figure 74:
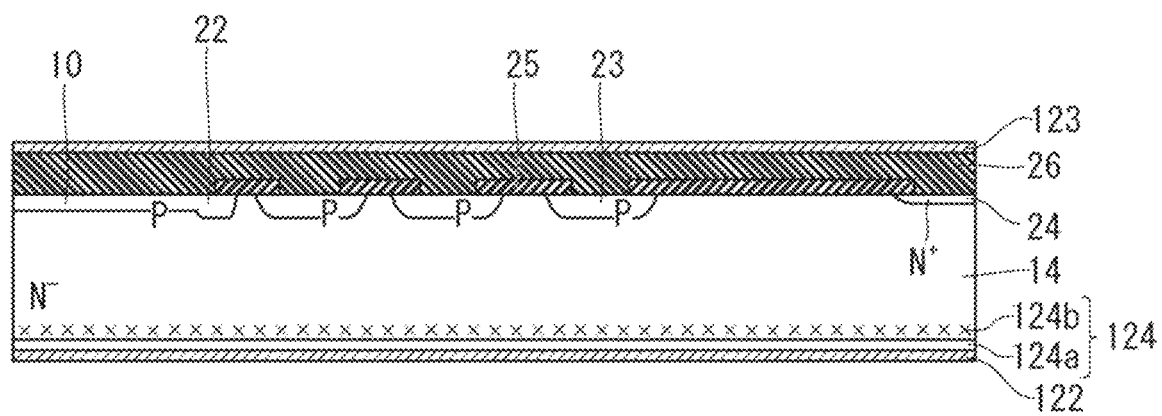

Next, as shown in FIG. 74, the semiconductor substrate is heated to diffuse the impurity in the polysilicon layer 122 toward the lower surface of the N⁻ drift layer 14, thereby forming a gettering layer 124 composed of a high-concentration N⁺ layer 124a and a high crystal defect density layer 124b on the lower surface of the N⁻ drift layer 14. This step is the same as the step of forming the gettering layer 113 in the method of manufacturing the IGBT shown in FIG. 65. Then, an annealing step is performed. By doing so, metal impurity, polluted atoms, and damage in the N⁻ drift layer 14 are trapped in the gettering layer 124.

Figure 75:
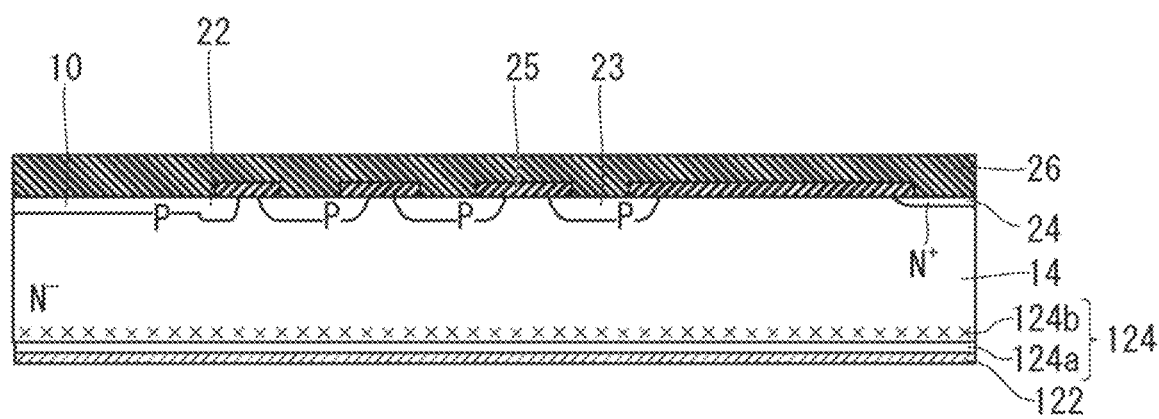

Then, as shown in FIG. 75, the polysilicon layer 123 on the upper surface of the semiconductor substrate is selectively removed using liquid containing fluoric acid or mixed acid (mixed liquid of fluoric acid, nitric acid, and acetic acid, for example). This gettering process is the same as the gettering process on the IGBT described above.

Figure 76:
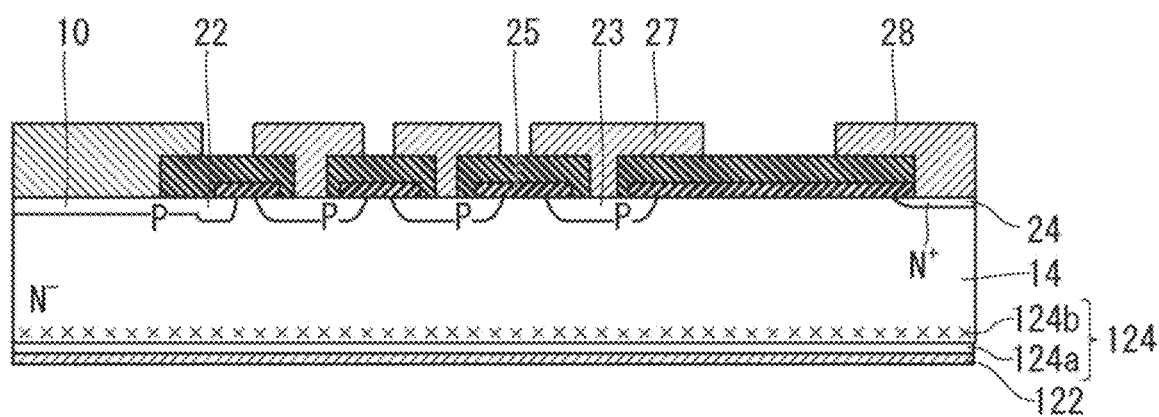

Next, as shown in FIG. 76, contact holes are formed in the insulating film 25 and the interlayer insulating film 26 to reach corresponding ones of the P anode layer 10, the guard ring 22, the field limiting ring 23, and the channel stopper layer 24. Then, an aluminum film containing Si added by a percentage from about 1 to about 3% is formed by sputtering on the upper surface of the semiconductor substrate and patterned to form the anode electrode 5, the FLR electrode 27, and the channel stopper electrode 28.

Figure 77:
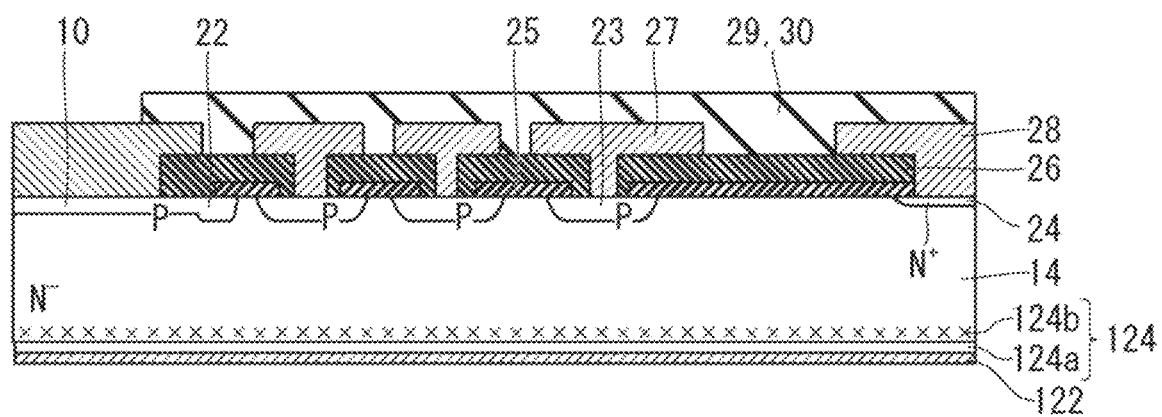

Next, as shown in FIG. 77, the passivation films 29 and 30 as protective films are formed on the upper surface of the semiconductor substrate.

Figure 78:
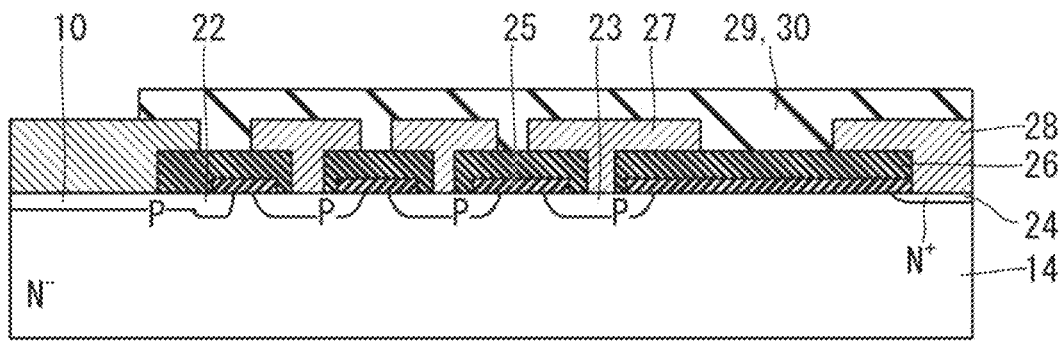

Then, as shown in FIG. 78, the gettering layer 124 and the polysilicon layer 122 on the lower surface of the semiconductor substrate are removed by polishing or etching. As a result of this removing step, the thickness of the semiconductor substrate (N⁻ drift layer 14) becomes responsive to a breakdown voltage class of the semiconductor device.

Figure 79:
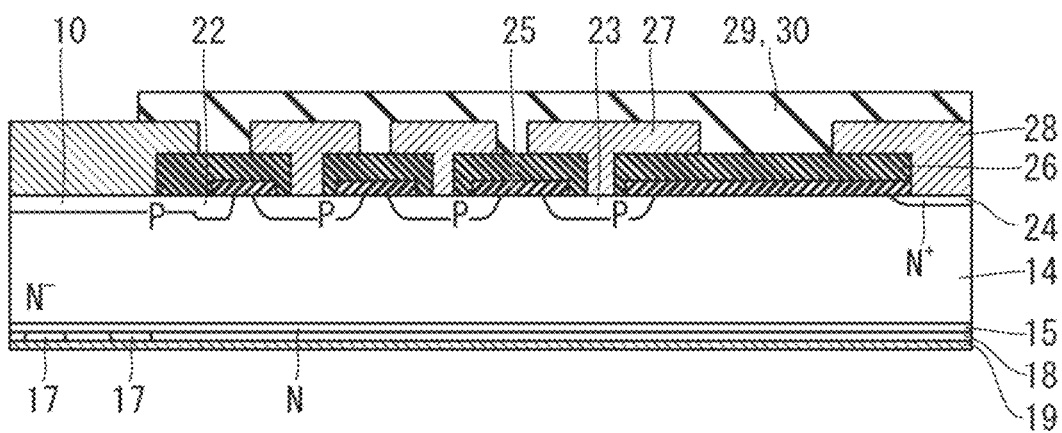

Then, as shown in FIG. 79, the N buffer layer 15 is formed on the lower surface of the N⁻ drift layer 14. The P cathode layer 18 is thereafter formed on the lower surface of the N buffer layer 15. Next, the N⁺ cathode layer 17 is formed in a part of the P cathode layer 18 in the active cell region R1. The N buffer layer 15, the N⁺ cathode layer 17, and the P cathode layer 18 are diffusion layers formed by ion implantation and annealing. Finally, the cathode electrode 19 is formed on the lower surface of the semiconductor substrate.

A substrate concentration ($C_{n-}$) of an Si wafer used in an IGBT or a diode is determined in response to a breakdown voltage class of a semiconductor element to be manufactured. For example, $C_{n-}$ is in a range from $1.0 \times 10^{12}$ to $5.0 \times 10^{14}$ cm⁻³. The Si wafer is prepared by the FZ method. During the wafer process shown in FIG. 69 or 78, the thickness of the device is adjusted precisely in response to the breakdown voltage class, and the vertical structure 35 is formed in the wafer process shown in FIG. 70 or 79. Such wafer process of using the FZ wafer and forming the vertical structure region during the wafer process is becoming a dominant process on the basis of the following backgrounds.

a) A wafer with the N⁻ drift layer 14 formed by the epitaxial method has a disadvantage that wafer cost becomes considerably high as it depends on the thickness of Si formed by the epitaxial method. By contrast, by setting only a concentration in the N⁻ drift layer 14 at a value appropriate for each breakdown voltage class by the FZ method and by using an Si wafer with the N⁻ drift layer 14 of a constant thickness independently of a breakdown voltage class at the start of wafer process, it becomes possible to employ a wafer of low unit price.

b) By controlling a device thickness to a value necessary for a breakdown voltage class at the final stage of the wafer process shown in FIG. 69 or 78 and forming the vertical structure for the purpose of making use of the wafer manufactured by the FZ method described above, it becomes possible to employ water process minimizing modification to a processing device. By doing so, even in the wafer process on a large dimension Si wafer of a diameter of equal to or greater than 200 mm, it still becomes possible to handle various wafer thicknesses ranging from 40 to 700 μm.

c) In consideration of the background b), in both the IGBT and the diode, device structures including an MOS transistor structure formed on a wafer surface, various types of diffusion layers, and wiring structures can be prepared using the most recent processing device as it is.

An impurity concentration in the N drift layer and a device thickness are device parameters to exert influence not only on the breakdown voltage characteristics of the IGBT and the diode but also on total loss, controllability during dynamic operation, and destruction tolerance, and high precision is required for these parameters.

FIG. 80 shows comparison between two types of process flow for forming the second buffer layer 15-2 of the new structure N buffer layer 15. Process A corresponds to the process flow of the fourth preferred embodiment. The result of prototypes described in the first to third preferred embodiments corresponds to result of making a prototype of the second buffer layer 15-2 according to Process A.

The detail of the wafer process described above is also mentioned in Japanese Patent No. 3396553, Japanese Patent No. 5622814, Japanese Patent No. 6065067, and Japanese Patent No. 6558462.

As mentioned in Japanese Patent No. 6065067 and Japanese Patent No. 6558462, in forming the new structure N buffer layer 15 composed of the first buffer layer 15-1 and the second buffer layer 15-2 in the IGBT and the diode, a step of recovering carrier lifetime in the N⁻ drift layer 14 (the step of FIGS. 64 and 65 or the step of FIGS. 73 and 74) is also performed during wafer process to form the gettering layer 113 or 124 composed of the high-concentration (a surface impurity from $1.0 \times 10^{20}$ to $1.0 \times 10^{22}$ cm⁻³ and a depth from 1.0 to 10 μm, for example) N⁺ layer 113a or 124a and the high crystal defect density layer 113b or 124b on the wafer back side in such a manner as to fulfill a value equal to or greater than carrier lifetime calculated by a formula (2) shown below. In the present preferred embodiment, the gettering layer 113 or 124 is eliminated by a polishing step and a subsequent wet etching step (step shown in FIG. 69 or step shown in FIG. 70) before formation of the N buffer layer 15, the P collector layer 16, the N⁺ cathode layer 17, the P cathode layer 18, etc.

$$\tau_r = 1.5 \times 10^{-5} \exp(5.4 \times 10^3 t_{N-}) \qquad \text{Formula (2)}$$

In the formula (2), $t_{N-}$ is the thickness (m) of the N⁻ drift layer 14 and is a device parameter corresponding to $t_{N-}$ shown in FIGS. 2, 40, and 45. Furthermore, $\tau_r$ is carrier lifetime (sec) in the N⁻ drift layer 14 at which influence of the carrier lifetime on the on voltage of each of an IGBT and a diode is eliminated.

The formula (2) is derived from the following viewpoint. Specifically, the on voltage of each of an IGBT and an FWD starts to be substantially independent of carrier lifetime in the N⁻ drift layer 14 from a certain value of the voltage. As long as a relationship between the on voltage and the carrier lifetime is controlled, influence by the carrier lifetime on switching loss becomes controllable. In addition, off-loss is also influenced by the carrier lifetime. Thus, setting the carrier lifetime in such a manner as to eliminate the influence on the on voltage by the carrier lifetime acts effectively in reducing off-loss or suppressing thermal runway.

On the basis of the idea described above, a plot of FIG. 81 is prepared that shows a relationship between a carrier lifetime value on the vertical axis in an assumed breakdown voltage class (a class from 600 to 6500 V) at which the on voltage becomes independent of carrier lifetime in the N⁻ drift layer 14 and the thickness of the N⁻ drift layer ($t_{N-}$). FIG. 81 is a graph showing a relationship between carrier lifetime and the thickness of the N⁻ drift layer ($t_{N-}$) obtained by simulation and showing result of examination on the device structures shown in FIGS. 2, 40, and 45. A relationship shown by a line in FIG. 81 corresponds to the relationship defined by the formula (2).

Specifically, controlling lifetime during wafer process to "device characteristic stabilized region" in FIG. 81 (a lifetime region of equal to or greater than $\tau_t$ obtained from the formula (2)) is considered to allow suppression of bad influence caused by carrier lifetime in the N⁻ drift layer 14 on final device characteristics and minimization of fluctuation in the primary performance of device structures or fluctuation in electrical characteristics between a plurality of chips existing in a wafer. As understood from the foregoing, the manufacturing technique of the present preferred embodiment is to manufacture the device structures described in the first to third preferred embodiments in such a manner as to satisfy a relationship in lifetime between the elements forming the device structures while controlling a carrier lifetime value in the N⁻ drift layer to a range from $\tau_t$ obtained from the formula (2) (namely, "device characteristic stabilized region" in FIG. 81).

To fulfill the formula (2) and "device characteristic stabilized region" in FIG. 81, the gettering layer (113 or 124) used in the manufacturing method of the present preferred embodiment is formed by the following procedure. First, for the purpose of exposing an Si surface on the back side of the semiconductor substrate (wafer), only the back side of the wafer is etched selectively (FIG. 63, FIG. 72). Technique employed for this etching uses a liquid of fluoric acid or mixed acid (mixed liquid of fluoric acid, nitric acid, and acetic acid, for example).

Next, as a source for forming a high-concentration N⁺ layer (113a or 124a) and a high crystal defect density layer (113b or 124b), a polysilicon layer (111 or 122) doped with atoms for forming an N⁺ layer (hereinafter called a "d-polysilicon layer") is formed by the LPCVD method (FIG. 64, FIG. 73). The atoms for forming the N⁺ layer are selected from phosphorus, arsenic, and antimony atoms, for example, available for forming the N⁺ layer by being diffused in Si. The d-polysilicon layer (111 or 122) is a film doped with high-concentration impurity of equal to or greater than $1.0 \times 10^{19}$ cm⁻³ and having a thickness of equal to or greater than 500 nm. Doping with the high-concentration impurity is done from the necessity to use the action of diffusing the high-concentration impurity into the Si surface on the wafer back side in subsequent annealing, introducing high dislocation density and lattice defect into the N⁺ layer (113a or 124a) including the high crystal defect density layer (113b or 124b) during formation of the N⁺ layer, and trapping heavy metal or polluted atoms. At this time, the d-polysilicon layer (111 or 122) directly contacts the Si surface exposed on the wafer back side.

After deposition of the d-polysilicon, thermal annealing is performed at a temperature from 900 to 1000° C. and in a nitrogen atmosphere. The temperature is reduced at any temperature reducing speed from degrees from 900 to 1000° C. to degrees from 600 to 700° C. Then, by employing annealing technique at a temperature from 500 to 700° C., in a nitrogen atmosphere, and using heat of lower temperature than the previous annealing temperature, the impurity is diffused from the d-polysilicon into Si at the wafer back side on which the d-polysilicon and Si contact each other directly. By doing so, during formation of the N⁺ layer (113a or 124a), crystal defect (namely, high crystal defect density layer 113b or 124b) is formed secondarily. The resultant N⁺ layer (113a or 124a), high crystal defect density layer 113b or 124b), and d-polysilicon layer (111 or 122) directly contact the exposed Si surface. By doing so, materials of different thermal expansion coefficients generate distortion by annealing technique performed thereafter at an interfacial part (a surface portion of the N⁺ layer (113a or 124a)). Then, distortion layers existing in the N⁺ layer (113a or 124a), the high crystal defect density layer (113b or 124b), and the surface portion of the N⁺ layer (113a or 124a) become functional as getter sites (FIG. 65, FIG. 74). As a result, during implementation of the foregoing annealing technique using low-temperature heat, heavy metal or polluted atoms taken into the wafer during the wafer process are moved to the getter sites while moving through a crystal lattice.

By the action of this technique, t in the N⁻ drift layer having been reduced in the previous wafer process is recovered to realize the N⁻ drift layer with carrier lifetime such as that defined by the formula (2) sufficiently long for preventing influence on the electrical characteristics of IGBTs or FWDs of various breakdown voltage classes. Regarding time of the annealing at a temperature from 600 to 700° C., in a nitrogen atmosphere, and using low-temperature heat, appropriate time for the annealing is present as described later in terms of carrier lifetime in the N⁻ drift layer and the electrical characteristics of an IGBT or an FWD to be influenced by the carrier lifetime.

Except the method using the d-polysilicon layer (111 or 122), the high crystal defect density layer (113b or 124b) may be formed on the wafer back side by a method employing laser annealing technique (rapid heating/rapid cooling and local annealing technique using laser of a temperature from 500° C. and a wavelength of 1000 nm). This method also achieves comparable effect. In this case, the high crystal defect density layer (113b or 124b) is formed by setting power density of the laser annealing at equal to or greater than 4 J/cm² and employing laser annealing and then employing the foregoing annealing technique (thermal annealing at a temperature from 900 to 1000° C. and in a nitrogen atmosphere and annealing at a temperature from 500 to 700° C. and in a nitrogen atmosphere). Forming the high crystal defect density layer (113b or 124b) in this way achieves the effect of improving carrier lifetime and achieves stabilization.

The vertical structure (35) to be provided on the back side of the semiconductor substrate is formed after the aluminum wiring step or the passivation film forming step (FIG. 69, FIG. 78). In a case of an IGBT, a MOS transistor structure is formed on the upper surface of the semiconductor substrate (a surface in the absence of the vertical structure (35)) and an aluminum wiring or a passivation film is formed, for example. Thus, technique employed during formation of the diffusion layer (N buffer layer 15, P collector layer 16, N$^+$ cathode layer 17, and P cathode layer 18) for forming the vertical structure (35) is annealing technique using laser of a wavelength to provide a temperature gradient in a device depth direction and to prevent transfer of heat to the upper surface of the semiconductor substrate (laser annealing) or annealing technique at low temperature of equal to or less than the melting point of metal used as the aluminum wiring in order to keep the upper surface of the semiconductor substrate at a temperature lower than the metal melting point.

The first buffer layer (15-1) and the second buffer layer (15-2) forming the vertical structure (35) is provided after the step of determining the thickness of the device precisely ($t_{device}$: 40 to 700 μm) during the wafer process (FIG. 69, FIG. 78). While the gettering layer (113 or 124) is removed at this stage, a diffusion layer necessary for the N drift layer 14 is formed in order for carrier lifetime in the N$^-$ drift layer 14 to satisfy the formula (2).

The process of the fourth preferred embodiment (Process A in FIG. 80) puts importance on the order of forming the first buffer layer (15-1) and the second buffer layer (15-2) and setting of a peak position of accelerated energy during introduction of the second buffer layer (15-2). Specifically, the first buffer layer (15-1) is formed by ion implantation and annealing technique (first annealing step), and then the second buffer layer (15-2) is formed by ion implantation and annealing technique (second annealing step). The reason for this is that the annealing technique employed during formation of the first buffer layer (15-1) is annealing technique performed at a higher temperature than the annealing technique employed during formation of the second buffer layer (15-2), and that using the annealing technique for formation of the first buffer layer (15-1) in the latter step causes bad influence on an impurity profile determined after activation of the second buffer layer (15-2) or on the type of lattice defect in the second buffer layer (15-2) introduced for forming the second buffer layer (15-2), thereby causing bad influence on carriers (electrons or holes) in an on-state of the device.

Regarding the second buffer layer 15-2, by introducing ions into Si after the activation annealing on the first buffer layer (15-1) and by performing the second annealing step after formation of the P collector layer 16, the N$^+$ cathode layer 17, and the P cathode layer 18 by ion implantation and annealing technique or after metallization (formation of the cathode electrode 19 or the collector electrode 20), the intended second buffer layer (15-2) described above can be formed.

The first buffer layer 15-1 and the second buffer layer 15-2 are formed in such a manner as to satisfy the following relationship. A peak position of the second buffer layer 15-2 is set above a junction ($X_{j,nb1}$) between the first buffer layer 15-1 and the second buffer layer 15-2 (to be closer to a junction $X_{j, nb2}$). This prevents interference between the first buffer layer 15-1 and the second buffer layer 15-2 to allow formation of the second buffer layer 15-2 with high precision.

Regarding an ion type for forming the first buffer layer 15-1 and the second buffer layer 15-2, phosphorus is used for the first buffer layer 15-1, and selenium, sulfur, phosphorus, proton (H$^+$), or helium is used for the second buffer layer 15-2. If proton (H$^+$) or helium is used, technique of diffusion layer formation process is employed for forming an N layer by causing a donor generation phenomenon under an annealing condition described later. Except for ion implantation, irradiation technique employing a cyclotron is available for introducing proton (H$^+$) or helium into Si. Introducing proton (H$^+$) into Si causes the following:

(a) Composite defect (VOH, V$_2$H, VO, CiOS (G-centre) CiOi (C-centre) resulting from reaction of a diffused vacancy (V) generated during the introduction with impurity (hydrogen atoms (H), oxygen atoms (O), and carbon atoms (C)) or from substitution reaction between carbon atoms and lattice defect.

(b) Composite defect (V$_2$O, V$_2$O$_2$) resulting from diffusion of lattice defect generated during the introduction, self-aggregation, and reaction of the lattice defect with oxygen atoms caused by annealing.

(c) Lattice defect pair (Trap-B) resulting from diffusion of an aggregation (Trap A) of lattice defect generated during the introduction caused by annealing and re-aggregation of the lattice defect.

The foregoing composite defect resulting from reaction between the vacancy and the impurity contains hydrogen to function as an electron source (donor). A donor concentration is increased through a mechanism of increasing a donor concentration by increasing composite defect density caused by annealing, and encouraging a thermal donor generation phenomenon resulting from ion implantation/irradiation process. As a result, a layer with donors of a higher impurity concentration than in the N$^-$ drift layer 14 is formed and this layer functions as the second buffer layer 15-2 to contribute to device operation. This technique realizes improvement of device performance by taking advantage of the composite defect formed in the second buffer layer 15-2.

On the other hand, the composite defect formed in the second buffer layer 15-2 contains defect to become a lifetime killer to shorten carrier lifetime. Thus, importance is imposed on the dose of impurity during formation of the second buffer layer 15-2, a process flow for forming the second buffer layer 15-2 (formation of the second buffer layer 15-2 by ion implantation and annealing technique after formation of the first buffer layer 15-1 as described above (Process A in FIG. 80)), and an annealing condition for donor generation in the second buffer layer 15-2. The first buffer layer 15-1 and the second buffer layer 15-2 are activated by respective methods employing different annealing techniques.

FIG. 82 is a list showing device performances of 1200 V class new structure RFC diodes prototyped by following two types of process flows (Process A and Process B) shown in FIG. 80 for forming the second buffer layer 15-2. Employing the different process flows results in a difference in Trap B ratio in lattice defect in the second buffer layer 15-2. In particular, Process B by which an ion implantation step for forming the second buffer layer 15-2 is performed before an ion implantation step for forming the first buffer layer 15-1 results in a Trap B ratio equal to or greater than 55% to cause degradation of device performance of the RFC diode.

Figure 83:
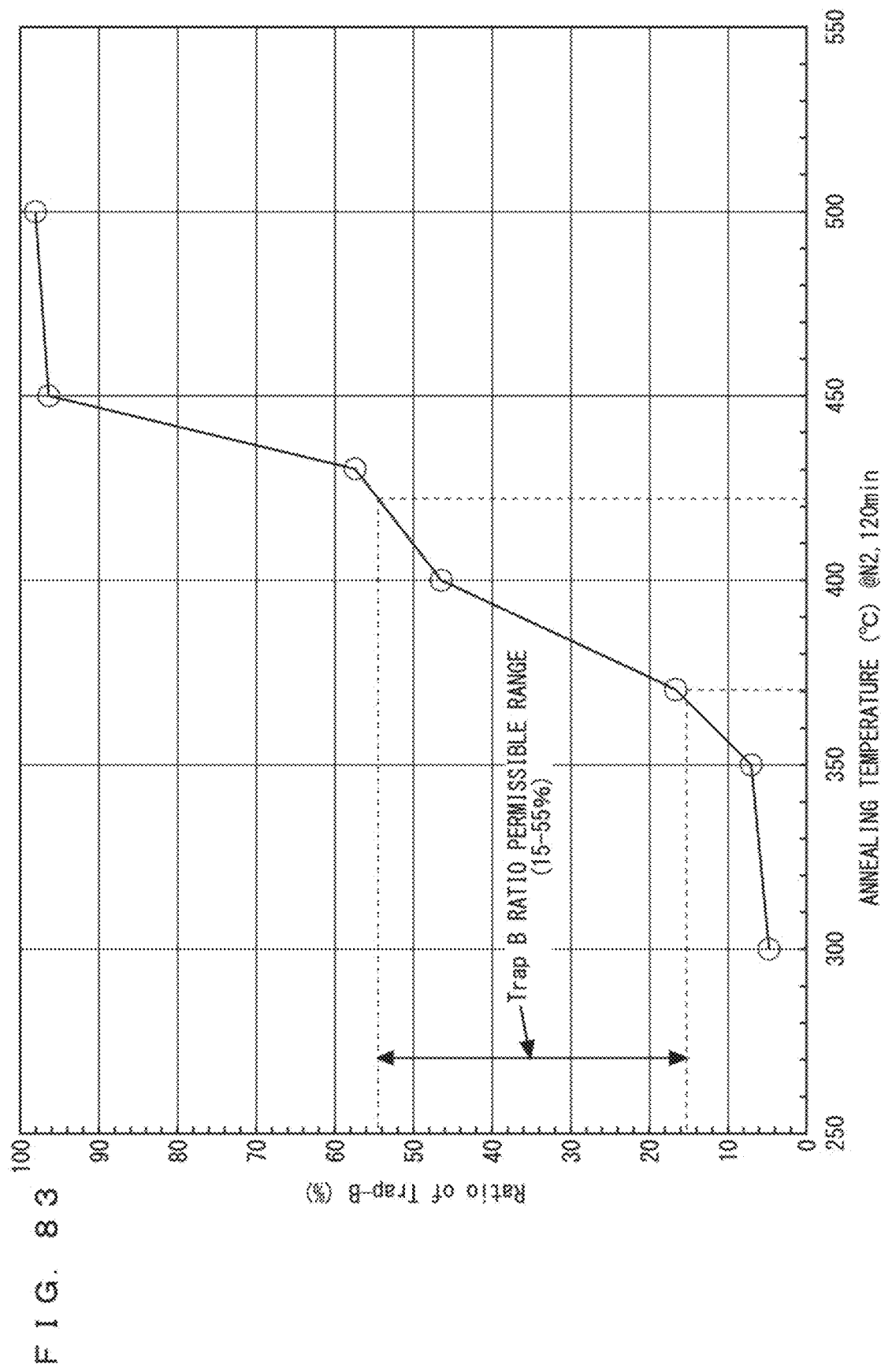
FIG. 83 shows a relationship between a Trap B ratio and an annealing temperature.

FIG. 83 shows result of examination on an annealing temperature in the second annealing step of forming the second buffer layer 15-2 necessary for controlling a Trap B ratio in lattice defect in the second buffer layer 15-2 to a target range from 15 to 55% according to Process A. Here, annealing time is 120 minutes. As understood from FIG. 83, even in the case of using Process A, setting an annealing temperature in forming the second buffer layer 15-2 is still important. An annealing temperature is controlled to a range from 370 to 425° C. for controlling a Trap B ratio to a range from 15 to 55%. By doing so, lifetime shown in the formula (2) is fulfilled.

Figure 84:
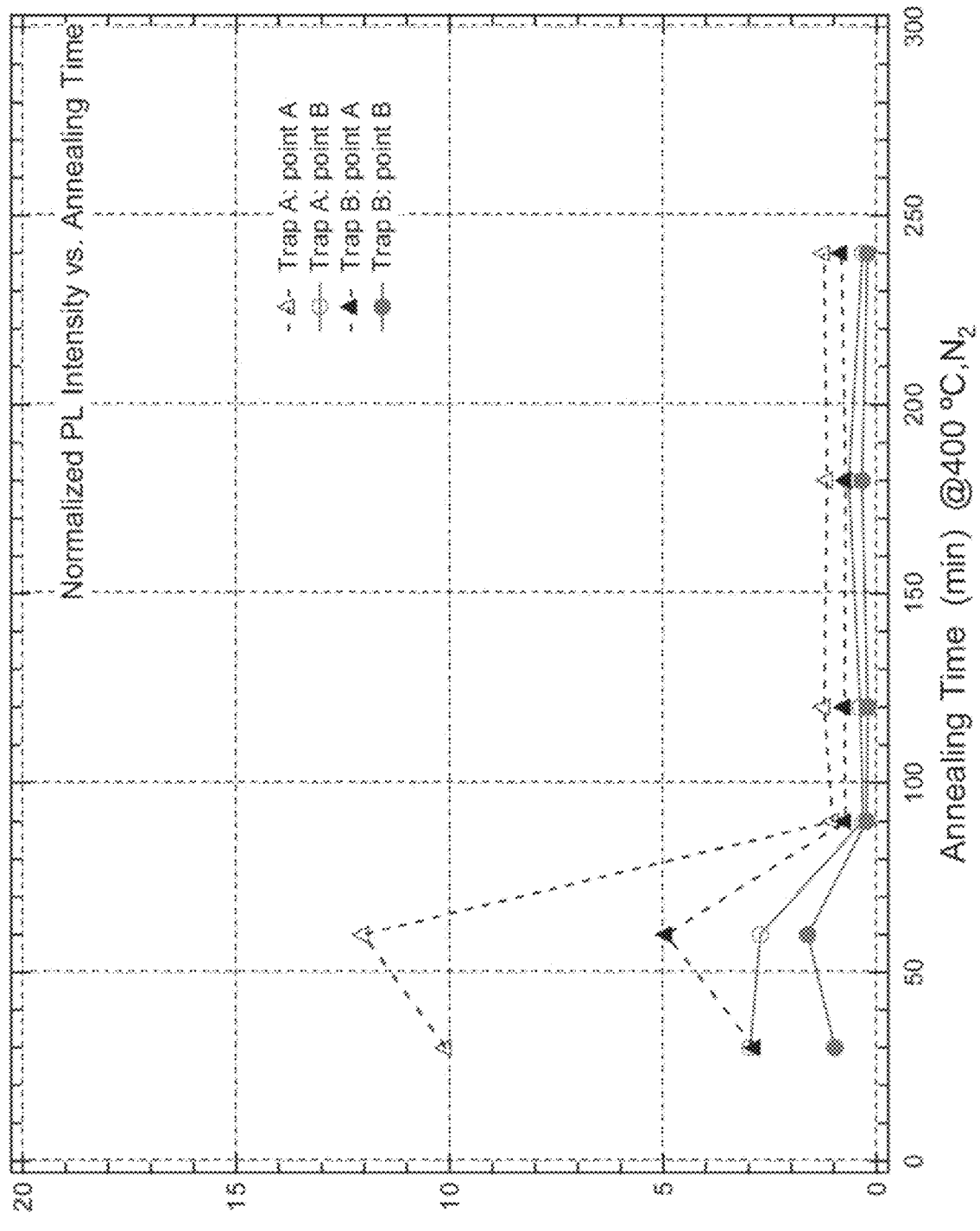
FIG. 84 shows a relationship of PL intensity of each of Trap A and Trap B with annealing time.

FIG. 84 shows a relationship of PL intensity of each of Trap A and Trap B with annealing time. On condition that a Trap B ratio in lattice defect in the second buffer layer 15-2 is controlled to a range from 15 to 55% according to Process A, the relationship shown in FIG. 84 is determined between PL intensity of each of Trap A and Trap B analyzed by the PL method and annealing time in an annealing step. FIG. 84 shows point A and point B that correspond to data obtained at point A and point B respectively shown in FIG. 8.

Here, an annealing temperature is 400° C. Even with a Trap B ratio controlled to a range from 15 to 55%, reducing defect intensity of each of Trap A and Trap B is still advantageous for satisfying lifetime shown in the formula (2) in terms of the device performances of an IGBT and an FWD. As understood from FIG. 84, the dependence of PL intensity expressing defect density in each of Trap A and Trap B on annealing time starts to be less sensitive at annealing time of equal to or greater than 90 minutes. Namely, annealing time equal to or greater than 90 minutes is required for reducing defect density in each of Trap A and Trap B while a Trap B ratio in lattice defect in the second buffer layer 15-2 forming the N buffer layer 15 is controlled to a range from 15 to 55% according to Process A.

The preferred embodiments can be combined freely, and each preferred embodiment can be modified or omitted, where appropriate.

While the disclosure has been shown and described in detail, the foregoing description is in all aspects illustrative and not restrictive. It is therefore understood that numerous modifications and variations can be devised.

What is claimed is:

1. A method of manufacturing a semiconductor device comprising the steps of:
   (a) forming a predetermined device structure in a semiconductor substrate with a first main surface and a second main surface and in which a drift layer is formed;
   (b) recovering carrier lifetime in the drift layer after the step (a) in such a manner that the carrier lifetime becomes equal to or greater than $\tau_t$ expressed as $1.5 \times 10^{-5} \exp(5.4 \times 10^3 t_{N^-})$ while $t_{N^-}$ means the thickness of the drift layer;
   (c) forming an electrode and a protective film for protecting the electrode on the first main surface of the semiconductor substrate after the step (b); and
   (d) forming a buffer layer on the drift layer to be closer to the second main surface after the step (c), the buffer layer including a first buffer layer and a second buffer layer provided between the first buffer layer and the drift layer,
   the step (b) comprising the steps of:
   (b-1) exposing the second main surface of the semiconductor substrate by etching;
   (b-2) forming polysilicon doped with impurity of a first conductivity type on the second main surface of the semiconductor substrate; and
   (b-3) forming a high-concentration layer of the first conductivity type and a high crystal defect density layer on the second main surface of the semiconductor substrate after the step (b-2) by performing first annealing in a nitrogen atmosphere at a first temperature and performing second annealing in a nitrogen atmosphere at a second temperature while the first temperature is reduced to the second temperature lower than the first temperature,
   the step (d) comprising the steps of:
   (d-1) removing the high-concentration layer and the high crystal defect density layer from the second main surface of the semiconductor substrate and controlling the thickness of the semiconductor substrate by polishing or etching;
   (d-2) introducing impurity for the first buffer layer into the semiconductor substrate from the second main surface after the step (d-1);
   (d-3) annealing the semiconductor substrate to form the first buffer layer after the step (d-2);
   (d-4) introducing impurity for the second buffer layer into the semiconductor substrate from the second main surface after the step (d-3); and
   (d-5) annealing the semiconductor substrate to form the second buffer layer after the step (d-4).

2. The method of manufacturing the semiconductor device according to claim 1, wherein
   a temperature of the annealing in the step (d-5) is from 370 to 425° C.

3. The method of manufacturing the semiconductor device according to claim 1, wherein
   time of the annealing in the step (d-5) is equal to or greater than 90 minutes.

* * * * *